United States Patent

Shiramatsu et al.

Patent Number: 6,084,470
Date of Patent: Jul. 4, 2000

[54] FILTER CIRCUIT CAPABLE OF SETTING VARIOUS FILTER CHARACTERISTICS

[75] Inventors: Toshio Shiramatsu; Norio Nakamura, both of Yokohama; Nobuyasu Goto, Tokyo, all of Japan

[73] Assignee: Kabushiki Kaisha Toshiba, Kawasaki, Japan

[21] Appl. No.: 09/200,737

[22] Filed: Nov. 30, 1998

[30] Foreign Application Priority Data

Nov. 28, 1997 [JP] Japan ........................... 9-344265
Sep. 1, 1998 [JP] Japan ........................... 10-247296

[51] Int. Cl.[7] ........................... H03F 3/45; H03F 3/04
[52] U.S. Cl. ........................... 330/252; 330/303
[58] Field of Search ........................... 330/252, 303, 330/306

[56] References Cited

U.S. PATENT DOCUMENTS 5,225,790  7/1993  Noguchi et al. .
5,532,644  7/1996  Nakagawara ........................... 330/254
5,912,587  6/1999  Mihailovits et al. ........................... 330/252

*Primary Examiner*—Robert Pascal
*Assistant Examiner*—Patricia T. Nguyen
*Attorney, Agent, or Firm*—Oblon, Spivak, McClelland, Maier & Neustadt, P.C.

[57] ABSTRACT

In this filter circuit, the emitter of a transistor Q1 is connected to the collector of a transistor Q2, and the base of the transistor Q2 is connected to the emitter of a transistor Q3 and the collector of a transistor Q4. The base of the transistor Q4 is connected to the collector of the transistor Q2. A capacitor C1 is connected between the emitters of the transistors Q2 and Q4, and a capacitor C2 is connected between the collectors of the transistors Q2 and Q4. With this arrangement, the filter circuit consumes a small power, is hardly influenced by the parasitic capacitance, can operate at high frequencies, and has a wide dynamic range.

20 Claims, 34 Drawing Sheets

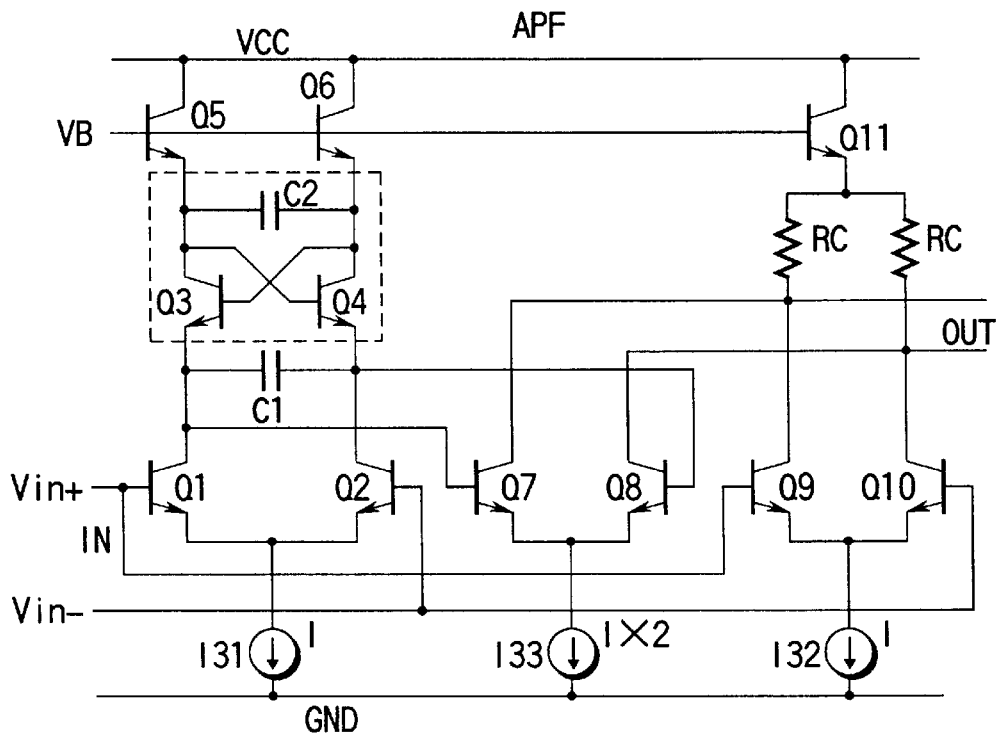
FIG. 13
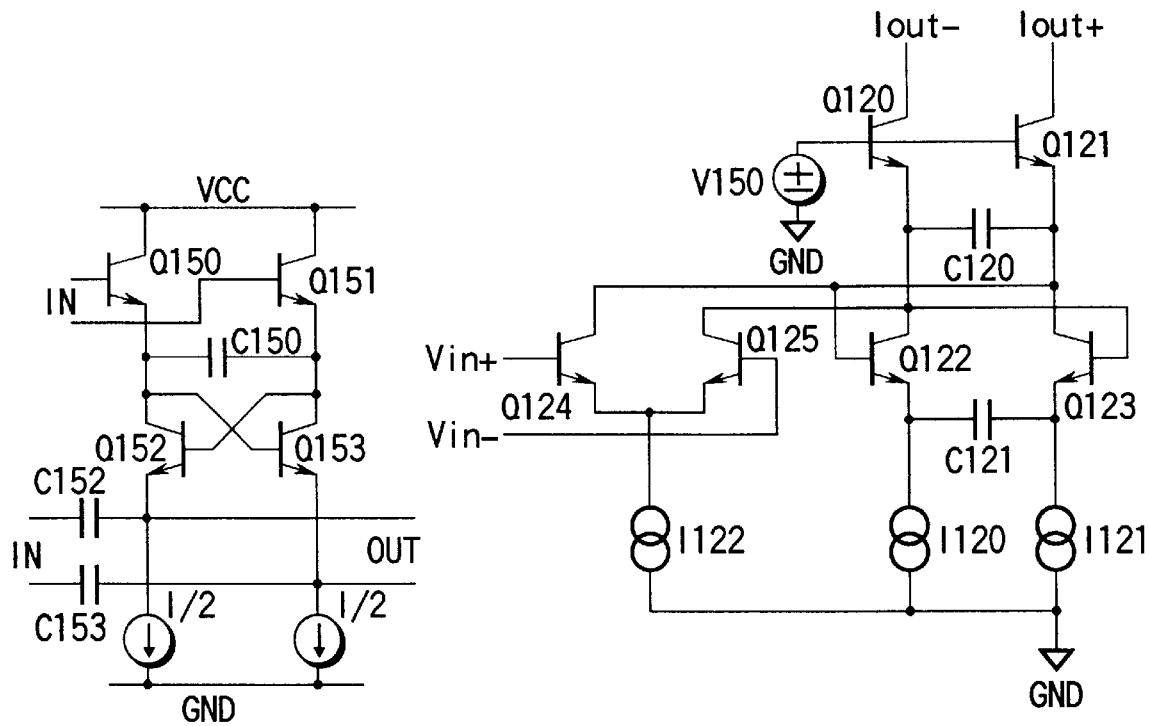
FIG. 14
FIG. 15

CIRCUIT DIAGRAM

BLOCK DIAGRAM

TRANSFER FUNCTION re1 = SUM OF EMITTER RESISTANCES OF Q3 AND Q4
re2 = SUM OF EMITTER RESISTANCES OF Q5 AND Q6

$$G = \frac{\frac{c1 \cdot re1}{c2 \cdot re2} \cdot \frac{1}{c1 \cdot re1} s + \frac{1}{c1 \cdot c2 \cdot re1 \cdot re2}}{s^2 + \frac{c1 \cdot re1 + c2 \cdot re2 - c1 \cdot re2}{c1 \cdot c2 \cdot re1 \cdot re2} s + \frac{1}{c1 \cdot c2 \cdot re1 \cdot re2}}$$

TRANSFER FUNCTION (re1=re2=re)

$$G = \frac{K \cdot \frac{w_n}{Q} s + w_n^2}{s^2 + \frac{w_n}{Q} s + w_n^2}$$

ANGULAR FREQUENCY $\omega n$, SELECTIVITY Q, GAIN K $$w_n = \sqrt{\frac{1}{c1 \cdot c2 \cdot re^2}} \qquad Q = \sqrt{\frac{c1}{c2}} \qquad K = \frac{c1}{c2}$$

FIG. 22

| CIRCUIT DIAGRAM | BLOCK DIAGRAM |
|---|---|

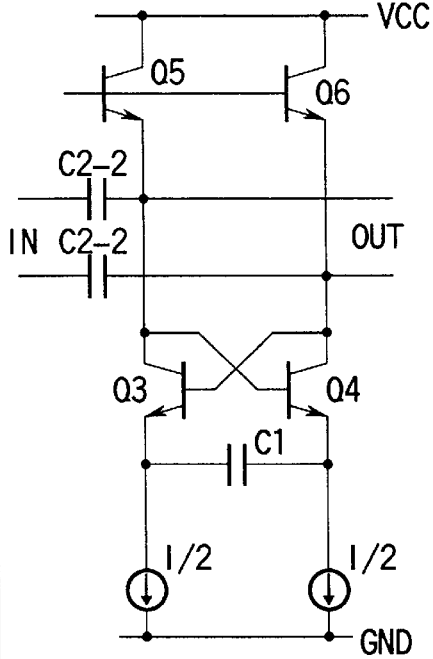

TRANSFER FUNCTION re1=SUM OF EMITTER RESISTANCES OF Q3 AND Q4
re2=SUM OF EMITTER RESISTANCES OF Q5 AND Q6

$$G = \frac{s^2 + \dfrac{1}{c1 \cdot re1} s}{s^2 + \dfrac{c1 \cdot re1 + c2 \cdot re2 + c1 \cdot re2}{c1 \cdot c2 \cdot re1 \cdot re2} s + \dfrac{1}{c1 \cdot c2 \cdot re1 \cdot re2}}$$

TRANSFER FUNCTION (re1=re2=re)

$$G = \frac{s^2 + \dfrac{w_n}{Q} s}{s^2 + \dfrac{w_n}{Q} s + w_n^2}$$

ANGULAR FREQUENCY $\omega n$, SELECTIVITY Q $$w_n = \sqrt{\frac{1}{c1 \cdot c2 \cdot re^2}} \qquad Q = \sqrt{\frac{c1}{c2}}$$

FIG. 24

FILTER CIRCUIT CAPABLE OF SETTING VARIOUS FILTER CHARACTERISTICS

BACKGROUND OF THE INVENTION

The present invention relates to a filter circuit and, more particularly, to a higher-order filter circuit such as a second-order filter circuit used for small signal processing.

Second-order filter circuits used for small signal processing include various circuit systems such as "TUNABLE WIDEBAND ACTIVE FILTER" disclosed in U.S. Pat. No. 5,225,790.

FIG. 40 shows an active filter disclosed in FIG. 2A of U.S. Pat. No. 5,225,790. This active filter comprises a plurality of transistors, two capacitors, and a plurality of resistor elements. This circuit has three transfer functions under predetermined conditions. The first transfer function represents a BPF (Band-Pass Filter) characteristic, the second transfer function represents a through-pass filter characteristic, and the third transfer function represents an LPF (Low-Pass Filter) characteristic having a zero point. In this active filter, selectivity Q for these characteristics and a cutoff frequency fc can be independently set.

However, as shown in FIG. 40, this active filter requires a resistor network having resistors 215, 230, and 232 serving as both input resistors and positive feedback resistors, and many circuit elements, resulting in high power consumption. This active filter can attain only the three filter characteristics. To realize another filter characteristic such as an HPF (High-Pass Filter) characteristic or an LPF characteristic not having any zero point, this active filter must be combined with another arithmetic circuit. This increases the number of circuit elements used and the power consumption. Further, in this active filter, Q cannot be externally controlled upon integration.

BRIEF SUMMARY OF THE INVENTION

It is the first object of the present invention to provide a filter circuit which uses a smaller number of elements, consumes a low power, is hardly influenced by the parasitic capacitance, can operate at high frequencies, has a small output offset and a wide input dynamic range, and can easily realize desired filter characteristics.

It is the second object of the present invention to provide a filter circuit in which the selectivity Q and cutoff frequency fc can be independently set, and Q can be externally controlled upon integration.

It is the third object of the present invention to provide a filter circuit in which Q can be arbitrarily set high.

The objects of the present invention can be achieved by the following apparatus.

According to the present invention, there is provided a filter circuit comprising: a first transistor having a first electrode, second electrode, and control electrode; a second transistor having a first electrode, second electrode, and control electrode, the first electrode of the second transistor being connected to the second electrode of the first transistor; a third transistor having a first electrode, second electrode, and control electrode, the second electrode of the third transistor being connected to the control electrode of the second electrode; a fourth transistor having a first electrode, second electrode, and control electrode, the first electrode of the fourth transistor being connected to the second electrode of the third transistor, and the control electrode of the fourth transistor being connected to the first electrode of the second transistor; a first capacitor substantially connected between the second electrodes of the second and fourth transistors; and a second capacitor substantially connected between the first electrodes of the second and fourth transistors.

According to the present invention, there is further a filter circuit comprising: a first transistor having a first electrode, second electrode, and control electrode, a second transistor having a first electrode, second electrode, and control electrode, the first electrode of the second transistor being connected to the second electrode of the first transistor; a third transistor having a first electrode, second electrode, and control electrode, the second electrode of the third transistor being connected to the control electrode of the second transistor; a fourth transistor having a first electrode, second electrode, and control electrode, the first electrode of the fourth transistor being connected to the second electrode of the third transistor, and the second electrode of the fourth transistor being connected to the first electrode of the second transistor; a first capacitor connected between the second electrodes of the second and fourth transistors; a second capacitor connected between the first electrodes of the second and fourth transistors; a fifth transistor having a first electrode, second electrode, and control electrode, the first electrode of the fifth transistor being connected to the second electrode of the second transistor, and the control electrode of the fifth transistor being a first input voltage terminal; a sixth transistor having a first electrode, second electrode, and control electrode, the first electrode of the sixth transistor being connected to the second electrode of the fourth transistor, and the control electrode of the sixth transistor being a second input voltage terminal; a first constant current source connected to the second electrodes of the fifth and sixth transistors; a seventh transistor having a first electrode, second electrode, and control electrode, the first and second electrodes of the seventh transistor being connected to the first and second electrodes of the second transistor; an eighth transistor having a first electrode, second electrode, and control electrode, the first and second electrodes of the eighth transistor being connected to the first and second electrodes of the fourth transistor; and a biasing circuit connected to the control electrodes of the seventh and eighth electrodes, wherein the first electrodes of the second and fourth transistors are voltage output terminals.

According to the present invention, arbitrary filter characteristics can be realized by one circuit arrangement using a combination of four transistors and a plurality of capacitors. For example, when an LPF is constituted or a filter circuit is constituted by a combination of LPF characteristics, the input dynamic range can be widened. When an HPF is constituted or a filter circuit is constituted by a combination of HPF characteristics, the input dynamic range can be widened. When a notch filter or boosting filter is constituted, the input dynamic range can be widened.

Since the number of elements can be greatly decreased, the circuit arrangement can be simplified, the power consumption can be reduced, and the output offset voltage can be decreased. Since no resistor or resistor formation process is required, the influence of the parasitic capacitance can be reduced, and filter characteristics can be realized at high frequencies.

According to the present invention, Q and the cutoff frequency fc can be independently set. In addition, Q of the integrated filter can be variably controlled in accordance with a control signal supplied externally.

A higher-order filter can be realized by cascade-connecting filters of the present invention on a plurality of stages.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 13 is a circuit diagram showing an all-pass filter according to the eighth embodiment of the present invention;

FIG. 14 is a circuit diagram showing a modification in which the boosting filter in FIG. 6C is changed to a voltage output type filter;

FIG. 15 is a circuit diagram showing the first modification of the HPF shown in FIG. 5B;

FIG. 22 is a view showing the equivalent circuit and transfer function of still another example of the basic circuit of the filter circuit according to the present invention;

FIG. 24 is a view showing the equivalent circuit and transfer function of still another example of the basic circuit of the filter circuit according to the present invention;

DETAILED DESCRIPTION OF THE INVENTION

Embodiments of a filter circuit according to the present invention will be described in detail below with reference to the several views of the accompanying drawing.

A filter circuit according to the first aspect will be described.

<First Embodiment>

Figure 1:
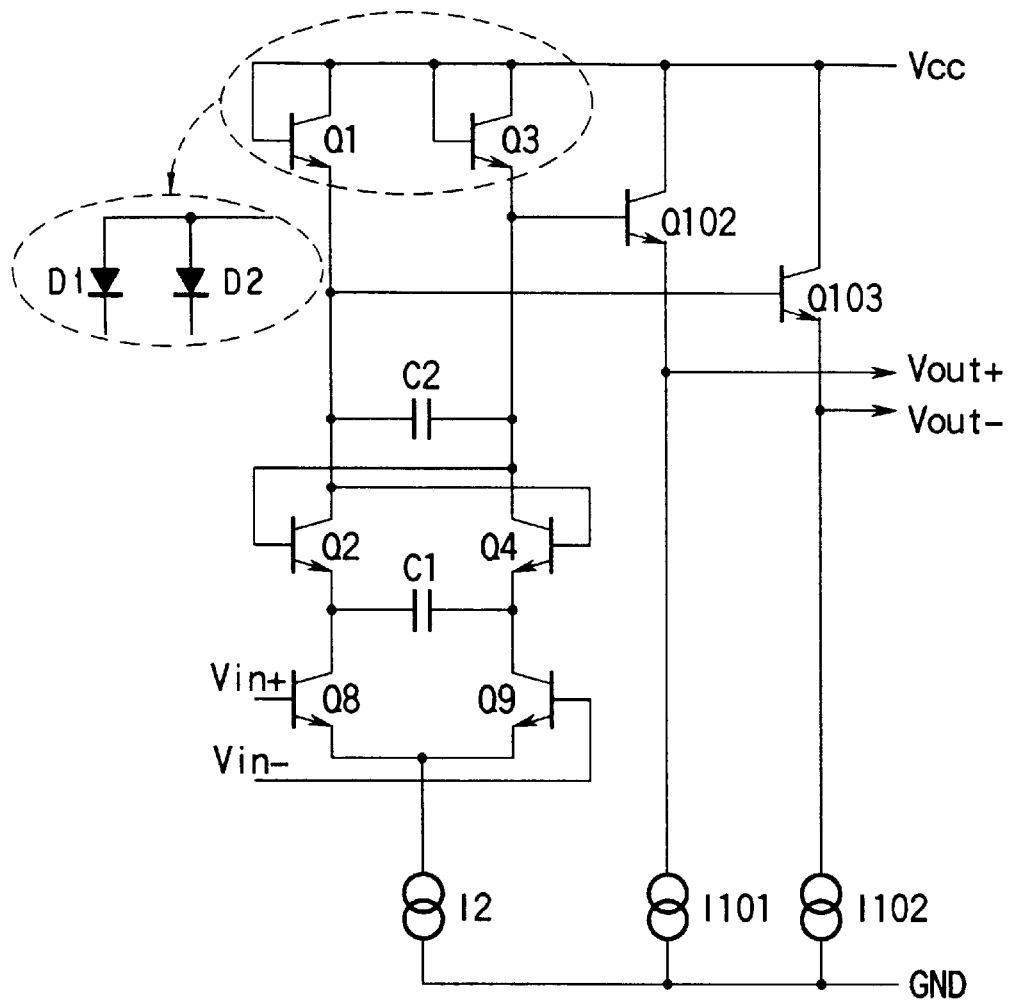
FIG. 1 is a circuit diagram showing an LPF according to the first embodiment of the present invention.

FIG. 1 shows a filter circuit constituted by bipolar transistors. The filter circuit shown in FIG. 1 basically comprises four npn transistors and two capacitors, and additionally comprises four npn transistors and three constant current sources. Referring to FIG. 1, reference symbols Q1 to Q4, Q8, and Q9 represent npn transistors; C1 and C2, capacitors; I101, I102, and I2, constant current sources; Vcc, a power supply voltage; GND, a ground voltage; Vin$^+$ and Vin$^-$, differential input signal voltages; and Vout$^+$ and Vout$^-$, differential output signal voltages.

The collector and base of the first transistor Q1 are connected to a Vcc node. The emitter of the first transistor is connected to the collector of the second transistor Q2 and the base of the fourth transistor. The collector and base of the third transistor Q3 are connected to the Vcc node, and the emitter is connected to the base of the second transistor Q2 and the collector of the fourth transistor Q4. The base of the fourth transistor Q4 is connected to the collector of the second transistor Q2. The bases and collectors of the second and fourth transistors are cross-connected to each other. The first capacitor C1 is connected between the emitters of the second and fourth transistors Q2 and Q4, and the second capacitor C2 is connected between the collectors of the second and fourth transistors Q2 and Q4.

In the first embodiment, the first capacitor C1 is directly connected between the emitters of the second and fourth transistors Q2 and Q4, but suffices to be substantially connected between the emitters of the second and fourth transistors Q2 and Q4. In the first embodiment, the second capacitor C2 is directly connected between the collectors of the second and fourth transistors Q2 and Q4, but suffices to be substantially connected between the collectors of the second and fourth transistors Q2 and Q4.

The emitters of the second and fourth transistors Q2 and Q4 are respectively connected to the collectors of the input transistors Q8 and Q9 forming a differential pair. The first constant current source I2 is connected between the common emitter connection node of the input transistors Q8 and Q9 and the ground node GND. The bases of the input transistors Q8 and Q9 respectively receive differential input signals Vin$^+$ and Vin$^-$.

The collector of the fourth transistor Q4 is connected to the base of an output transistor Q102. The collector of the output transistor Q102 is connected to the Vcc node, and the emitter is connected to the ground node GND via the second constant current source I101. The output transistor Q102 and second constant current source I101 constitute a first emitter follower circuit. The base of the output transistor Q102 serves as an input node of the first emitter follower circuit.

The collector of the second transistor Q2 is connected to the base of an output transistor Q103. The collector of the output transistor Q103 is connected to the Vcc node, and the emitter is connected to the ground node GND via the third constant current source I102. The output transistor Q103 and third constant current source I102 constitute a second emitter follower circuit. The base of the output transistor Q103 serves as an input node of the second emitter follower circuit.

The emitter of the output transistor Q102 serves as an output node of the first emitter follower circuit, and the emitter of the output transistor Q103 serves as an output node of the second emitter follower circuit. These output nodes respectively output differential output signals Vout$^+$ and Vout$^-$.

Figure 2:
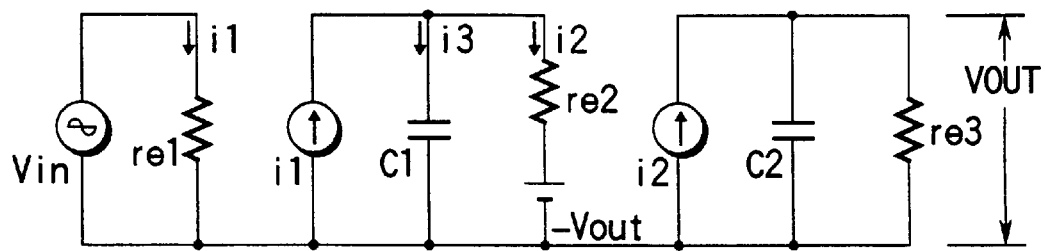
FIG. 2 is an equivalent circuit diagram showing the LPF in FIG. 1.

FIG. 2 shows an equivalent circuit of the filter circuit in FIG. 1.

Referring to FIG. 2, reference symbol Vin denotes an input signal voltage source; Vout, an output voltage; re$_1$, a sum of the emitter resistances of the transistors Q8 and Q9; re$_2$, a sum of the emitter resistances of the transistors Q2 and Q4; re$_3$, a sum of the emitter resistances of the transistors Q1 and Q3; C$_1$, a capacitance of the first capacitor C1 and a subsequent element; C$_2$, a capacitance of the second capacitor C2 and a subsequent element; i$_1$, a current (current source) flowing through the resistor re$_1$; i$_2$, a current (current source) flowing through the resistor re$_2$; and i$_3$, a current (current source) flowing through the capacitance C$_1$.

To explain operation of the filter circuit in FIG. 1, the transfer function of this filter circuit is calculated. From the equivalent circuit in FIG. 2, equations (1) to (3) are derived:

$$i_1 = \frac{V_{in}}{re_1} = i_2 + i_3, \therefore i_3 = \frac{V_{in}}{re_1} - i_2 \quad (1)$$

$$i_3 \times \frac{1}{S \cdot C_1} = i_2 \cdot re_2 - V_{out} \quad (2)$$

$$V_{out} = i_2 \cdot \left( \frac{1}{S \cdot C_2 + \frac{1}{re_3}} \right) \quad (3)$$

Equation (1) is substituted into equation (2):

$$\left( \frac{V_{in}}{re_1} - i_2 \right) \cdot \frac{1}{S \cdot C_1} = i_2 \cdot re_2 - V_{out} \quad (4)$$

Equation (4) is substituted into equation (3):

$$\left( \frac{V_{in}}{re_1} - i_2 \right) \cdot \frac{1}{S \cdot C_1} = i_2 \cdot re_2 - i_2 \cdot \left( \frac{1}{S \cdot C_2 + \frac{1}{re_3}} \right) \quad (5)$$

$$i_2 = \left( \frac{V_{in}}{re_1} \cdot \frac{1}{S \cdot C_1} \right) \bigg/ \left( re_2 - \frac{1}{S \cdot C_2 + \frac{1}{re_3}} + \frac{1}{S \cdot C_1} \right)$$

Equation (5) is also substituted into equation (3):

$$V_{out} = \left( \frac{\frac{V_{in}}{re_1} \cdot \frac{1}{C_1}}{re_2 - \frac{1}{S \cdot C_2 \cdot re_2 + \frac{1}{re_3}} + \frac{1}{S \cdot C_1}} \times \frac{1}{S \cdot C_2 + \frac{1}{re_3}} \right) \quad (6)$$

$$\frac{V_{out}}{V_{in}} = \frac{\frac{1}{S \cdot C \cdot re_1}}{S \cdot C_2 \cdot re_2 + \frac{re_2}{re_3} - 1 + \frac{S \cdot C_2 + \frac{1}{re_3}}{S \cdot C_1}}$$

Letting $re_2 = re_3$ in equation (6), $$\frac{V_{out}}{V_{in}} = \frac{\frac{1}{S \cdot C_1 \cdot re_1}}{S \cdot C_2 \cdot re_2 + \frac{S \cdot C_2 + \frac{1}{re_3}}{S \cdot C_1}} \quad (7)$$

Multiplying the numerator and denominator of equation (7) with $S \cdot C_1$ yields $$\frac{V_{out}}{V_{in}} = \frac{\frac{1}{re_1}}{S^2 \cdot C_1 \cdot C_2 \cdot re_2 + S \cdot C_2 + \frac{1}{re_3}} \quad (8)$$

$$= \frac{\frac{1}{C_1 \cdot C_2 \cdot re_2 \cdot re_1}}{S^2 + \frac{1}{C_1 \cdot re_2} S + \frac{1}{C_1 \cdot C_2 \cdot re_2 \cdot re_3}}$$

Giving attention to $re_2 = re_3$, i.e., $(re_3/re_2) = 1$, numerator $re_1$ of equation (8) is modified to $re_1 = (re_2/re_3) \cdot re_1$ to obtain $$\frac{V_{out}}{V_{in}} = \frac{\frac{re_2}{C_1 \cdot C_2 \cdot re_2 \cdot \frac{re_2}{re_3} re_1}}{S^2 + \frac{1}{C_1 \cdot re_2} S + \frac{1}{C_1 \cdot C_2 \cdot re_2 \cdot re_3}} \quad (9)$$

Letting $(re_2/re_1) = k$, $$\frac{V_{out}}{V_{in}} = k \cdot \frac{\frac{1}{re_2 \cdot re_3 \cdot C_1 \cdot C_2}}{S^2 + \frac{1}{re_2 \cdot C_1} S + \frac{1}{re_2 \cdot re_3 \cdot C_1 \cdot C_2}} \quad (10)$$

wherein $k = \frac{re_2}{re_1}$

In equation (10), S is a Laplacian operator. From transfer function (10), the circuit characteristics of the filter circuit in FIG. 1 include the second-order transfer function.

The general formula of the transfer function of the filter circuit:

$$\frac{V_{out}}{V_{in}} = \frac{\omega_0^2}{S^2 + \frac{\omega_0}{Q} S + \omega_0^2} \quad (11)$$

is solved to obtain the relationship between ωo, Q, $C_1$, and $C_2$ of the filter circuit in FIG. 1:

$$\omega_0^2 = \frac{1}{re_2 \cdot re_3 \cdot C_1 \cdot C_2} \quad (12)$$

$$\omega_0 = \frac{1}{\sqrt{re_2 \cdot re_3 \cdot C_1 \cdot C_2}}$$

$$\frac{1}{re_2 \cdot C_1} = \frac{\omega_0}{Q}$$

$$Q = \omega_0 \cdot re_2 \cdot C_1 = \frac{re_2 \cdot C_1}{\sqrt{re_2 \cdot re_3 \cdot C_1 \cdot C_2}}$$

$$= \frac{C_1}{\sqrt{C_1 \cdot C_2}} = \sqrt{\frac{C_1}{C_2}}$$

wherein $(re_2 = re_3)$

From equation (12), Q is determined by the ratio of the two capacitances $C_1$ and $C_2$.

Figure 3:
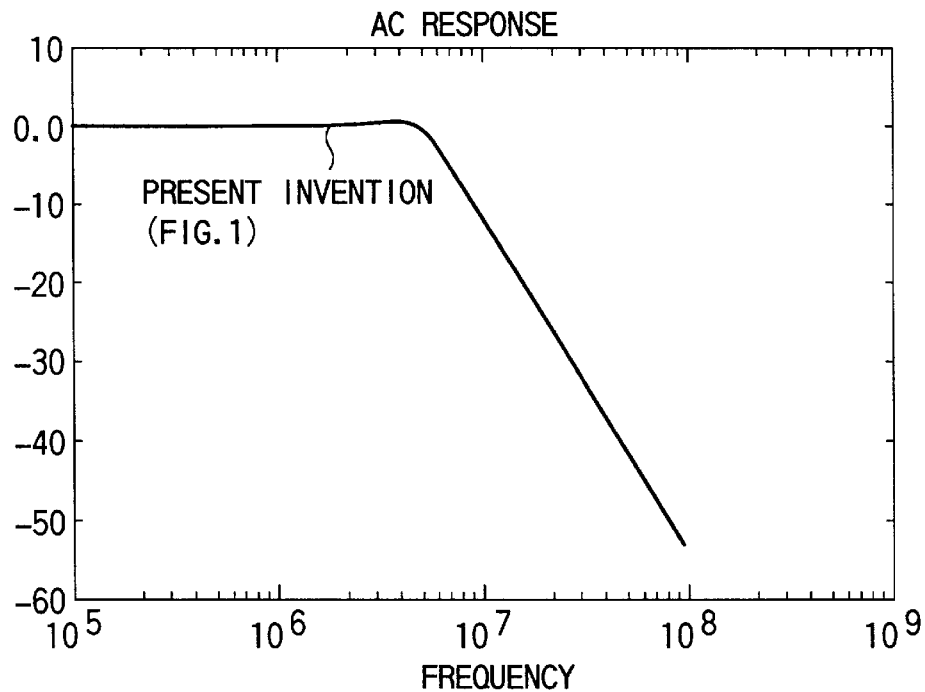
FIG. 3 is a graph showing an example of simulated frequency characteristics of the LPF in FIG. 1.

FIG. 3 shows the simulation results of the relationship (frequency characteristics by AC response) between the frequency and output level of the filter circuit in FIG. 1.

As described above, the filter circuit in FIG. 1 uses a small number of elements with low power consumption and a small output offset. This filter circuit can operate at high frequencies without any resistor, any resistor formation process, and any influence of the parasitic capacitance.

The filter circuit in FIG. 1 can be modified as follows to attain a wide input dynamic range. Therefore, a higher-order filter circuit and various filter characteristics can be realized.

Note that the filter circuit in FIG. 1 may use a first diode instead of the first transistor Q1 and a second diode instead of the third transistor Q3. In this case, as shown in FIG. 1 the cathode of the first diode D1 is connected to the collector of the transistor Q2, the cathode of the second diode D2 is connected to the collector of the transistor Q4 and the anodes of the diodes D1 and D2 are connected to the Vcc node.

Various embodiments and modifications of the filter circuit according to the first aspect will be described with reference to FIGS. 4 to 16.

<Second Embodiment>

Figure 4:
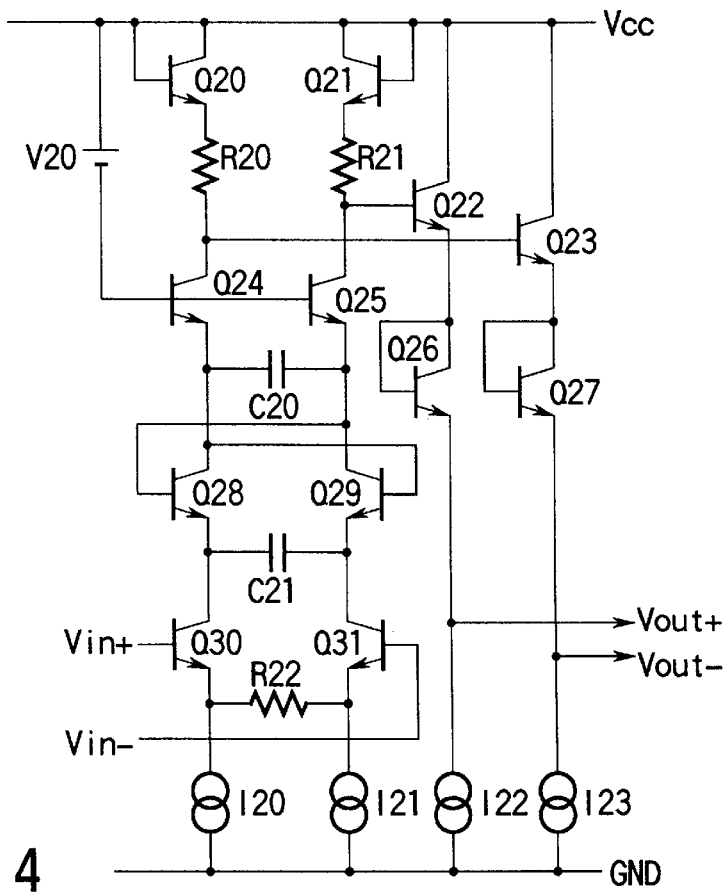
FIG. 4 is a circuit diagram showing a second-order LPF having a wide input/output dynamic range according to the second embodiment of the present invention.

FIG. 4 shows a second-order LPF having a wider input/output dynamic range. In the LPF shown in FIG. 4, transistors Q24, Q28, Q25, Q29, Q30, and Q31 correspond to the transistors Q1, Q2, Q3, Q4, Q8, and Q9 in FIG. 1, and capacitors C21 and C20 correspond to the capacitors C1 and C2 in FIG. 1.

A resistor R22 is connected between the emitters of the transistors Q30 and Q31. A constant current source I20 is connected between the emitter of the transistor Q30 and a ground node GND, and a constant current source I21 is connected between the emitter of the transistor Q31 and the ground node GND.

The collector of the transistor Q24 is connected to one terminal of a resistor R20, and the other terminal of the resistor R20 is connected to the emitter of an npn transistor Q20. The base and collector of the transistor Q20 are connected to a Vcc node. The collector of the transistor Q25 is connected to one terminal of a resistor R21, and the other terminal of the resistor R21 is connected to the emitter of an npn transistor Q21. The base and collector of the transistor Q21 are connected to the Vcc node.

The collector of the transistor Q24 is connected to the base of an npn transistor Q23, and the emitter of the transistor Q23 is connected to the collector and base of an npn transistor Q27. A constant current source I23 is connected between the emitter of the transistor Q27 and the ground node GND.

The collector of the transistor Q25 is connected to the base of an npn transistor Q22, and the emitter of the transistor Q22 is connected to the collector and base of an npn transistor Q26. A constant current source I22 is connected between the emitter of the transistor Q26 and the ground node GND.

The bases of the transistors Q24 and Q25 are connected to the negative terminal of a constant voltage source V20. The constant voltage source V20 is constituted by, e.g., a diode. The bases of the transistors Q30 and Q31 respectively receive differential input signal voltages Vin$^+$ and Vin$^-$. The emitters of the transistors Q26 and Q27 respectively output differential output signal voltages Vout$^+$ and Vout$^-$.

According to the filter circuit in FIG. 4, the same effects as those of the LPF in FIG. 1 can be obtained, and the input dynamic range can be improved (widened).

<Third Embodiment>

FIGS. 5A to 6C show filter circuits capable of realizing various filter characteristics by applying a current input or voltage input to a circuit formed by a combination of a plurality of transistors and a plurality of capacitors.

Figure 5A:
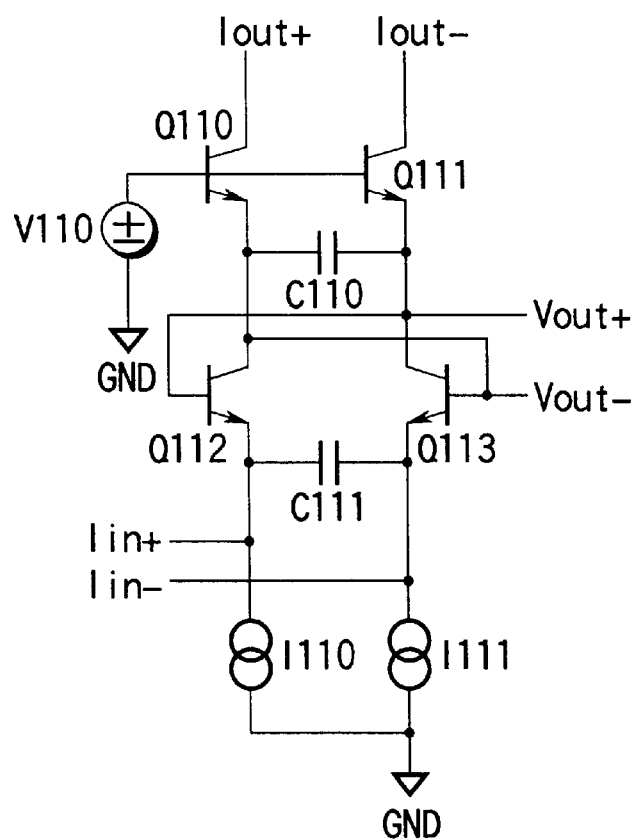
FIG. 5A is a circuit diagram showing an LPF according to the third embodiment of the present invention.
Figure 5B:
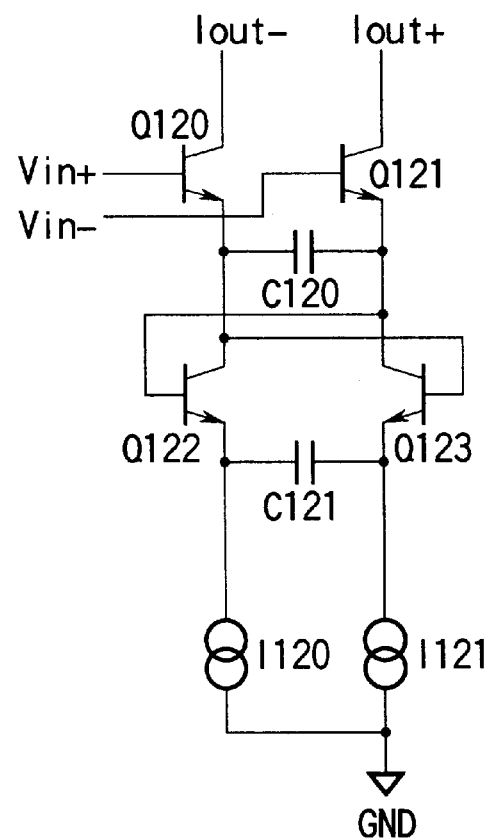
FIG. 5B is a circuit diagram showing an HPF according to the third embodiment of the present invention.
Figure 6C:
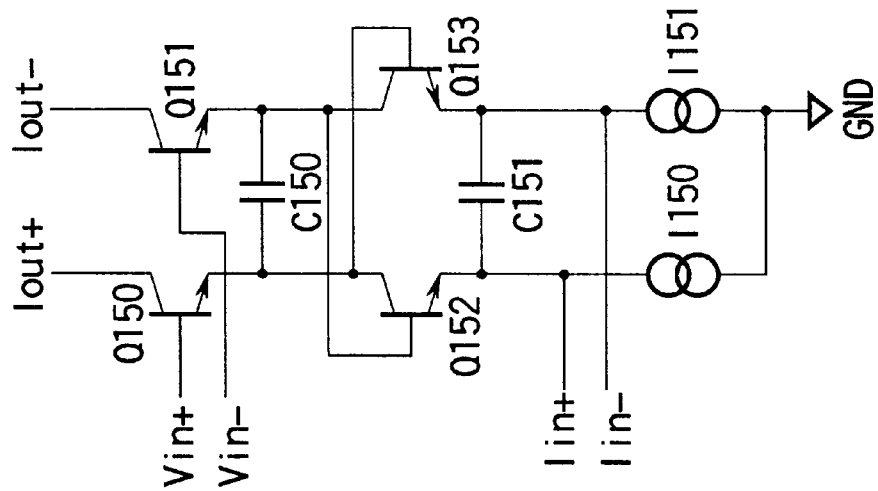
FIG. 6C is a circuit diagram showing a boosting filter.
Figure 6B:
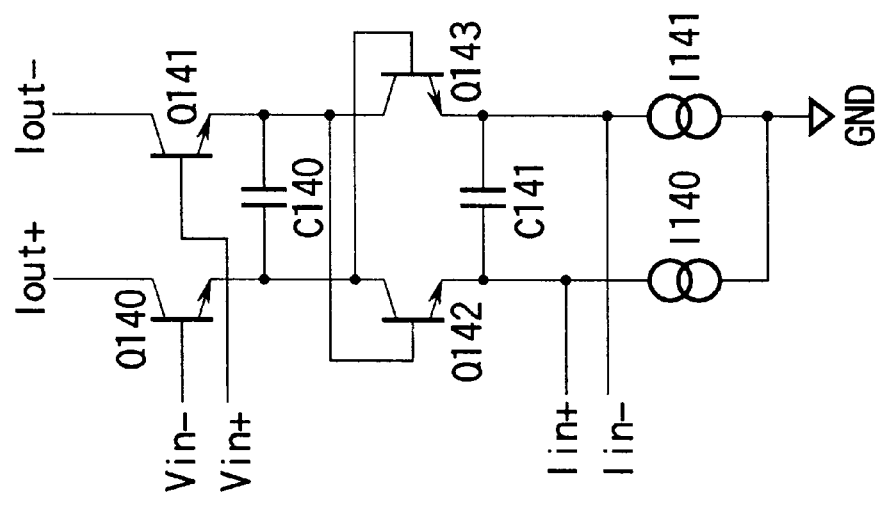
FIG. 6B is a circuit diagram showing a notch filter.
Figure 6A:
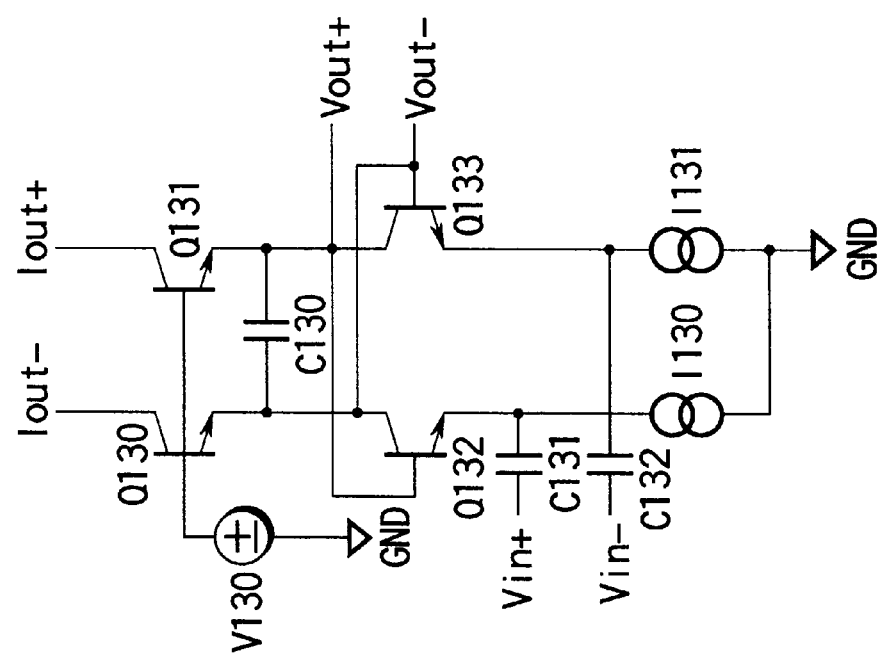
FIG. 6A is a circuit diagram showing a BPF according to the third embodiment of the present invention.

The circuit shown in FIG. 5A realizes an LPF, the circuit shown in FIG. 5B realizes an HPF (High-Pass Filter), the circuit shown in FIG. 6A realizes a BPF (Band-Pass Filter), the circuit shown in FIG. 6B realizes a notch filter, and the circuit shown in FIG. 6C realizes a boosting filter. Note that these circuits can be freely combined.

More specifically, in the LPF shown in FIG. 5A, transistors Q110, Q112, Q111, and Q113 correspond to the transistors Q1, Q2, Q3, and Q4 shown in FIG. 1, and capacitors C111 and C110 correspond to the capacitors C1 and C2 shown in FIG. 1.

Constant current sources I110 and 111 are respectively connected between the emitters of the transistors Q112 and Q113 and the ground node GND. The bases of the transistors Q110 and Q111 are connected to the positive terminal of a bias power supply (constituted by, e.g., a diode) V110. The emitters of the transistors Q112 and Q113 respectively receive differential input signal currents Iin$^+$ and Iin$^-$. The collectors of the transistors Q110 and Q111 serve as current output terminals for extracting differential output signal currents Iout$^+$ and Iout$^-$. The collectors of the transistors Q113 and Q112 respectively output the differential output signal voltages Vout$^+$ and Vout$^-$.

In the HPF shown in FIG. 5B, transistors Q120, Q122, Q121, and Q123 correspond to the transistors Q1, Q2, Q3, and Q4 shown in FIG. 1, and capacitors C121 and C120 correspond to the capacitors C1 and C2 shown in FIG. 1.

Constant current sources I120 and I121 are respectively connected between the emitters of the transistors Q122 and Q123 and the ground node GND. The bases of the transistors Q120 and Q121 respectively receive the differential input signal voltages Vin$^+$ and Vin$^-$. The collectors of the transistors Q120 and Q121 are current output terminals for extracting the differential output signal currents Iout$^+$ and Iout$^-$.

In the BPF shown in FIG. 6A, transistors Q130, Q132, Q131, and Q133 correspond to the transistors Q1, Q2, Q3, and Q4 shown in FIG. 1, and a capacitor C130 corresponds to the capacitor C2 shown in FIG. 1.

Constant current sources I130 and I131 are respectively connected between the emitters of the transistors Q132 and Q133 and the ground node. The emitters of the transistors Q132 and Q133 respectively receive the differential input signal voltages Vin$^+$ and Vin$^-$ via coupling capacitors C131 and C132. The bases of the transistors Q130 and Q131 are connected to the positive terminal of a bias power supply V130. The collectors of the transistors Q130 and Q131 serve as current output terminals for extracting the differential output signal currents Iout$^+$ and Iout$^-$. The collectors of the transistors Q133 and Q132 respectively output the differential output signal voltages Vout$^+$ and Vout$^-$.

In the notch filter shown in FIG. 6B, transistors Q140, Q142, Q141, and Q143 correspond to the transistors Q1, Q2, Q3, and Q4 shown in FIG. 1, and capacitors C141 and C140 correspond to the capacitors C1 and C2 shown in FIG. 1.

Constant current sources I140 and I141 are respectively connected between the emitters of the transistors Q142 and Q143 and the ground node. The emitters of the transistors Q142 and Q143 respectively receive the differential input signal currents Iin$^+$ and Iin$^-$. The bases of the transistors Q140 and Q141 respectively receive the differential input signal voltages Vin$^+$ and Vin$^-$. The collectors of the transistors Q140 and Q141 serve as current output terminals for extracting the differential output signal currents Iout$^+$ and Iout$^-$.

In the boosting filter shown in FIG. 6C, transistors Q150, Q152, Q151, and Q153 correspond to the transistors Q1, Q2, Q3, and Q4 shown in FIG. 1, and capacitors C151 and C150 correspond to the capacitors C1 and C2 shown in FIG. 1.

Constant current sources I150 and I151 are respectively connected between the emitters of the transistors Q152 and Q153 and the ground node. The emitters of the transistors Q152 and Q153 respectively receive the differential input signal currents Iin$^-$ and Iin$^+$. The bases of the transistors Q150 and Q151 respectively receive the differential input signal voltages Vin$^+$ and Vin$^-$. The collectors of the transistors Q150 and Q151 serve as current output terminals for extracting the differential output signal currents Iout$^+$ and Iout$^-$.

<Fourth Embodiment>

FIGS. 7A to 8B show filter circuits in which the input/output dynamic range of the filter circuit described with reference to FIGS. 5A to 6C is widened, and all inputs and outputs are voltages.

Figure 7C:
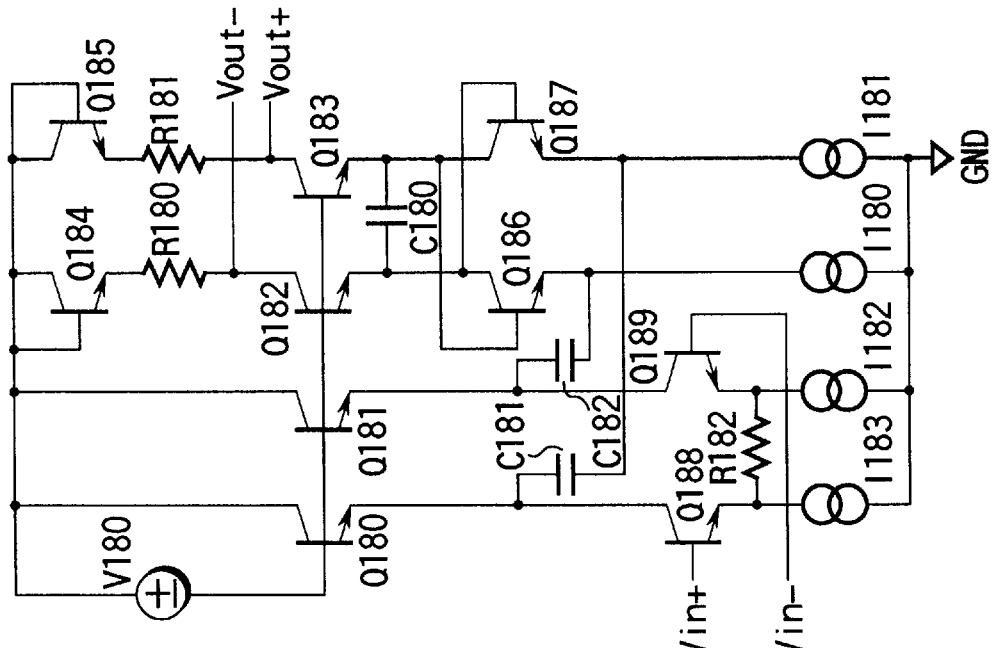
FIG. 7C is a circuit diagram showing a BPF according to the fourth embodiment of the present invention.
Figure 7B:
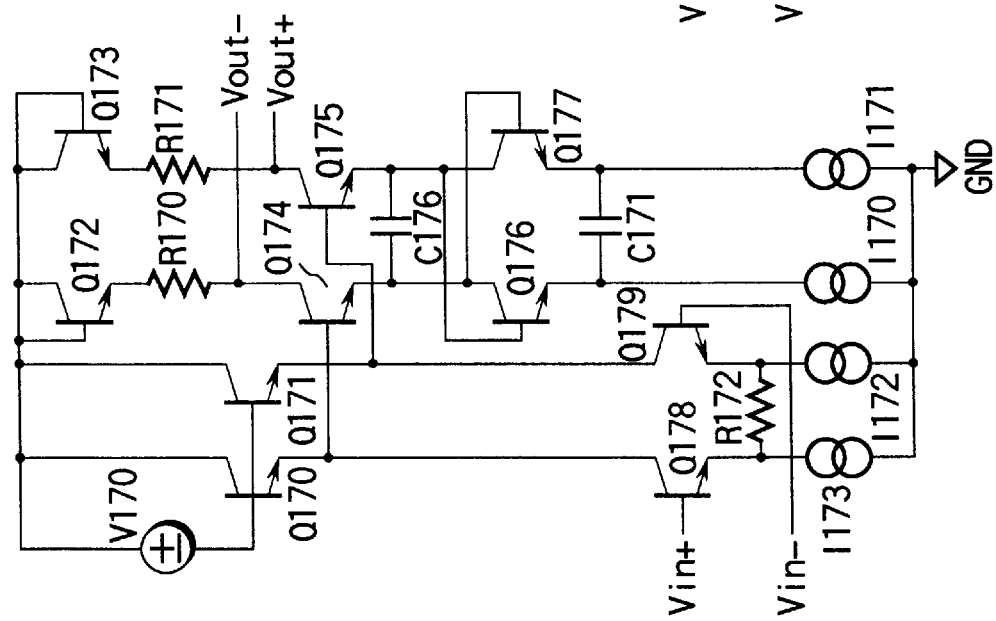
FIG. 7B is a circuit diagram showing an HPF according to the fourth embodiment of the present invention.
Figure 7A:
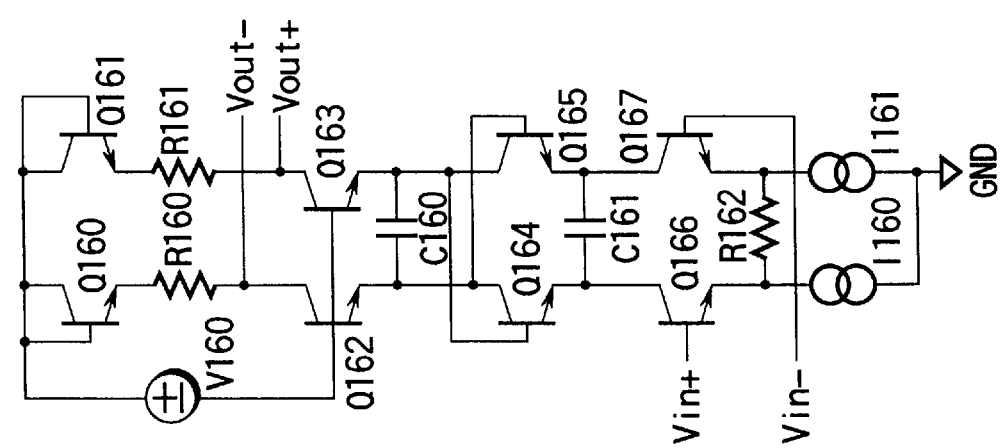
FIG. 7A is a circuit diagram showing an LPF according to the fourth embodiment of the present invention.

In the LPF shown in FIG. 7A, transistors Q162, Q164, Q163, Q165, Q166, and Q167 correspond to the transistors Q1, Q2, Q3, Q4, Q8, and Q9 shown in FIG. 1, and capacitors C161 and C160 correspond to the capacitors C1 and C2 shown in FIG. 1.

A resistor R162 is connected between the emitters of the transistors Q166 and Q167. Constant current sources I160 and I161 are respectively connected between the emitters of the transistors Q166 and Q167 and the ground node. The collector of the transistor Q162 is connected one terminal of a resistor R160, and the other terminal of the resistor R160 is connected to the emitter of an npn transistor Q160. The base of the transistor Q160 is connected to its collector. The collector of the transistor Q163 is connected to one terminal of a resistor R161, and the other terminal of the resistor R161 is connected to the emitter of an npn transistor Q161.

The base of the transistor Q161 is connected to its collector. The bases of the transistors Q162 and Q163 are connected to the negative terminal of a constant voltage source V160, and the positive terminal of the constant voltage source V160 is connected to the collectors of the transistors Q160 and Q161.

The bases of the transistors Q166 and Q167 respectively receive the differential input signal voltages Vin$^+$ and Vin$^-$. The collectors of the transistors Q163 and Q162 respectively output the differential output signal voltages Vout$^+$ and Vout$^-$.

In the HPF shown in FIG. 7B, transistors Q174, Q176, Q175, and Q177 correspond to the transistors Q1, Q2, Q3, and Q4 shown in FIG. 1, and capacitors C171 and C170 correspond to the capacitors C1 and C2 shown in FIG. 1.

Constant current sources I170 and I171 are respectively connected between the emitters of the transistors Q176 and Q177 and the ground node. The collector of the transistor Q174 is connected to one terminal of a resistor R170, and the other terminal of the resistor R170 is connected to the emitter of an npn transistor Q172. The base of the transistor Q172 is connected to its collector. The collector of the transistor Q175 is connected to one terminal of a resistor R171, and the other terminal of the resistor R171 is connected to the emitter of an npn transistor Q173. The base of the transistor Q173 is connected to its collector.

The emitters of transistors Q170 and Q171 are respectively connected to the bases of the transistors Q174 and Q175 and to the collectors of transistors Q178 and Q179. A resistor R172 is connected between the emitters of the transistors Q178 and Q179. Constant current sources I173 and I172 are respectively connected between the emitters of the transistors Q178 and Q179 and the ground node. The bases of the transistors Q170 and Q171 are connected to the negative terminal of a constant voltage source V170, and the positive terminal of the constant voltage source V170 is connected to the collectors of the transistors Q170 to Q173.

The bases of the transistors Q178 and Q179 respectively receive the differential input signal voltages Vin$^+$ and Vin$^-$. The collectors of the transistors Q175 and Q174 respectively output the differential output signal voltages Vout$^+$ and Vout$^-$.

In the BPF shown in FIG. 7C, transistors Q182, Q186, Q183, and Q187 correspond to the transistors Q1, Q2, Q3, and Q4 shown in FIG. 1, and a capacitor C180 corresponds to the capacitor C2 shown in FIG. 1.

Constant current sources I180 and I181 are respectively connected between the emitters of the transistors Q186 and Q187 and the ground node GND. The collector of the transistor Q184 is connected to one terminal of a resistor R180, and the other terminal of the resistor R180 is connected to the emitter of an npn transistor Q184. The base of the transistor Q184 is connected to its collector. The collector of the transistor Q183 is connected to one terminal of a resistor R181, and the other terminal of the resistor R181 is connected to the emitter of an npn transistor Q185. The base of the transistor Q185 is connected to its collector. The emitters of transistors Q180 and Q181 are respectively connected to the collectors of transistors Q188 and Q189. A resistor R182 is connected between the emitters of the transistors Q188 and 189. Constant current sources I183 and I182 are respectively connected between the emitters of the transistors Q188 and Q189 and the ground node.

A capacitor C181 is connected between the emitters of the transistors Q181 and Q186, and a capacitor C182 is connected between the emitters of the transistors Q180 and Q187. The bases of the transistors Q180 to Q183 are connected to the negative terminal of a constant voltage source V180, and the positive terminal of the constant voltage source V180 is connected to the collectors of transistors Q180, 181, Q184, and Q185.

The bases of the transistors Q188 and Q189 respectively receive the differential input signal voltages Vin$^+$ and Vin$^-$. The collectors of the transistors Q183 and Q182 respectively output the differential output signal voltages Vout$^+$ and Vout$^-$.

Figure 8B:
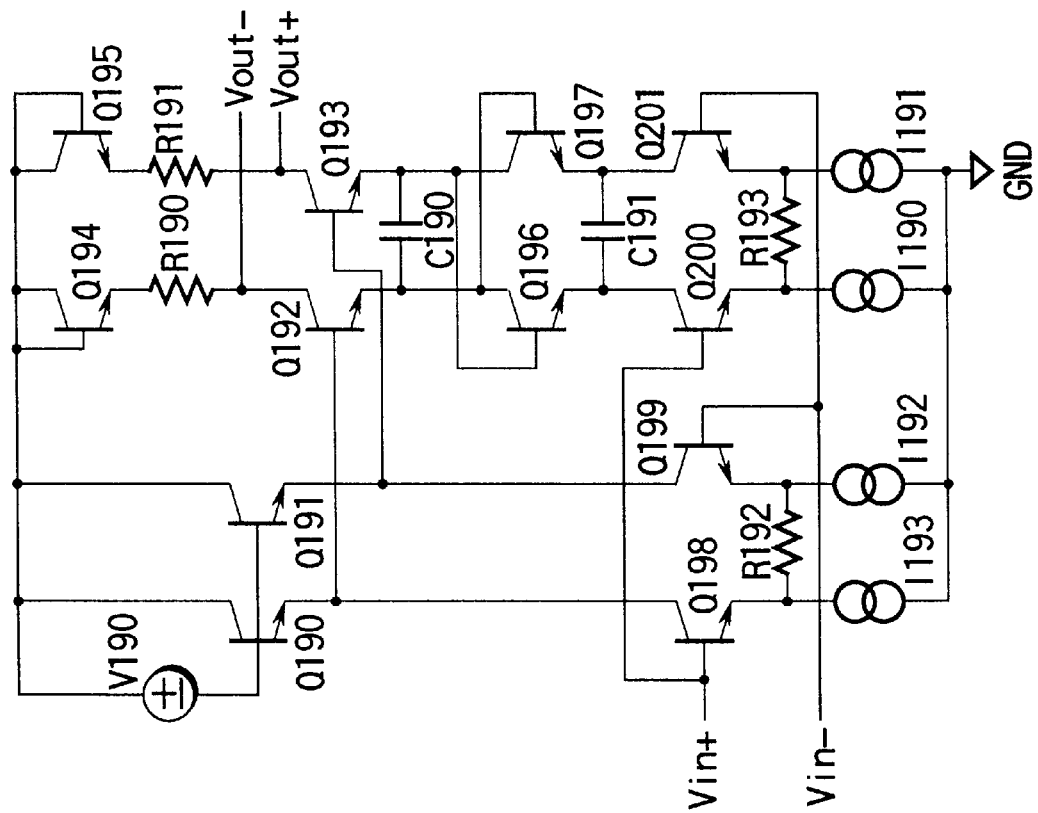
FIG. 8B is a circuit diagram showing a boosting filter according to the fourth embodiment of the present invention.
Figure 8A:
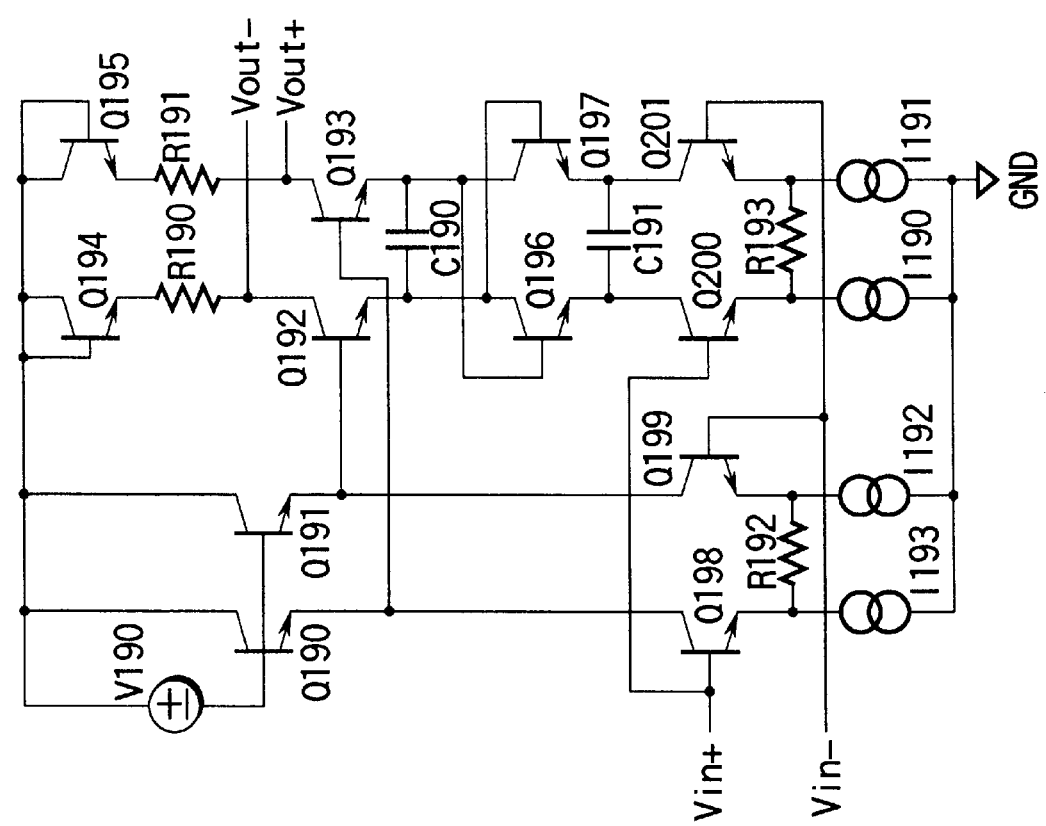
FIG. 8A is a circuit diagram showing a notch circuit according to the fourth embodiment of the present invention.

In the notch filter shown in FIG. 8A, transistors Q192, Q196, Q193, Q197, Q200, and Q201 correspond to the transistors Q1, Q2, Q3, Q4, Q8, and Q9 shown in FIG. 1, and capacitors C191 and C190 correspond to the capacitors C1 and C2 shown in FIG. 1.

A resistor R193 is connected between the emitters of the transistors Q200 and Q201. Constant current sources I190 and I191 are respectively connected between the emitters of the transistors Q200 and Q201 and the ground node GND. The collector of the transistor Q192 is connected to one terminal of a resistor R190, and the other terminal of the resistor R190 is connected to the emitter of an npn transistor Q194. The base of the transistor Q194 is connected to its collector. The collector of the transistor Q193 is connected to one terminal of a resistor R191, and the other terminal of the resistor R191 is connected to the emitter of an npn transistor Q195. The base of the transistor Q195 is connected to its collector.

The emitters of transistors Q190 and Q191 are respectively connected to the bases of the transistors Q193 and Q192 and to the collectors of transistors Q198 and Q199. A resistor R192 is connected between the emitters of the transistors Q198 and 199. Constant current sources I193 and I192 are respectively connected between the emitters of the transistors Q198 and Q199 and the ground node. The bases of the transistors Q190 and Q191 are connected to the negative terminal of a constant voltage source V190, and the positive terminal of the constant voltage source V190 is connected to the collectors of transistors Q190, 191, Q194, and Q195.

The bases of the transistors Q198, Q199, Q200 and Q201 respectively receive the differential input signal voltages Vin$^+$ and Vin$^-$. The collectors of the transistors Q193 and Q192 respectively output the differential output signal voltages Vout$^+$ and Vout$^-$.

The boosting filter shown in FIG. 8B has almost the same arrangement as that of the notch filter shown in FIG. 8A except that the emitters of the transistors Q190 and Q191 and the collectors of the transistors Q198 and Q199 are respectively connected to the bases of the transistors Q192 and Q193. The same reference numerals as in FIG. 8A denote the same parts in FIG. 8B.

<Fifth Embodiment>

Figure 9:
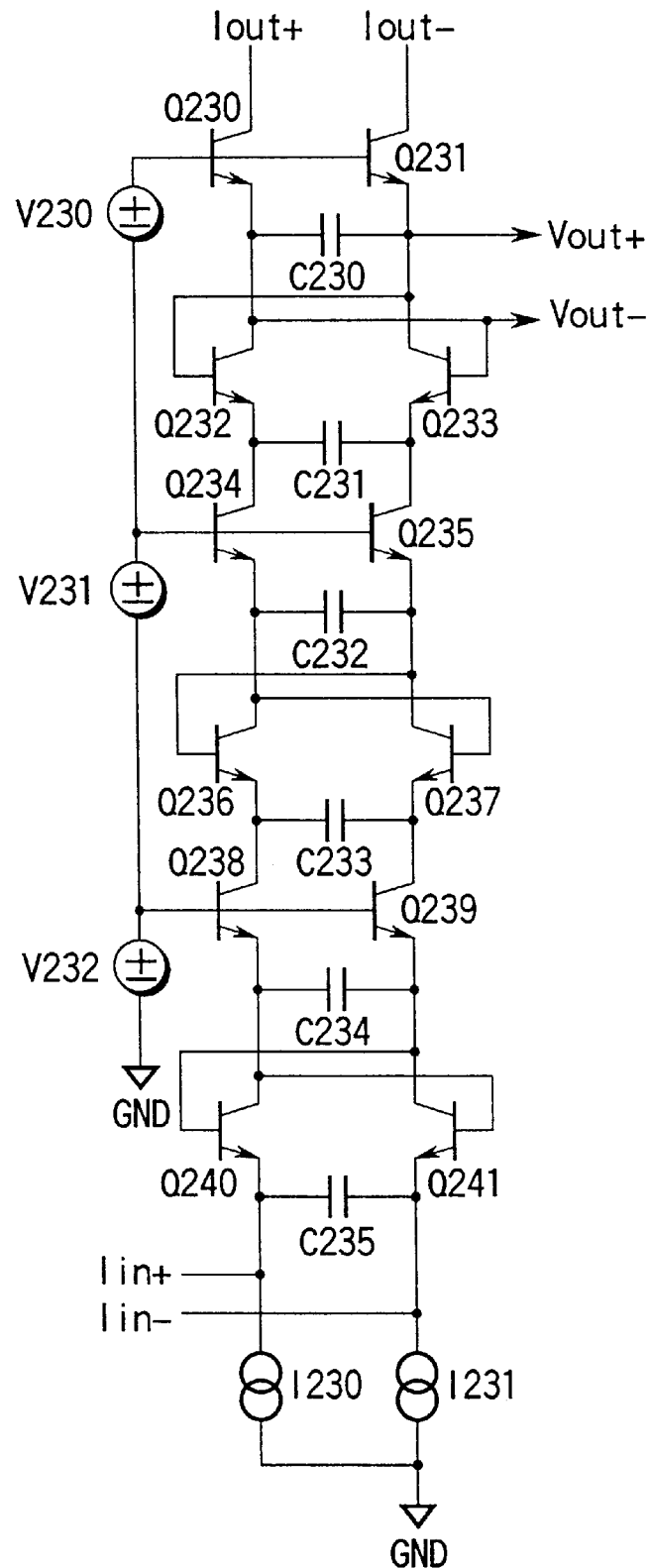
FIG. 9 is a circuit diagram showing a filter circuit according to the fifth embodiment of the present invention.

FIG. 9 shows a filter circuit which realizes a sixth-order LPF by cascade-connecting basic circuits like the one shown in FIG. 5A on a plurality of stages (three in this embodiment). An output from this filter circuit is the sum of outputs from the respective stages. More specifically, in the filter circuit shown in FIG. 9, npn transistors Q230 to Q233, Q234 to Q237, and Q238 to Q241 correspond to the npn transistors Q110 to Q113 shown in FIG. 5A.

Capacitors C230 and C231, capacitors C232 and C233, and capacitors C234 and C235 correspond to C110 and C111 shown in FIG. 5A. Constant current sources I230 and I231 correspond to I110 and I111 shown in FIG. 5A. Constant voltage sources V230, V231, and V232 (each constituted by series-connecting, e.g., a plurality of diodes) correspond to V110 shown in FIG. 5A. The emitters of the transistors Q240 and Q241 on the lowest stage respectively receive the differential input signal currents Iin⁺ and Iin⁻. The collectors of the transistors Q230 and Q231 on the highest stage serve as current output terminals for extracting the differential output signal currents Iout⁺ and Iout⁻.

<Modification of Filter Circuit in FIG. 1>

Figure 10:
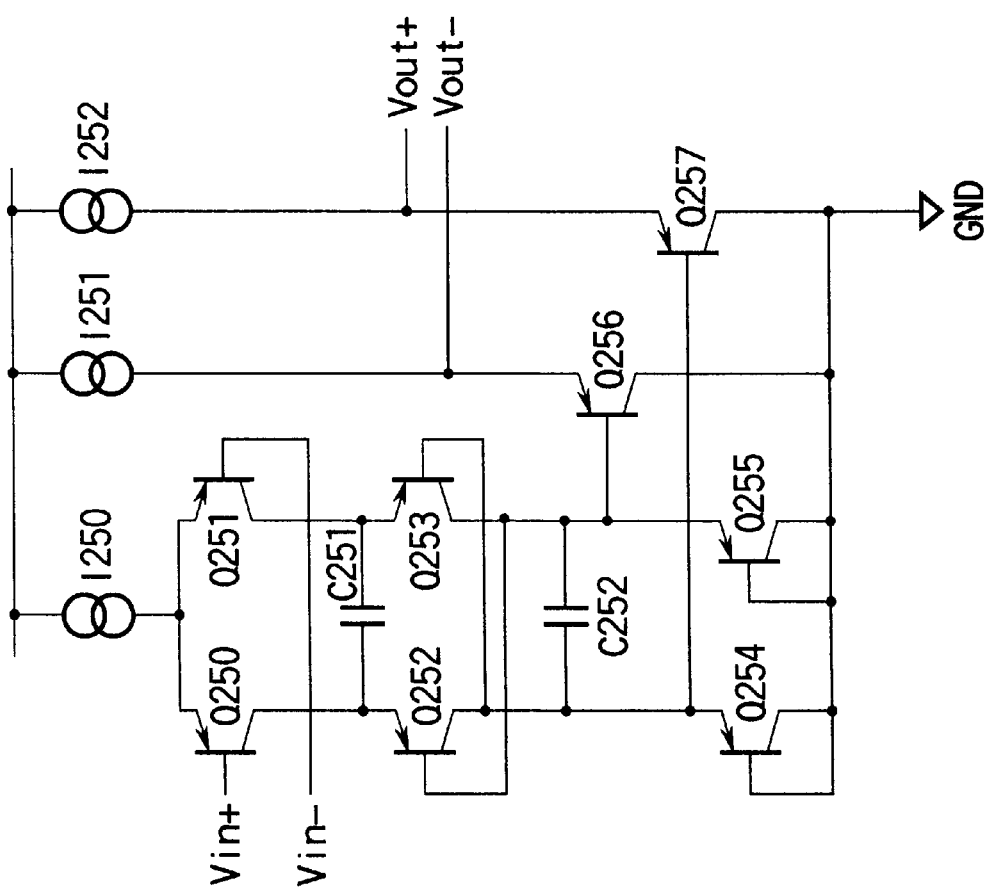
FIG. 10 is a circuit diagram showing a modification of the LPF in FIG. 1.

FIG. 10 shows a filter circuit obtained by reconstituting the LPF shown in FIG. 1 with a plurality of pnp transistors. Operation of the LPF is completely the same as that of the LPF shown in FIG. 1. More specifically, in FIG. 10, the emitters of transistors Q250 and Q251 are connected to a constant current source I250, and the collectors of the transistors Q250 and Q251 are respectively connected to the emitters of transistors Q252 and Q253. The collector of the transistor Q252 is connected to the base of the transistor Q253, and the collector of the transistor Q253 is connected to the base of the transistor Q252. A capacitor C251 is connected between the emitters of the transistors Q252 and Q253, and a capacitor C252 is connected between the collectors of the transistors Q252 and Q253.

The collector of the transistor Q252 is connected to the emitter of a transistor Q254 and the base of a transistor Q257, and the collector of the transistor Q253 is connected to the emitter of a transistor Q255 and the base of a transistor Q256. The base and collector of the transistor Q254, the base and collector of the transistor Q255, the collector of the transistor Q256, and the collector of the transistor Q257 are connected to the ground node GND. The emitter of the transistor Q256 is connected to a constant current source I251, and the emitter of the transistor Q257 is connected to a constant current source I252.

The bases of the transistors Q250 and 251 respectively receive the differential input signal voltages Vin⁺ and Vin⁻. The emitters of the transistors Q256 and Q257 respectively output the differential output signal voltages Vout⁺ and Vout⁻.

Any circuit other than the circuit in FIG. 1 can be reconstituted by pnp transistors instead of npn transistors.

<Sixth Embodiment>

Figure 11:
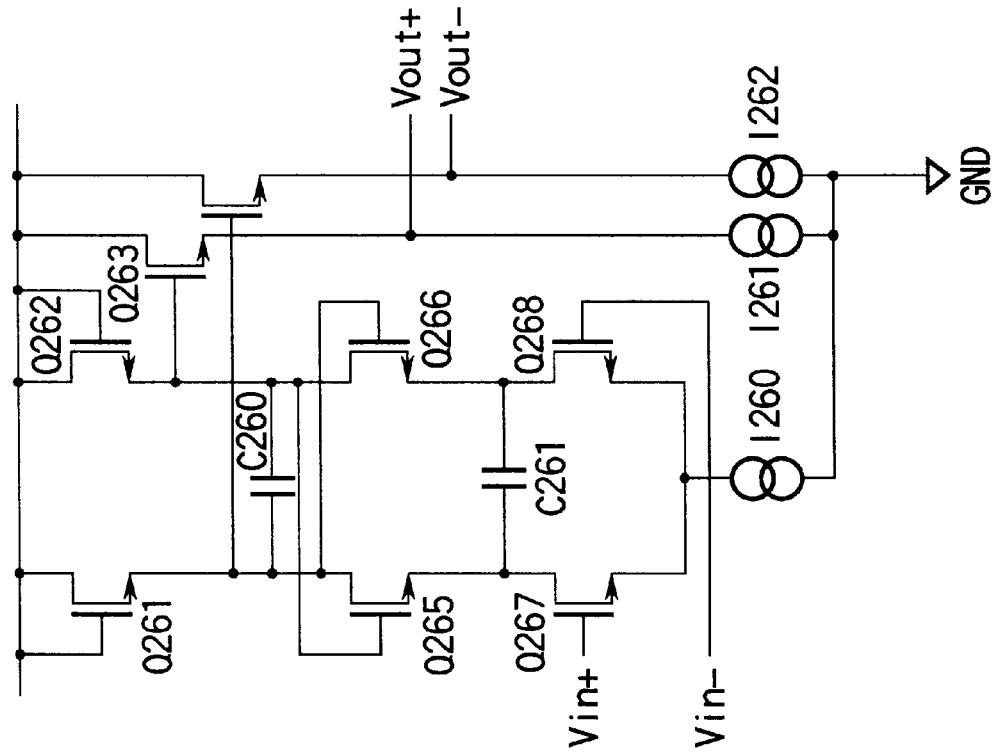
FIG. 11 is a circuit diagram showing a filter circuit according to the sixth embodiment of the present invention.

FIG. 11 shows a circuit obtained by constituting the LPF shown in FIG. 1 with a plurality of transistors (p-channel MOS transistors in this embodiment). Referring to FIG. 11, the gate of a transistor Q265 is connected to the source of a transistor Q266, and the gate of the transistor Q266 is connected to the source of the transistor Q265. A capacitor C260 is connected between the sources of the transistors Q265 and Q266, and a capacitor C261 is connected between their drains. The sources of the transistors Q265 and Q266 are respectively connected to the drains of transistors Q261 and Q262. The gates and sources of the transistors Q261 and Q262 are commonly connected to a predetermined voltage node.

The drains of the transistors Q265 and Q266 are respectively connected to the sources of transistors Q267 and Q268, and the drains of the transistors Q267 and Q268 are connected to a constant current source I260. The sources of the transistors Q265 and Q266 are respectively connected to the gates of transistors Q264 and Q263, and the sources of the transistors Q264 and Q263 are connected to the predetermined voltage node. Constant current sources I262 and I261 are respectively connected between the drains of the transistors Q264 and Q263 and the ground node GND.

The gates of the transistors Q267 and Q268 respectively receive the differential input signal voltages Vin⁺ and Vin⁻. The drains of the transistors Q263 and Q264 respectively output the differential output signal voltages Vout⁺ and Vout⁻.

The filter circuit shown in FIG. 11 attains circuit characteristics as described with reference to FIG. 3.

The filter circuit shown in FIG. 11 is constituted by p-channel MOS transistors, but may be constituted by a combination of n-channel MOS transistors and p-channel MOS transistors.

<Seventh Embodiment>

Figure 12B:
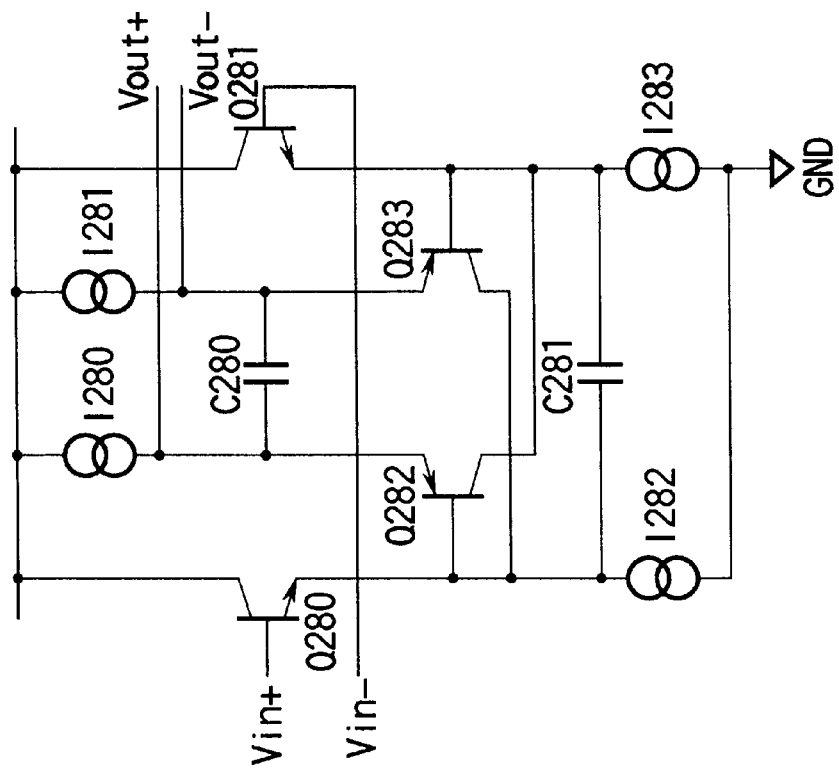
FIGS. 12A and 12B are circuit diagrams each showing a filter circuit according to the seventh embodiment of the present invention.
Figure 12A:
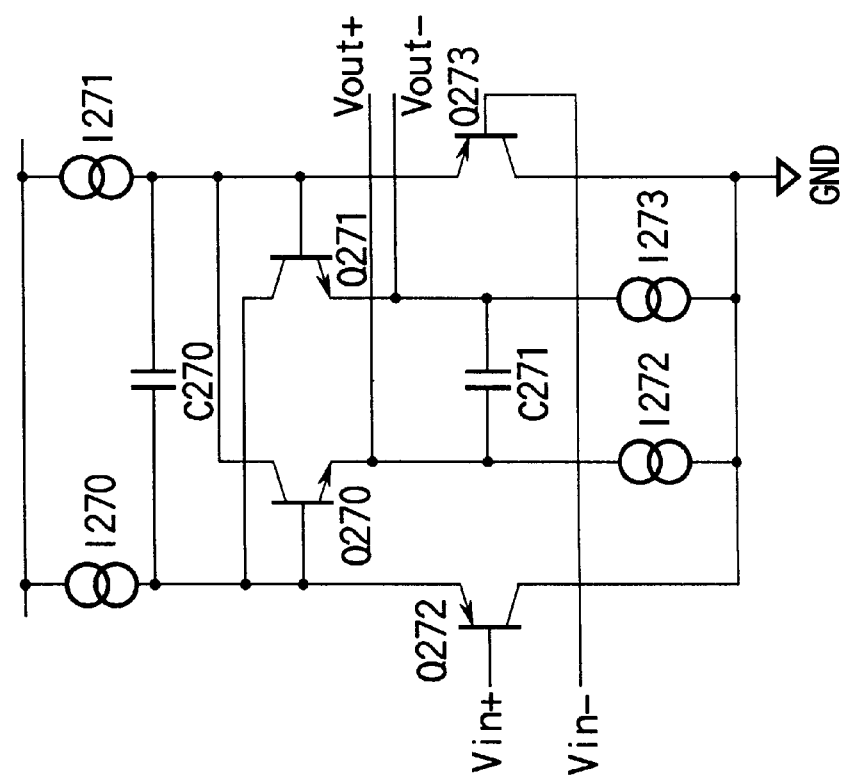

FIGS. 12A and 12B show filter circuits each obtained by constituting the LPF shown in FIG. 1 with a combination of npn transistors and pnp transistors. Referring to FIG. 12A, the bases and collectors of npn transistors Q270 and Q271 are cross-connected. A capacitor C270 is connected between the collectors of the transistors Q270 and Q271, and a capacitor C271 is connected between their emitters. Constant current sources I272 and I273 are respectively connected between the emitters of the transistors Q270 and Q271 and the ground node GND. The bases of the transistors Q270 and Q271 are respectively connected to constant current sources I270 and I271 and to the emitters of pnp transistors Q272 and Q273. The collectors of the transistors Q272 and Q273 are grounded.

The bases of the transistors Q272 and Q273 respectively receive the differential input signal voltages Vin⁺ and Vin⁻. The emitters of the transistors Q270 and Q271 respectively output the differential output signal voltages Vout⁺ and Vout⁻.

In the circuit shown in FIG. 12B, pnp transistors and npn transistors replace the npn transistor and pnp transistors shown in FIG. 12A, and operation is completely the same as in FIG. 12A. Referring to FIG. 12B, the bases and collectors of pnp transistors Q282 and Q283 are cross-connected. A capacitor C280 is connected between the emitters of the transistors Q282 and Q283, and a capacitor C281 is connected between their collectors. Constant current sources I280 and I281 are respectively connected between the emitters of the transistors Q282 and Q283 and a predetermined voltage node. The bases of the transistors Q282 and Q283 are respectively grounded via constant current sources I282 and I283, and connected to the emitters of npn transistors Q280 and Q281. The collectors of the transistors Q280 and Q281 are connected to the predetermined voltage node.

The bases of the transistors Q280 and Q281 respectively receive the differential input signal voltages Vin⁺ and Vin⁻. The emitters of the transistors Q282 and Q283 respectively output the differential output signal voltages Vout⁺ and Vout⁻.

The filter circuit in FIG. 12B can make an input DC voltage and an output DC voltage equal, and can operate at a low voltage.

Note that the filter circuits in FIGS. 4 to 10 can also be constituted by MOS transistors in place of bipolar transistors or reconstituted by a combination of MOS transistors and bipolar transistors.

<Eighth Embodiment>

FIG. 13 shows an example of an all-pass filter (APF) constituted by a plurality of npn transistors, a plurality of capacitors, and a plurality of resistors. In the all-pass filter shown in FIG. 13, the collectors of transistors Q5 and Q6 are connected to a Vcc node, and their bases receive a bias voltage VB. The collectors of transistors Q3 and Q4 are respectively connected to the emitters of the transistors Q5 and Q6. The bases and collectors of the transistors Q3 and Q4 are cross-connected. A capacitor C2 is connected between the collectors of the transistors Q3 and Q4, and a capacitor C1 is connected between their emitters. The collectors of input transistors Q1 and Q2 forming a differential pair are respectively connected to the emitters of the transistors Q3 and Q4. The emitters of the input transistors Q1 and Q2 are connected to each other, and a first constant current source I31 is connected between their common emitter connection node and the ground node GND.

The collector of a transistor Q11 is connected to the Vcc node, and the base receives the bias voltage VB. The collectors of input transistors Q9 and Q10 forming a differential pair are commonly connected to the emitter of the transistor Q11 via resistors RC. The emitters of the transistors Q9 and Q10 are connected to each other, and a second constant current source I32 is connected between their common emitter connection node and the ground node GND.

The bases of transistors Q7 and Q8 forming a differential pair are respectively connected to the collectors of the transistors Q1 and Q2, and the collectors of the transistors Q7 and Q8 are respectively connected to the collectors of the transistors Q9 and Q10. The emitters of the transistors Q7 and Q8 are connected to each other, and a third constant current source I33 is connected between their common emitter connection node and the ground node GND. In this case, currents from the first and second constant current sources I31 and I32 are set to I, and a current from the third constant current source I33 is set to I×2.

The bases of the input transistors Q1 and Q2 forming a differential pair respectively receive the differential input signal voltages Vin$^+$ and Vin$^-$, and the bases of the input transistors Q9 and Q10 also respectively receive the differential input signal voltages Vin$^+$ and Vin$^-$. The collectors of the transistors Q9 and Q10 output an output signal OUT.

The output signal OUT from the circuit in FIG. 13 is given by equation (13):

$$OUT = \frac{S^2 - \frac{\omega n}{Q}S + \omega n^2}{S^2 + \frac{\omega n}{Q}S + \omega n^2} \quad (13)$$

$$\omega_n = \sqrt{\frac{1}{C_1 \cdot C_2 \cdot R2}}, \; Q = \sqrt{\frac{C_1}{C_2}}, \; gm0 = gm1 = \frac{1}{R}$$

<Modification of Filter Circuit in FIG. 6C>

FIG. 14 shows a modification of the boosting filter shown in FIG. 6C. The same reference numerals as in FIG. 6C denote the same parts. The boosting filter shown in FIG. 14 is different from the boosting filter shown in FIG. 6C as follows. In the filter shown in FIG. 14, the collectors of the transistors Q150 and Q151 are connected to a power supply voltage Vcc. The capacitor C151 connected between the emitters of the transistors Q152 and Q153 shown in FIG. 6C is eliminated. A differential input signal IN is supplied to the emitters of the transistors Q152 and Q153 via coupling capacitors C152 and C153, and an output signal OUT is extracted from the emitters of the transistors Q152 and Q153. Note that the sizes of the capacitors C152 and C153 are set twice the size of the capacitor C151.

The output signal OUT from the circuit in FIG. 14 is given by equation (14):

$$OUT = \frac{-K \cdot S^2 + \omega_n^2}{S^2 + \frac{\omega_n}{Q}S + \omega_n^2} \quad (14)$$

$$\omega_n = \sqrt{\frac{1}{C_1 \cdot C_2 \cdot R^2}}, \; Q = \sqrt{\frac{C_1}{C_2}}, \; gm1 = \frac{1}{R}$$

<First Modification of Filter Circuit in FIG. 5B>

FIG. 15 shows a modification of the HPF shown in FIG. 5B. The same reference numerals as in FIG. 5B denote the same parts. The HPF shown in FIG. 15 is different from the HPF shown in FIG. 5B as follows. The bases of the transistors Q120 and Q122 are connected to the positive terminal of a constant voltage source V150. The collectors of the transistors Q122 and Q123 are respectively connected to the collectors of npn transistors Q125 and Q124 forming a differential pair. The emitters of the transistors Q125 and Q124 are connected to each other, and a constant current source I122 is connected between their common emitter connection node and the ground node GND. The differential input signal voltages Vin$^+$ and Vin$^-$ are respectively supplied to the bases of the transistors Q125 and Q124.

This arrangement enables operation at a lower power supply voltage.

<Modification of Filter Circuit in FIG. 5A>

Figure 16C:
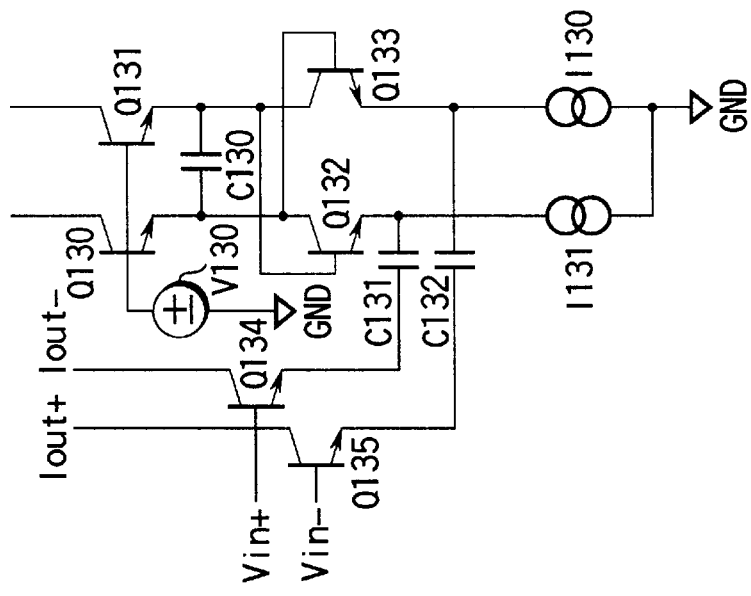
FIGS. 16A, 16B, and 16C are circuit diagrams showing modifications of the filter circuits shown in FIGS. 5A, 5B, and 6A in which the extraction positions for differential output signal currents Iout$^+$ and Iout$^-$ are changed.
Figure 16B:
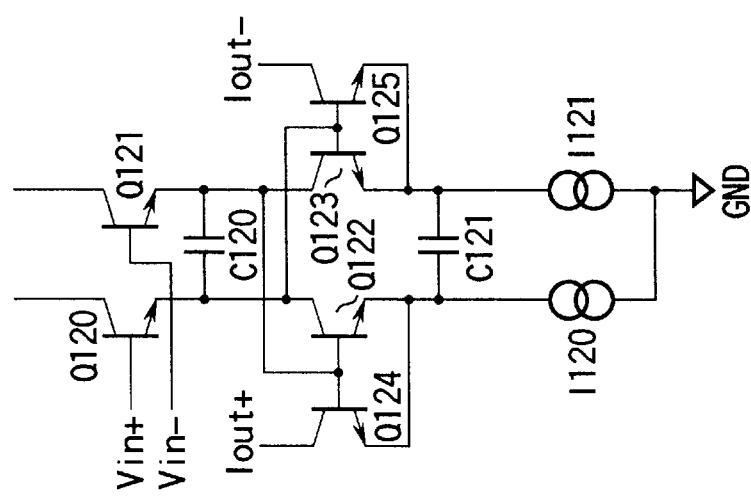
Figure 16A:
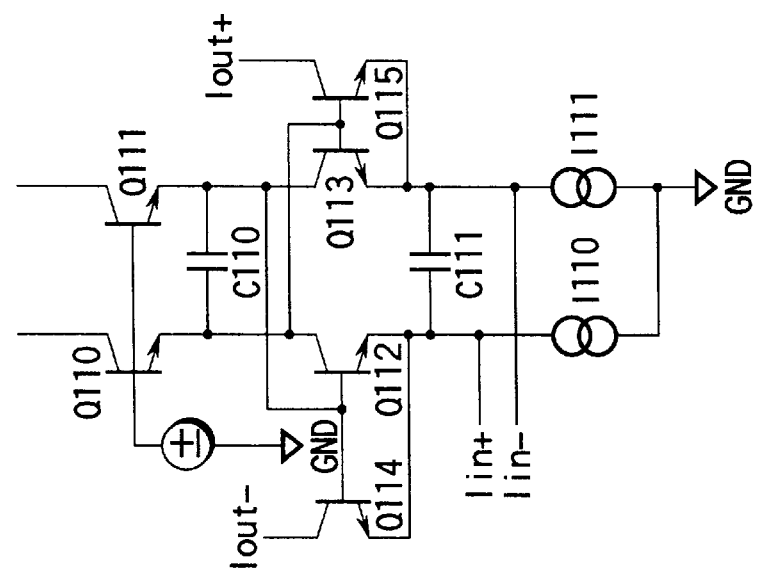
Figure 17:
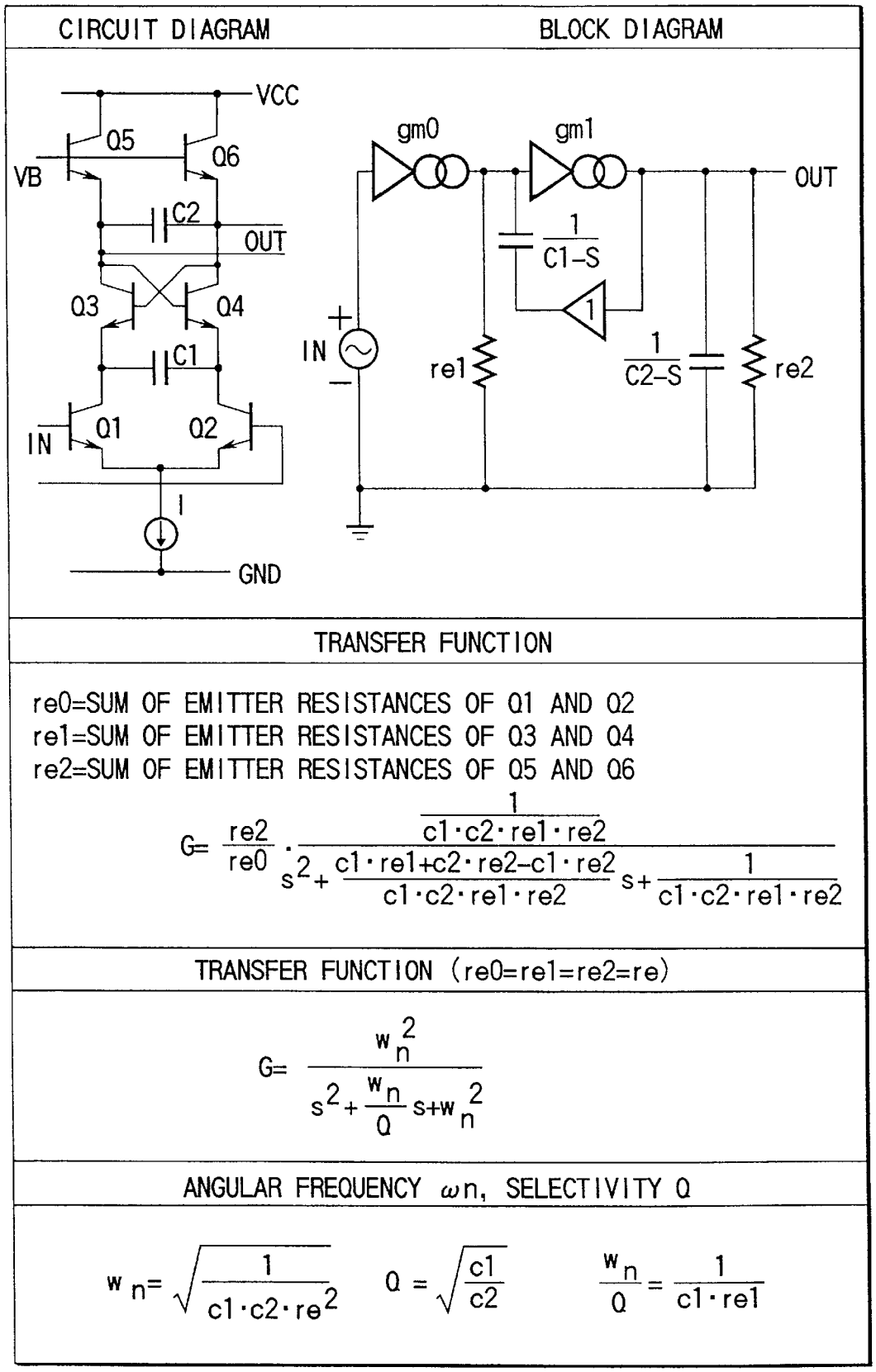
FIG. 17 is a view showing the equivalent circuit and transfer function of an example of the basic circuit of the filter circuit according to the present invention.
Figure 18:
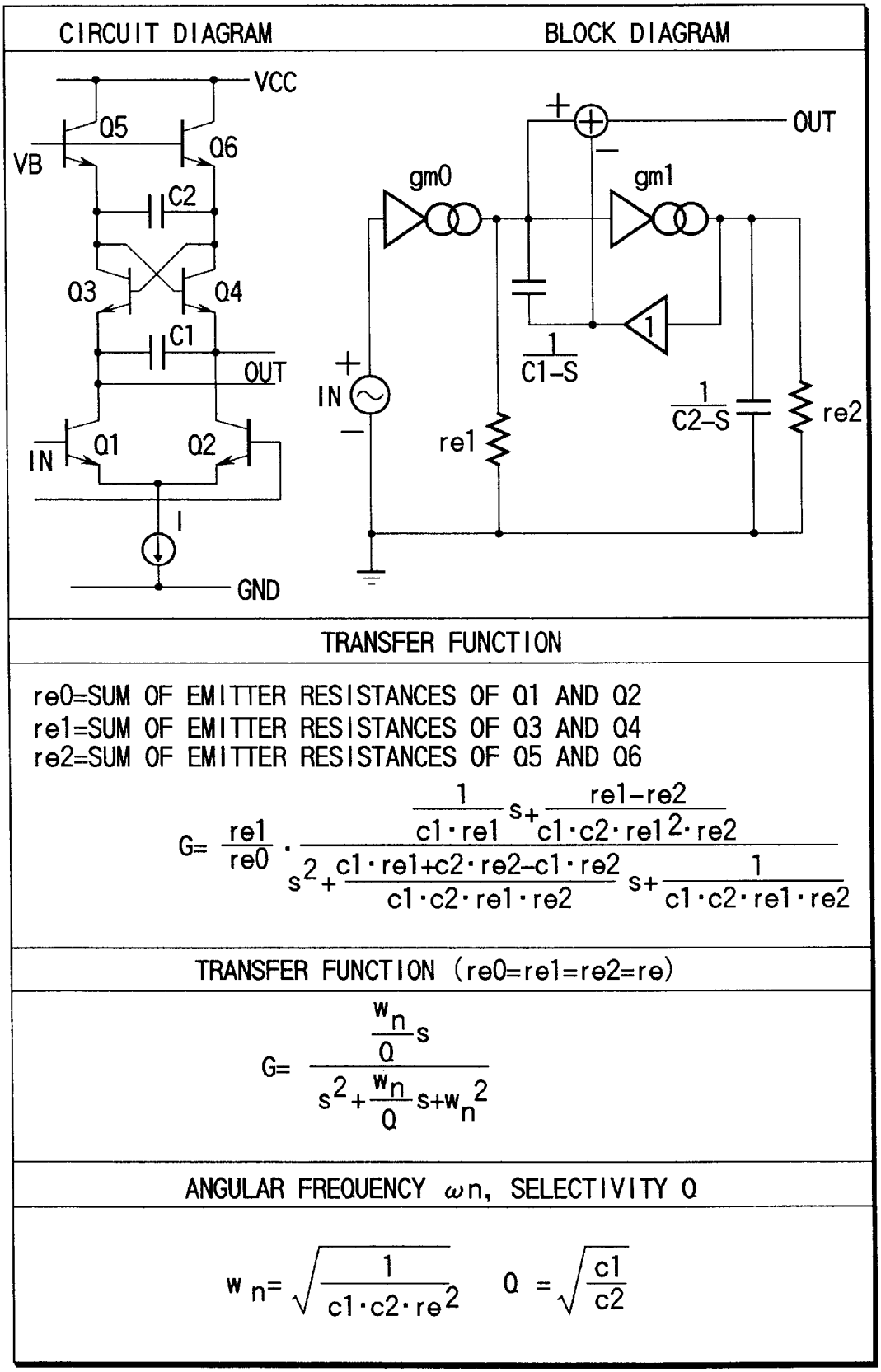
FIG. 18 is a view showing the equivalent circuit and transfer function of another example of the basic circuit of the filter circuit according to the present invention.
Figure 19:
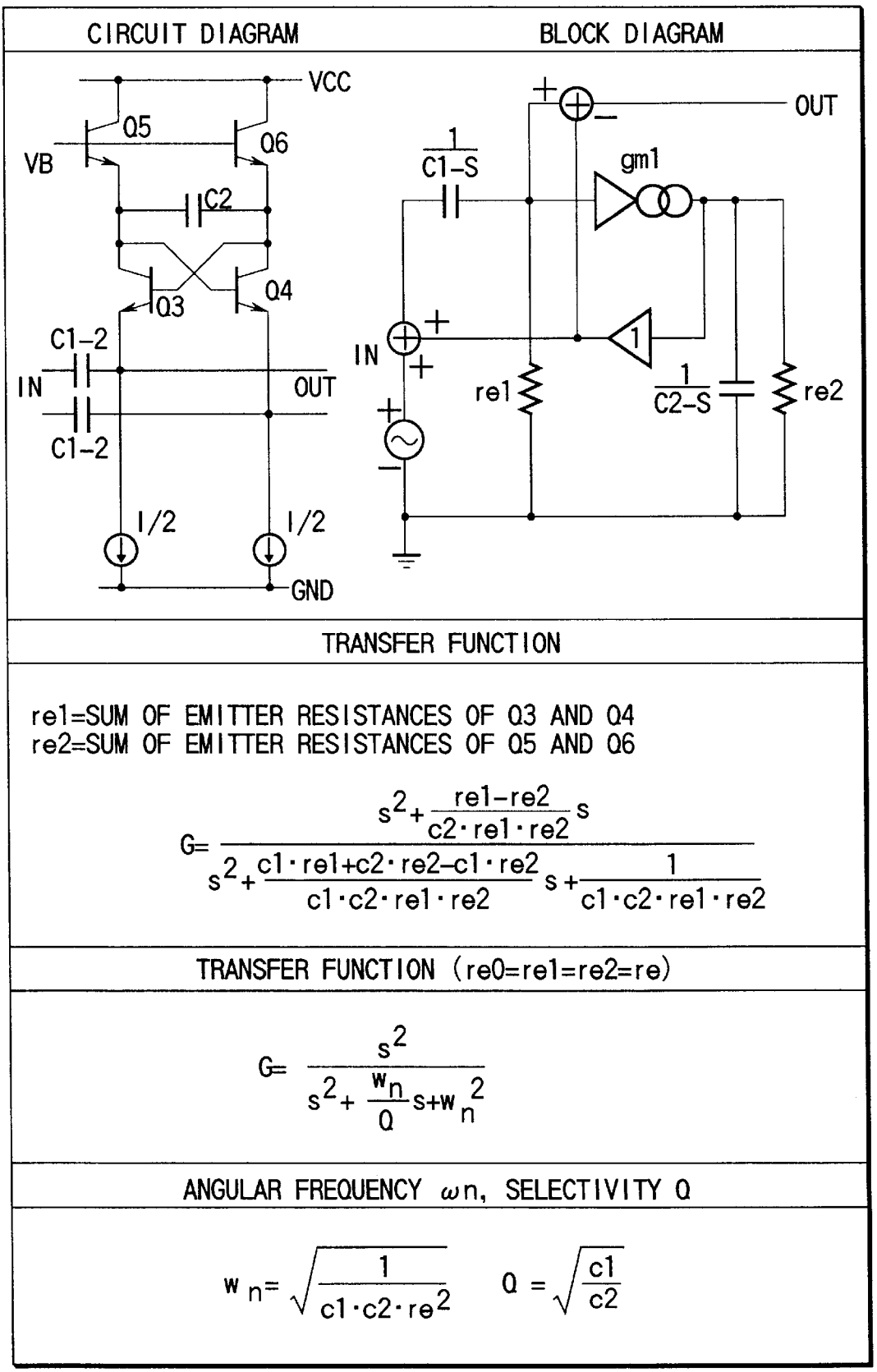
FIG. 19 is a view showing the equivalent circuit and transfer function of still another example of the basic circuit of the filter circuit according to the present invention.
Figure 20:
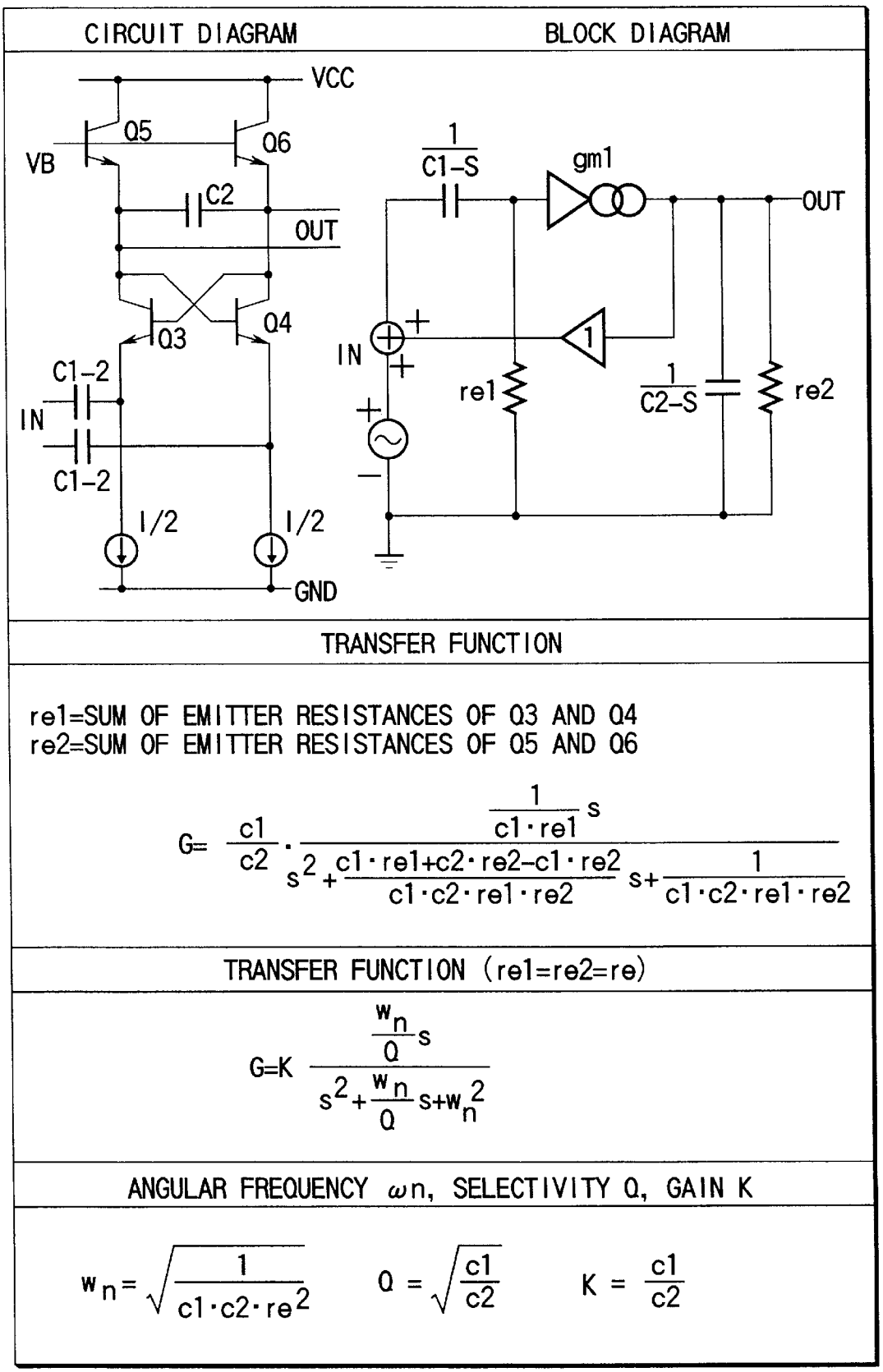
FIG. 20 is a view showing the equivalent circuit and transfer function of still another example of the basic circuit of the filter circuit according to the present invention.
Figure 21:
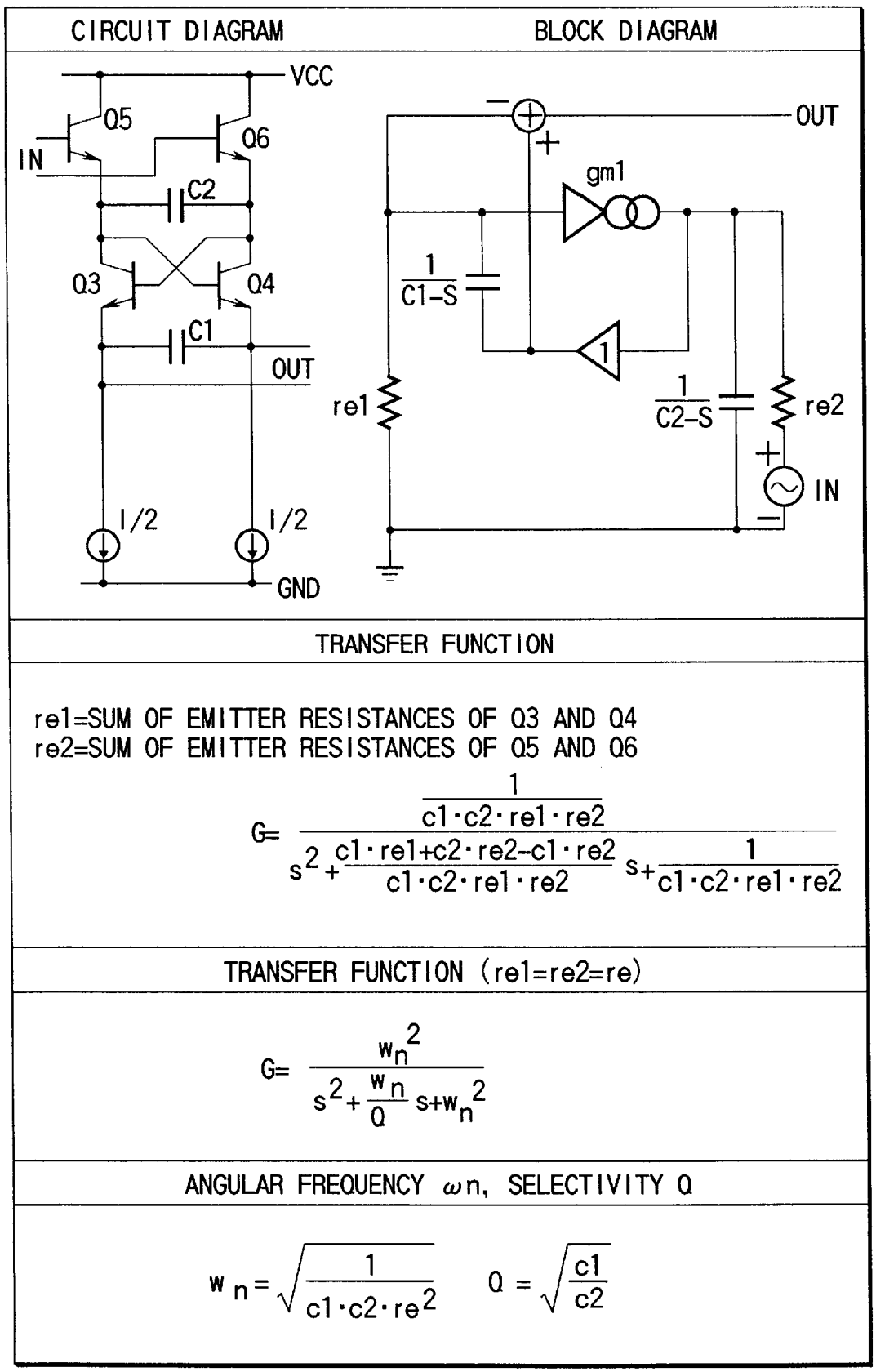
FIG. 21 is a view showing the equivalent circuit and transfer function of still another example of the basic circuit of the filter circuit according to the present invention.

FIG. 16A shows a modification of the LPF shown in FIG. 5A in which the extraction positions for the differential output signal currents Iout$^+$ and Iout$^-$ are changed. The same reference numerals as in FIG. 5A denote the same parts. Referring to FIG. 16A, the bases of the transistors Q112 and Q113 are respectively connected to the bases of npn transistors Q114 and Q115. The emitters of the transistors Q114 and Q115 are respectively connected to the emitters of the transistors Q112 and Q113, and the collectors of the transistors Q114 and Q115 serve as current output terminals.

<Second Modification of Filter Circuit in FIG. 5B>

FIG. 16B shows a modification of the HPF shown in FIG. 5B in which the extraction positions for the differential output signal currents Iout$^+$ and Iout$^-$ are changed. The same reference numerals as in FIG. 5B denote the same parts. Referring to FIG. 16B, the bases of the transistors Q122 and Q123 are respectively connected to the bases of npn transistors Q124 and Q125. The emitters of the transistors Q124 and Q125 are respectively connected to the emitters of the transistors Q122 and Q123, and the collectors of the transistors Q124 and Q125 serve as current output terminals.

<Modification of Filter Circuit in FIG. 6A>

FIG. 16C shows a modification of the BPF shown in FIG. 6A in which the extraction positions for the differential output signal currents Iout$^+$ and Iout$^-$ are changed. The same reference numerals as in FIG. 6A denote the same parts. Referring to FIG. 16C, each of the emitters of npn transistors Q134 and Q135 is connected to one terminal of a corresponding one of the capacitors C131 and C132. The bases of the transistors Q134 and Q135 respectively receive the differential input signal voltages Vin$^+$ and Vin$^-$. The collectors of the transistors Q134 and Q135 serve as current output terminals.

FIGS. 17 to 32 show the equivalent circuits, the transfer functions, the angular frequencies, Q, and gains K if necessary in various basic circuits of the filter circuit according to the present invention.

Referring to FIGS. 17 to 32, reference symbol Vcc denotes a power supply voltage; GND, a ground voltage; VB, a bias voltage; IN, an input; and OUT, an output. FIGS. 17 to 24 show filter circuits each constituted by a combination of a plurality of npn transistors and a plurality of capacitors. FIGS. 25 to 32 show filter circuits each constituted by a combination of a plurality of p-channel MOS transistors and a plurality of capacitors.

Figure 23:
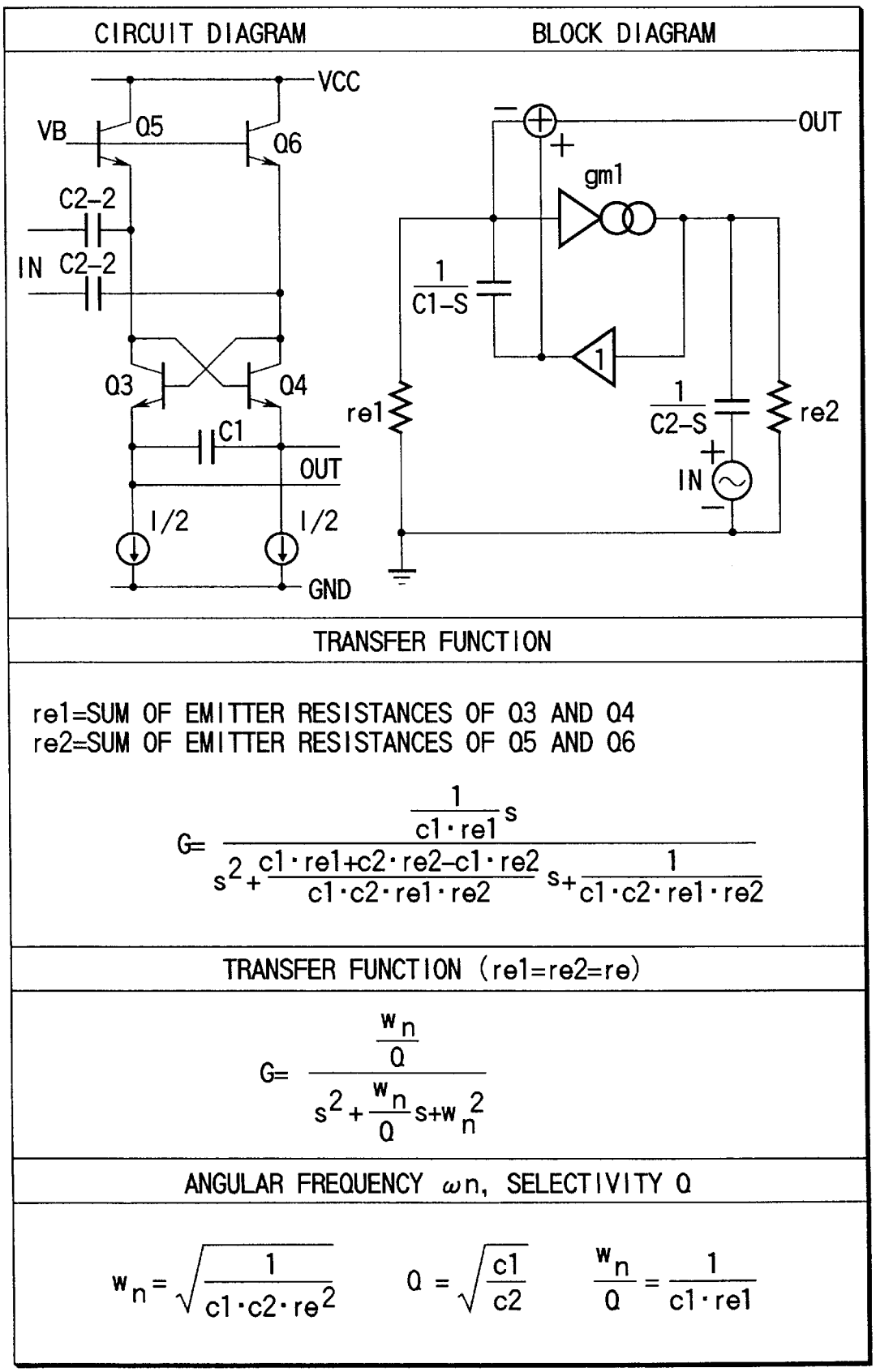
FIG. 23 is a view showing the equivalent circuit and transfer function of still another example of the basic circuit of the filter circuit according to the present invention.
Figure 25:
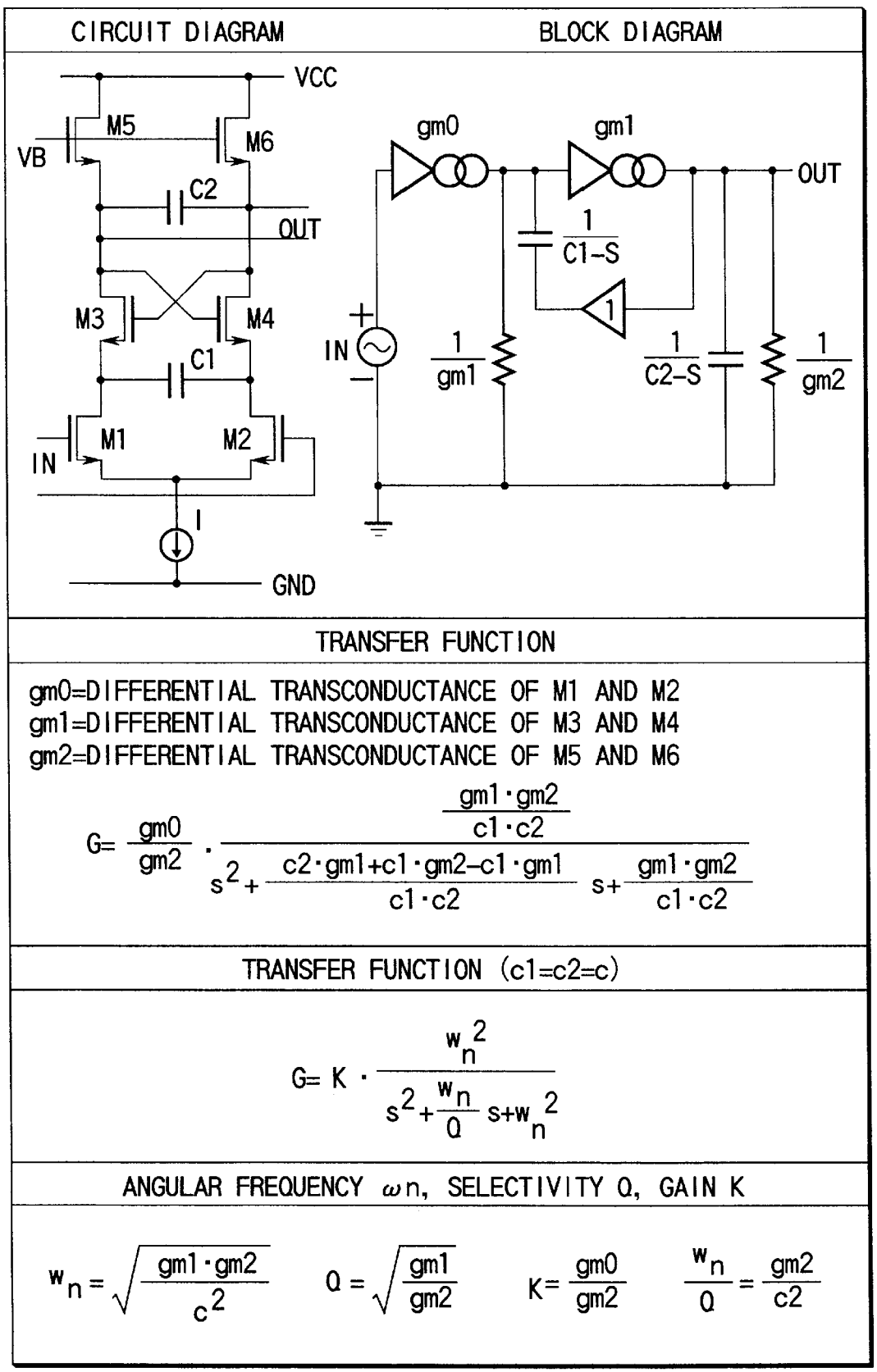
FIG. 25 is a view showing the equivalent circuit and transfer function of an example of a basic circuit constituted by a combination of a plurality of pMOS transistors and a plurality of capacitors as the filter circuit according to the present invention.
Figure 26:
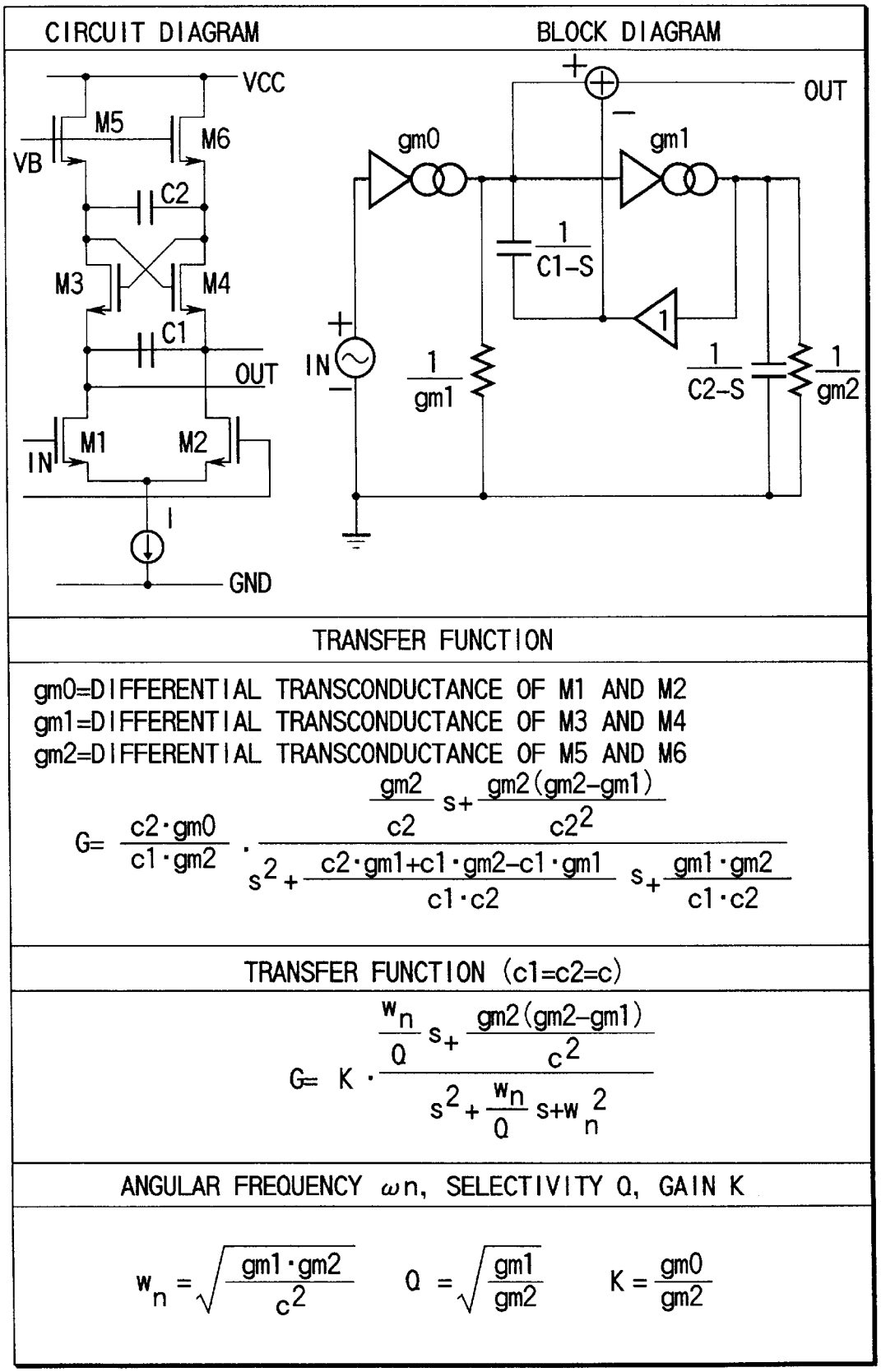
FIG. 26 is a view showing the equivalent circuit and transfer function of another example of the basic circuit shown in FIG. 25.
Figure 27:
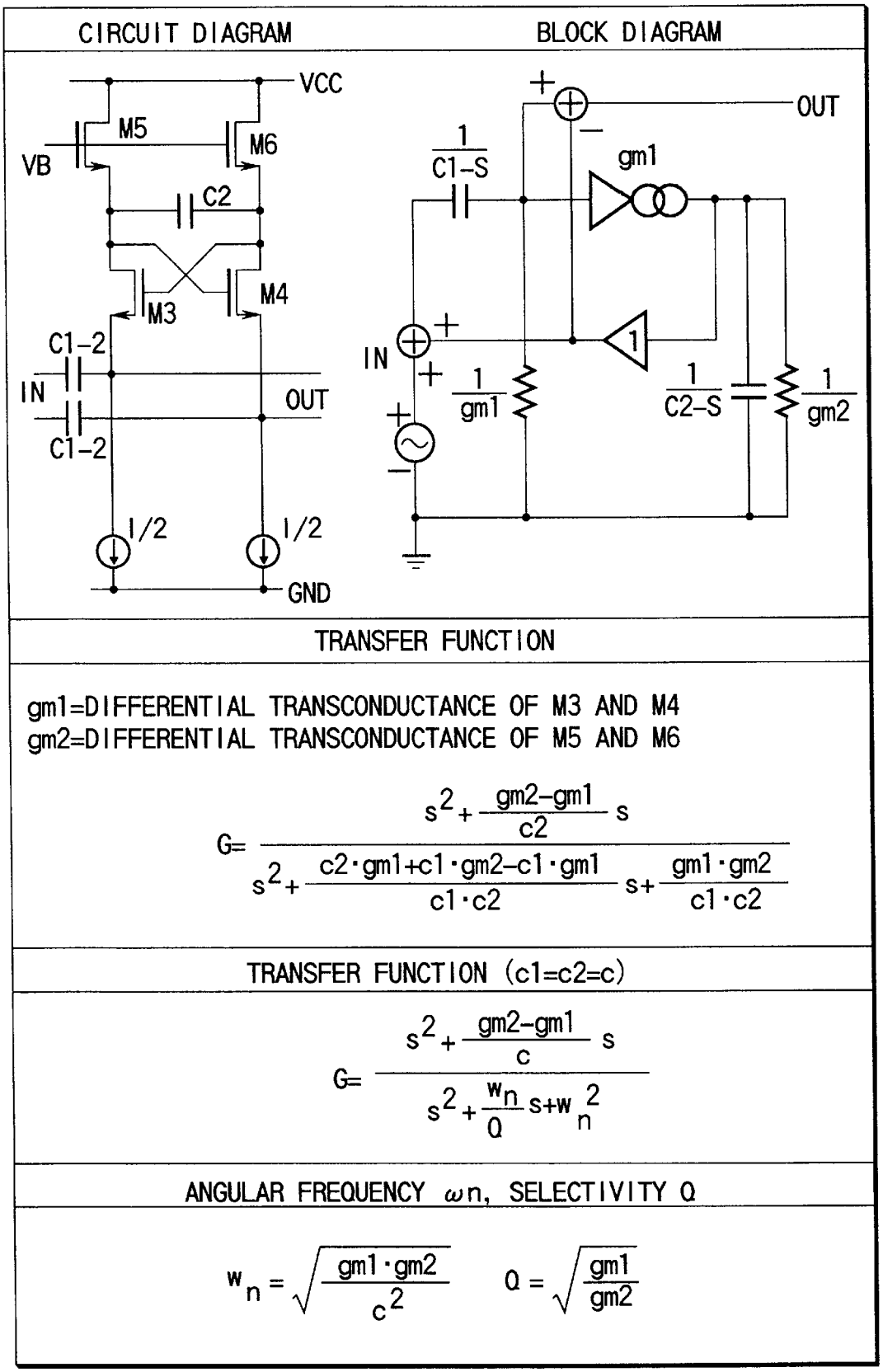
FIG. 27 is a view showing the equivalent circuit and transfer function of still another example of the basic circuit shown in FIG. 25.
Figure 28:
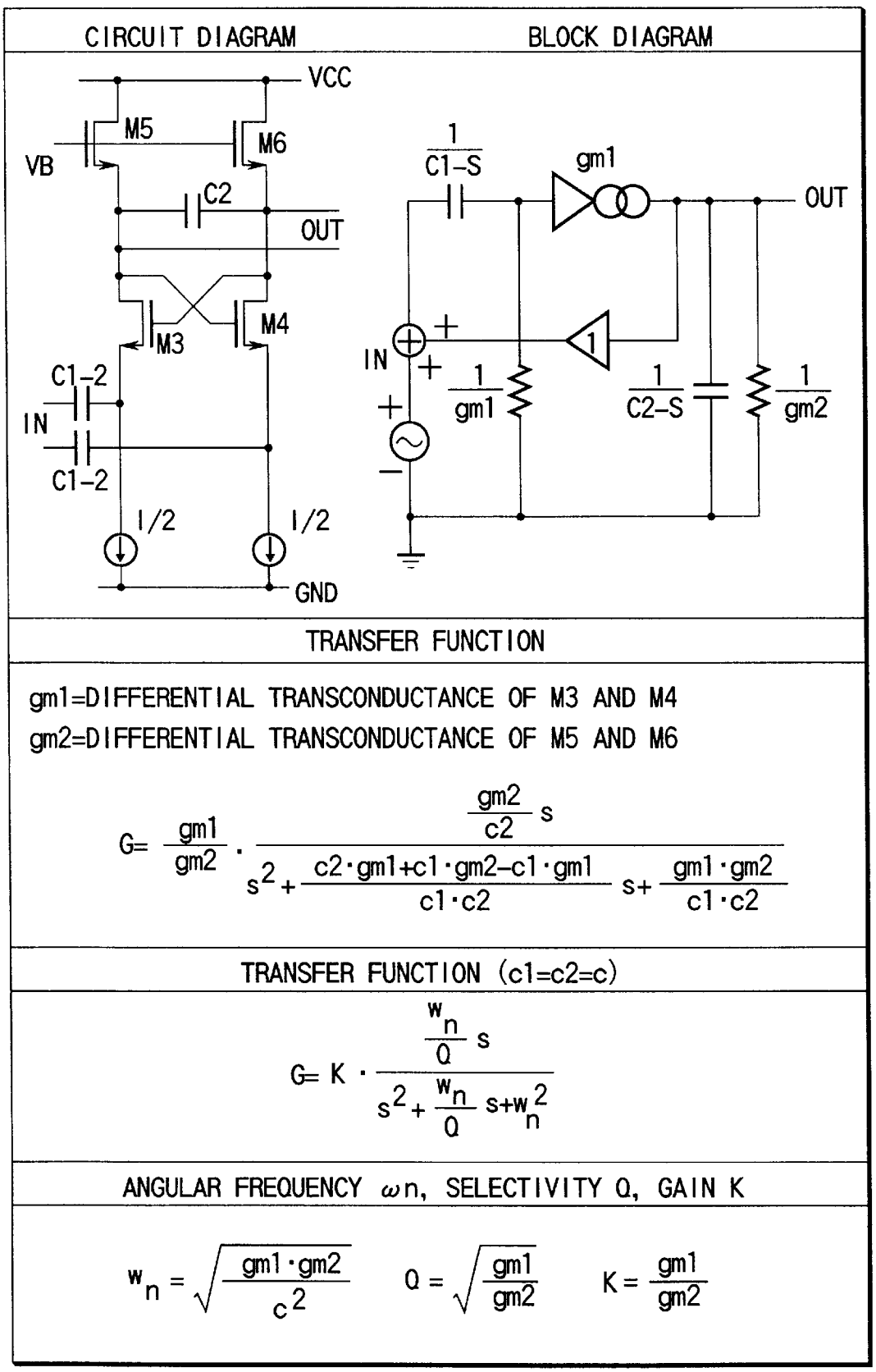
FIG. 28 is a view showing the equivalent circuit and transfer function of still another example of the basic circuit shown in FIG. 25.
Figure 29:
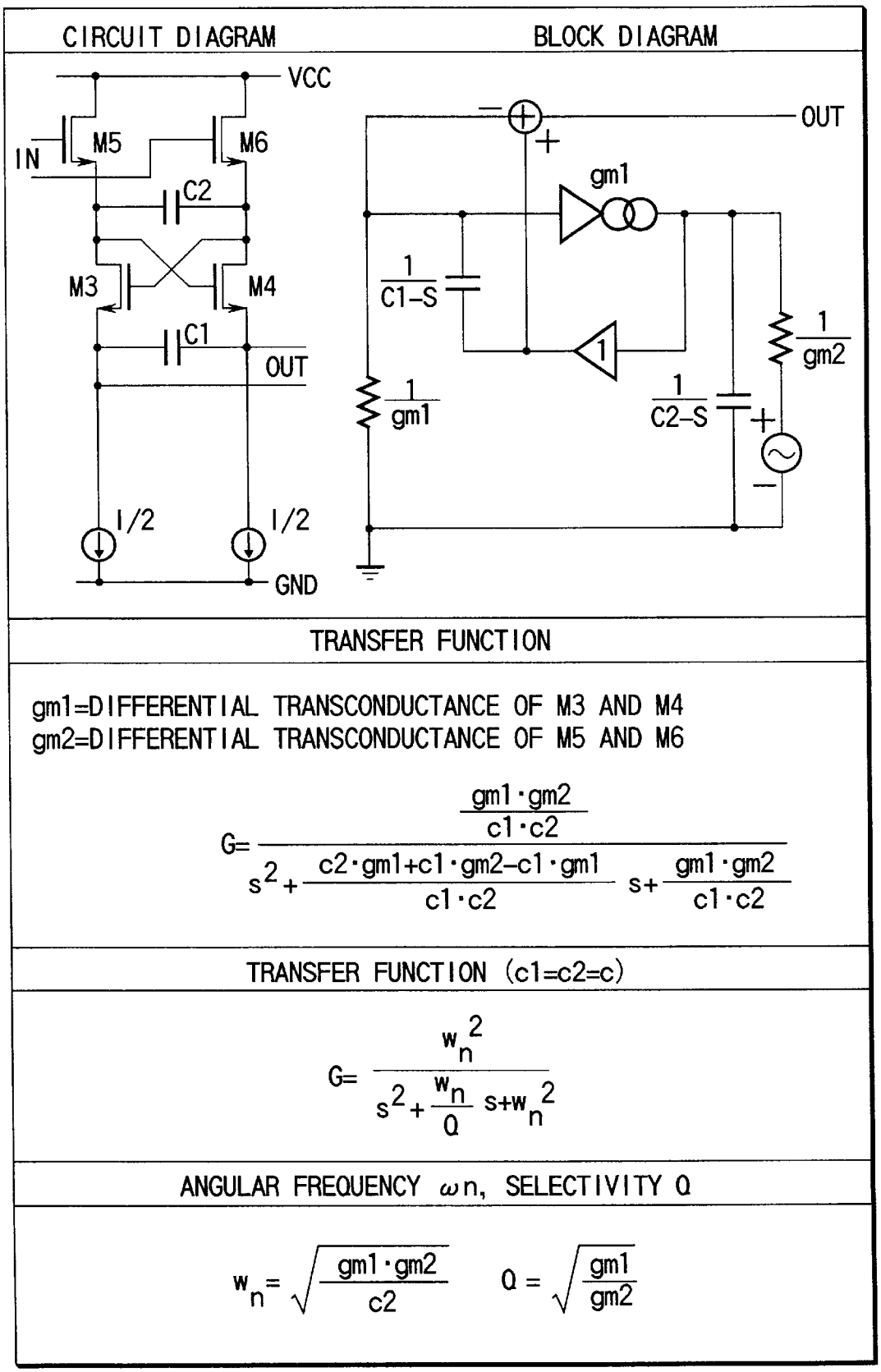
FIG. 29 is a view showing the equivalent circuit and transfer function of still another example of the basic circuit shown in FIG. 25.
Figure 30:
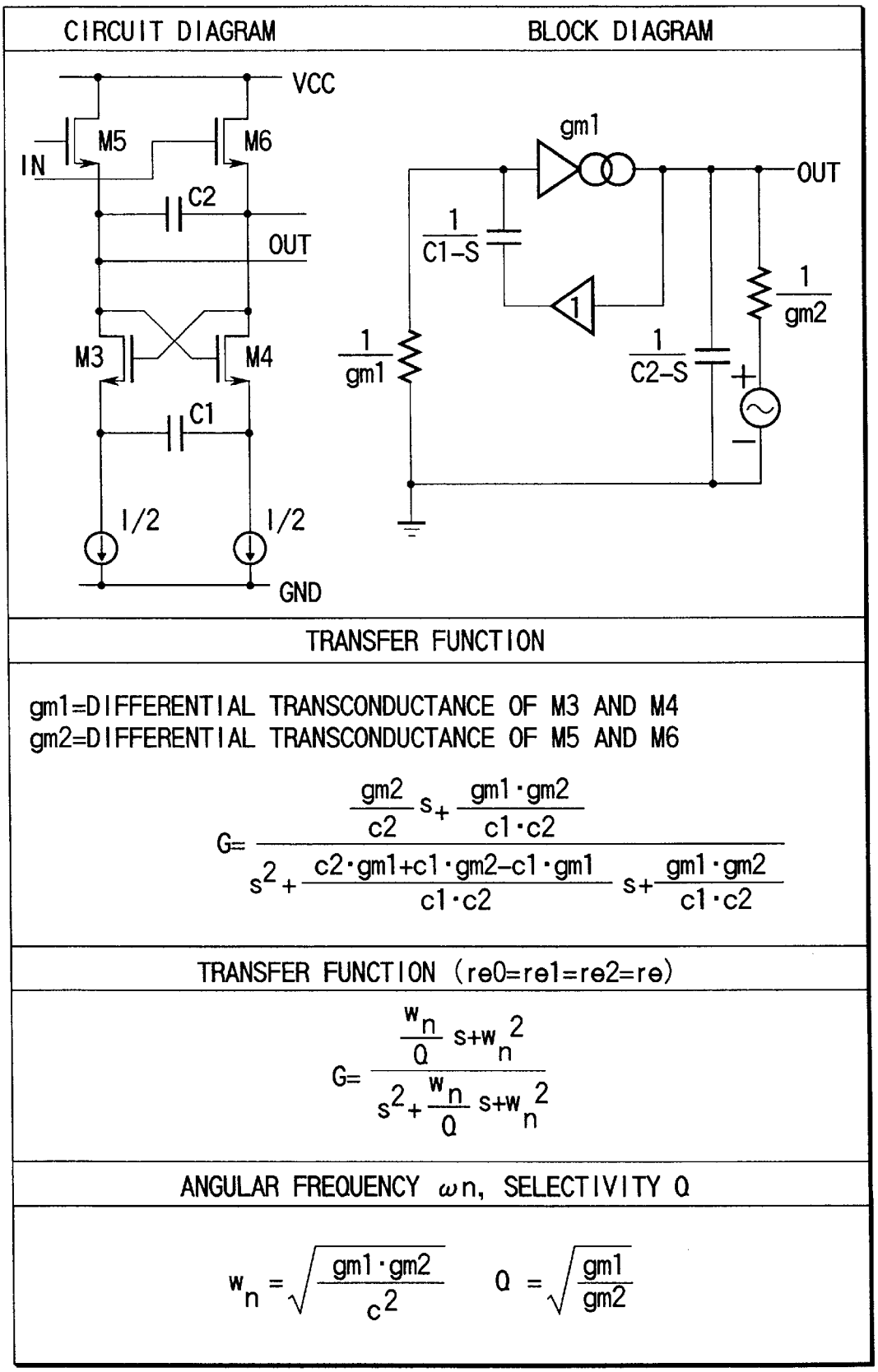
FIG. 30 is a view showing the equivalent circuit and transfer function of still another example of the basic circuit shown in FIG. 25.
Figure 31:
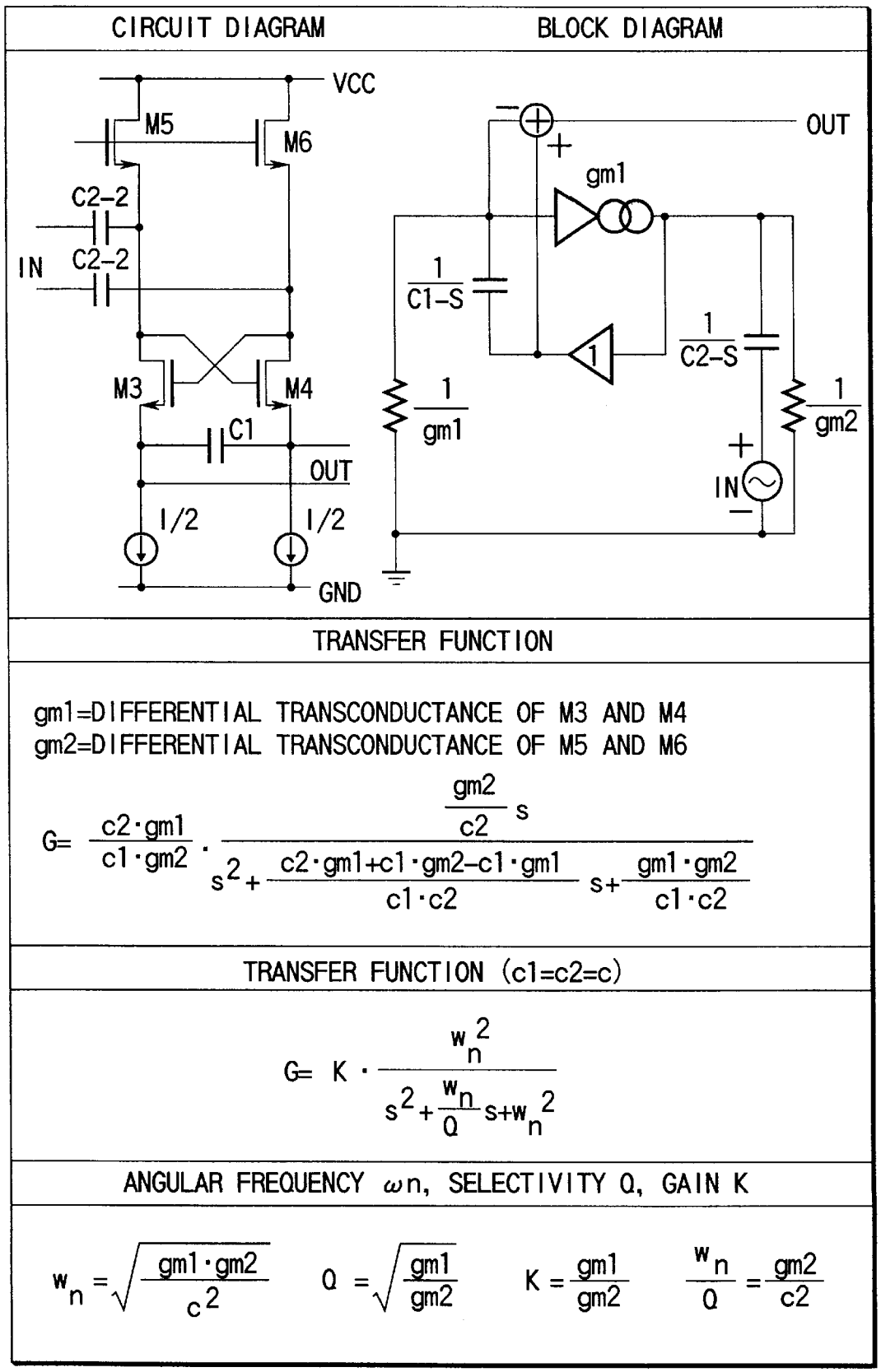
FIG. 31 is a view showing the equivalent circuit and transfer function of still another example of the basic circuit shown in FIG. 25.
Figure 32:
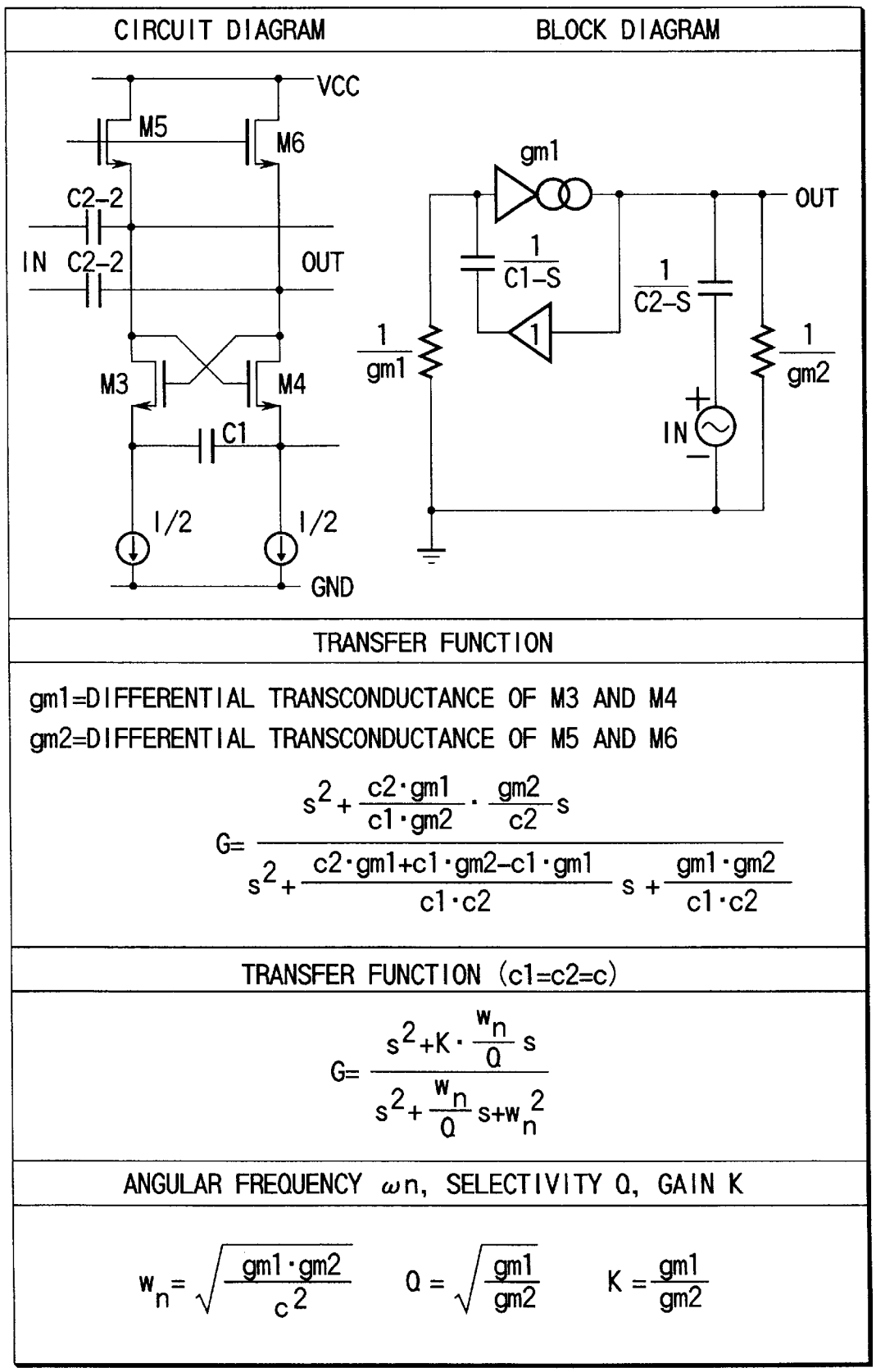
FIG. 32 is a view showing the equivalent circuit and transfer function of still another example of the basic circuit shown in FIG. 25.

Each of the filter circuits in FIGS. 23 and 24 employs as the second capacitor C2 two coupling capacitors each having one terminal connected to the collector of a corresponding one of cross-connected transistors Q3 and Q4. Each of the filter circuits in FIGS. 31 and 32 employs as the second capacitor C2 two coupling capacitors each having one terminal connected to the source of a corresponding one of cross-connected transistors M3 and M4.

As is apparent from equation (12), in the filter circuit in FIG. 1, the two capacitances $C_1$ and $C_2$ are associated with the angular frequency ωo, and Q cannot be set independently of the cutoff frequency fc. Further, in the filter circuit in FIG. 1, Q cannot be externally controlled upon integration.

An improvement of the filter circuit according to the second aspect will be described with reference to FIGS. 33 to 36.

<Ninth Embodiment>

In the filter circuit shown in FIG. 33A, the same reference numerals as in FIG. 1 denote the same parts, and only differences will be described. (1) The collector and emitter of a second transistor Q2 are respectively connected to the collector and emitter of a first npn transistor Q5 for adjusting the signal feedback amount. (2) The collector and emitter of a fourth transistor Q4 are respectively connected to the collector and emitter of a second npn transistor Q6 for adjusting the signal feedback amount. (3) The bases of the transistors Q5 and Q6 are connected to a biasing circuit 10 for applying the same bias voltage. The biasing circuit 10 is constituted by connecting a seventh transistor Q7 having a collector and base connected to each other and a constant current source I1 between the Vcc node and the ground node GND. The emitter voltage of the seventh transistor Q7 is output as a bias voltage. (4) The first and second emitter follower circuits in FIG. 1 are eliminated. The collectors of the fourth and second transistors Q4 and Q2 respectively output the differential output signal voltages Vout$^+$ and Vout$^-$.

Figure 33A:
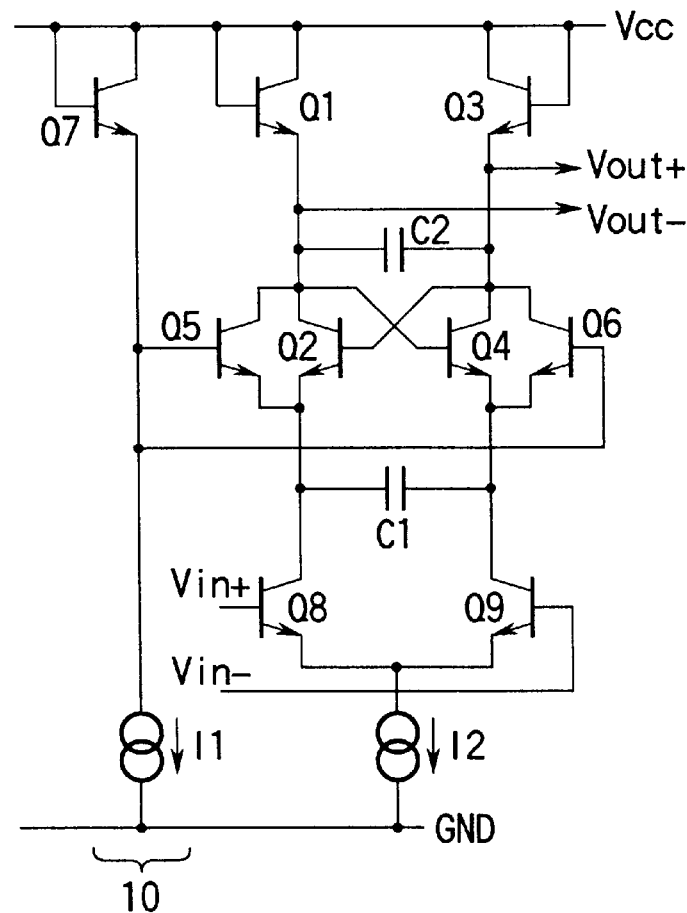
FIG. 33A is a circuit diagram showing an LPF according to the ninth embodiment of the present invention.
Figure 33B:
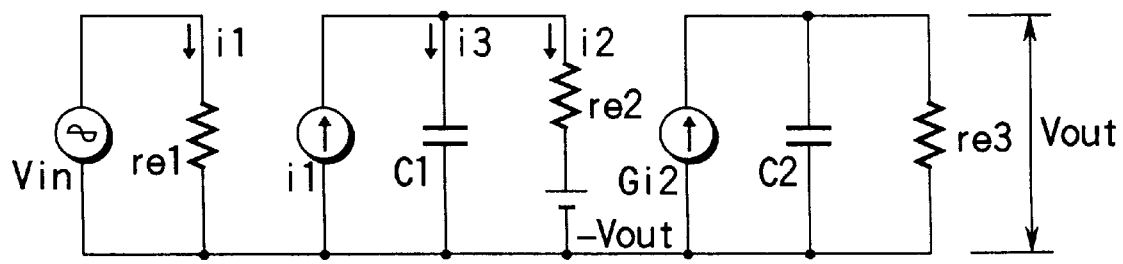
FIG. 33B is an equivalent circuit diagram of FIG. 33A.

FIG. 33B shows an equivalent circuit of the filter circuit in FIG. 33A.

Referring to FIG. 33B, reference symbol Vin denotes an input signal voltage source; Vout, an output voltage; $re_1$, a sum of the emitter resistances of the transistors Q8 and Q9; $re_2$, a sum of the emitter resistances of the transistors Q2, Q4, Q5, and Q6; $re_3$, a sum of the emitter resistances of the transistors Q1 and Q3; $C_1$, a capacitance of a first capacitor C1 and a subsequent element; $C_2$, a capacitance of a second capacitor C2 and a subsequent element; $i_1$, a current (current source) flowing through the resistor $re_1$; $i_2$, a current (current source) flowing through the resistor $re_2$; G, a current gain obtained by the transistors Q5 and Q6; $G \cdot i_2$, a current source; and $i_3$, a current (current source) flowing through the capacitance $C_1$.

To explain operation of the filter circuit in

FIG. 33A, the transfer function of this filter circuit is calculated. From the equivalent circuit shown in FIG. 33B, equations (15) to (17) are derived:

$$i_1 = \frac{V_{in}}{re_1} = i_2 + i_3, \therefore = \frac{V_{in}}{re_1} - i_2 \tag{15}$$

$$i_3 \times \frac{1}{S \cdot C_1} = i_2 \cdot re_2 - V_{out} \tag{16}$$

$$V_{out} = G \cdot i_2 \cdot \left( \frac{1}{S \cdot C_2 + \frac{1}{re_3}} \right) \tag{17}$$

Equation (15) is substituted into equation (16) to obtain equation (18):

$$\left( \frac{V_{in}}{re_1} - i_2 \right) \frac{1}{S \cdot C_1} = i_2 \cdot re_2 - V_{out} \tag{18}$$

Equation (18) is substituted into equation (17) to obtain equation (19):

$$\left( \frac{V_{in}}{re_1} - i_2 \right) \cdot \frac{1}{S \cdot C_1} = i_2 \cdot re_2 - G \cdot i_2 \cdot \left( \frac{1}{S \cdot C_2 + \frac{1}{re_3}} \right) \tag{19}$$

$$i_2 = \left( \frac{V_{in}}{re_1} \cdot \frac{1}{S \cdot C_1} \right) \bigg/ \left( re_2 - \frac{G}{S \cdot C_2 + \frac{1}{re_3}} + \frac{1}{S \cdot C_1} \right)$$

Equation (19) is also substituted into equation (17) to obtain equation (20):

$$V_{out} = \left( \frac{\frac{V_{in}}{re_1} \cdot \frac{1}{S \cdot C_1}}{re_2 - \frac{G}{S \cdot C_2 + \frac{1}{re_3}} + \frac{1}{S \cdot C_1}} \cdot \frac{1}{S \cdot C_2 + \frac{1}{re_3}} \right) \tag{20}$$

$$\frac{V_{out}}{V_{in}} = \frac{\frac{1}{S \cdot C_1 \cdot re_1}}{S \cdot C_2 \cdot re_2 + \frac{re_2}{re_3} - G + \frac{S \cdot C_2 + \frac{1}{re_3}}{S \cdot C_1}}$$

Letting $re_2 = re_3$ in equation (20) leads to equation (21):

$$\frac{V_{out}}{V_{in}} = \frac{\frac{1}{S \cdot C_1 \cdot re_1}}{S \cdot C_2 \cdot re_2 + (1 - G) + \frac{S \cdot C_2 + \frac{1}{re_3}}{S \cdot C_1}} \tag{21}$$

Multiplying the numerator and denominator of equation (21) with $S \cdot C_1$ yields equation (22):

$$\frac{V_{out}}{V_{in}} = \frac{\frac{1}{re_1}}{S^2 \cdot C_1 \cdot C_2 \cdot re_2 + SC_1(1 - G) + S \cdot C_2 + \frac{1}{re_3}} \tag{22}$$

-continued $$= \frac{\frac{1}{C_1 \cdot C_2 \cdot re_2 \cdot re_1}}{S^2 + \left(\frac{1-G}{C_2 \cdot re_2} + \frac{1}{C_1 \cdot re_2}\right)S + \frac{1}{C_1 \cdot C_2 \cdot re_2 \cdot re_3}}$$

Giving attention to $re_2=re_3$, i.e., $(re_3/re_2)=1$, numerator $re_1$ of equation (22) is modified to $re_1=(re_2/re_3)\cdot re_1$ to obtain equation (23):

$$\frac{V_{out}}{V_{in}} = \frac{\frac{1}{C_1 \cdot C_2 \cdot re_2 \cdot \frac{re_2}{re_3}re_1}}{S^2 + \left(\frac{1-G}{C_2 \cdot re_2} + \frac{1}{C_1 \cdot re_2}\right)S + \frac{1}{C_1 \cdot C_2 \cdot re_2 \cdot re_3}} \quad (23)$$

Letting $(re_2/re_1)=k$ results in equation (24):

$$\frac{V_{out}}{V_{in}} = k \cdot \frac{\frac{1}{re_2 \cdot re_3 \cdot C_1 \cdot C_2}}{S^2 + \left(\frac{1-G}{C_2 \cdot re_2} + \frac{1}{re_2 \cdot C_1}\right)S + \frac{1}{re_2 \cdot re_3 \cdot C_1 \cdot C_2}} \quad (24)$$

From equation (24), the circuit characteristics of the filter circuit in FIG. 33A include the second-order transfer function, and this filter circuit is a second-order LPF.

The general formula of the transfer function of the filter circuit is given by equation (25):

$$\frac{V_{out}}{V_{in}} = \frac{\omega_0^2}{S^2 + \frac{\omega_0}{Q}S + \omega_0^2} \quad (25)$$

Calculating $\omega_0$ and the relationship between $\omega_0$ and Q in the filter circuit in FIG. 33A leads to equation (26):

$$\omega_0^2 = \frac{1}{re_2 \cdot re_3 \cdot C_1 \cdot C_2} \quad (26)$$

$$\omega_0 = \frac{1}{\sqrt{re_2 \cdot re_3 \cdot C_1 \cdot C_2}} 1 - \frac{G}{C_2 \cdot re_2} + \frac{1}{re_2 \cdot C_1} = \frac{\omega_0}{Q}$$

If $G \leq 1$ holds in equation (26), the selectivity Q can be changed without changing fc in the filter circuit of FIG. 33A by changing the value of G while fixing the value of $\omega_0$. That is, Q can be set independently of the cutoff frequency fc.

According to the filter circuit shown in FIG. 33A, Q can be set independently of the cutoff frequency fc by connecting the transistors Q5 and Q6 parallel to the two transistors Q2 and Q4 as part of the basic arrangement of the filter circuit in FIG. 1 and changing the feedback amount of the signal.

Since the filter circuit shown in FIG. 33A uses a small number of elements, like the filter circuit shown in FIG. 1, the power consumption can be decreased, and the output offset voltage can also be reduced. In addition, this filter circuit is hardly influenced by the parasitic capacitance and can operate at high frequencies.

Figure 34A:
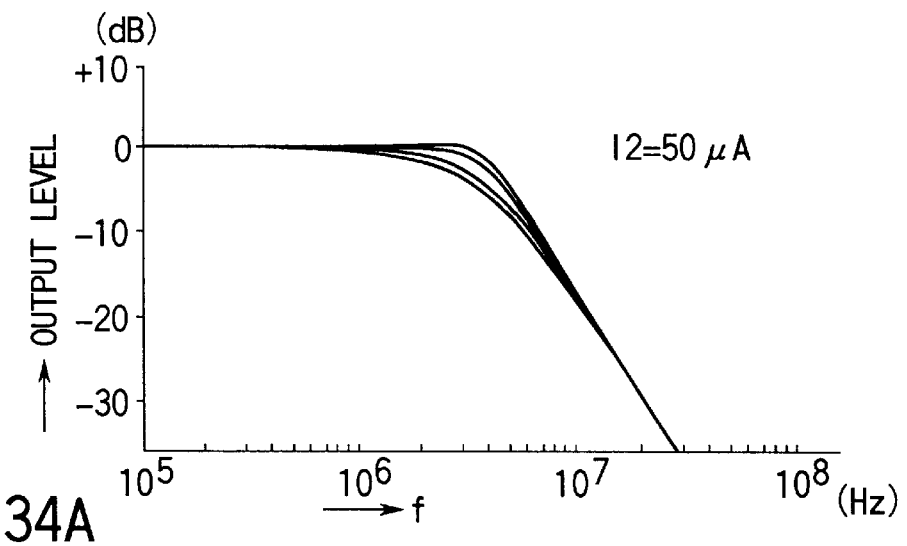
FIGS. 34A to 34C are graphs each showing an example of simulated frequency characteristics of the LPF in FIGS. 33A and 33B.
Figure 34B:
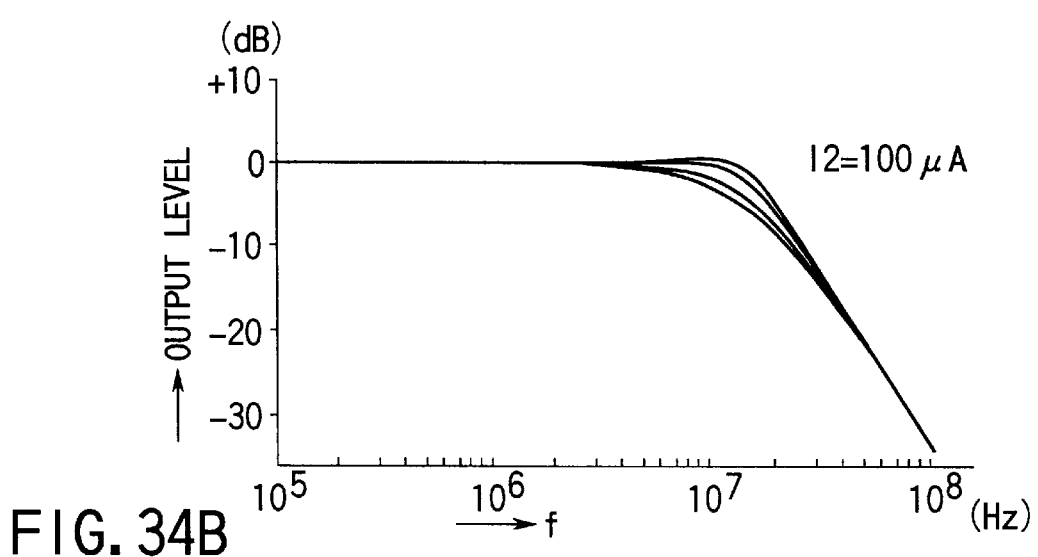
Figure 34C:
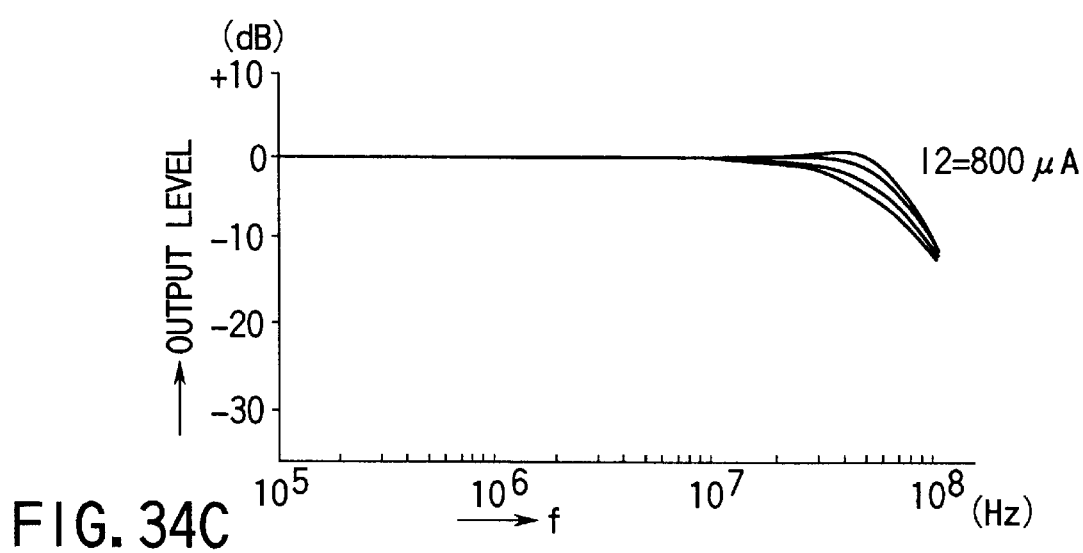

FIGS. 34A to 34C show the simulation results of frequency characteristics by AC response using as parameters the magnitude of a current from the current source I2 for the differential input transistors Q8 and Q9 and the magnitude of a current from the current source I1 for the biasing circuit 10 in the filter circuit shown in FIG. 33A.

From frequency characteristics shown in FIGS. 34A to 34C, the set current value of the current source I1 is changed in accordance with the cutoff frequency fc which increases as the set current value of the current source I2 increases. In other words, changing the set value of G can change Q around the upper limit of a frequency range where the gain is constant. In the output range where the frequency is higher than the cutoff frequency fc, the output level decreases with a predetermined inclination per octave.

Accordingly, properly setting the frequency characteristics of the filter circuit shown in FIG. 33A enables signal waveform processing. If filter circuits like the one shown in FIG. 33A are cascade-connected on a plurality of stages, and the frequency characteristics of each stage are properly set, a multiple-order filter circuit having desired frequency characteristics can be realized.

<10th Embodiment>

Figure 35:
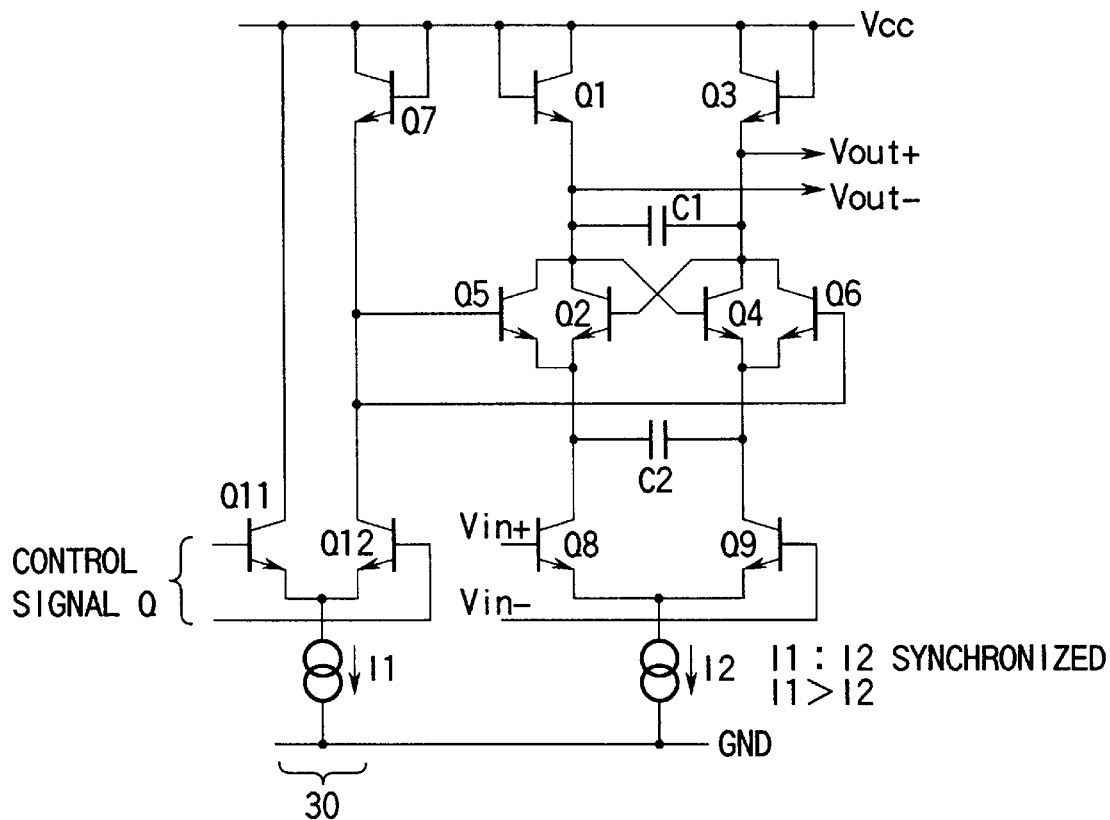
FIG. 35 is a circuit diagram showing an LPF according to the 10th embodiment of the present invention.

FIG. 35 shows an LPF circuit in which Q can be set independently of the cutoff frequency fc and can be variably controlled in accordance with an external control input.

The filter circuit shown in FIG. 35 is a modification of the LPF shown in FIG. 33A and is different from it in use of a variable biasing circuit 30 capable of controlling the bias voltage in accordance with an external control signal. The remaining arrangement is the same as that of the LPF shown in FIG. 33A, and the same reference numerals as in FIG. 33A denote the same parts.

In the variable biasing circuit 30, the emitters of npn transistors Q11 and Q12 forming a differential pair are connected to each other, and a constant current source I1 is connected between their common emitter connection node and the ground node GND. The collector of the transistor Q11 is connected to a Vcc node. The collector and emitter of a seventh transistor Q7 are connected between the Vcc node and the collector of the transistor Q12. The base of the seventh transistor Q7 is connected to the Vcc node.

The bases of the transistors Q11 and Q12 receive a differential control signal generated inside an integrated circuit in accordance with an external control signal or an external differential control signal itself. The emitter voltage of the seventh transistor Q7 is output as a bias voltage (variable bias voltage). A current I1 from the constant current source I1 and a current I2 from a constant current source I2 are synchronized with each other and have the relationship: I1>I2.

According to the filter circuit shown in FIG. 35, Q can be set independently of the cutoff frequency fc, similar to the LPF shown in FIG. 33A. Further, an external control signal is changed upon integration of the LPF to change a bias voltage output from the biasing circuit 30 (i.e., change the value of G). Therefore, Q can be variably controlled.

<11th Embodiment>

Figure 36:
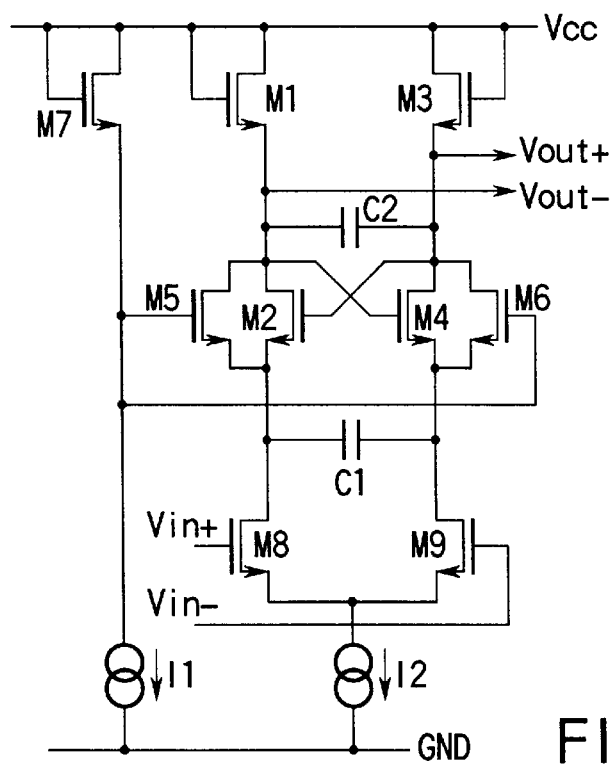
FIG. 36 is a circuit diagram showing an LPF according to the 11th embodiment of the present invention.

FIG. 36 shows an LPF circuit constituted by MOS transistors. In this circuit, Q can be set independently of the cutoff frequency fc.

The filter circuit shown in FIG. 36 is a modification of the LPF shown in FIG. 33A and is different from it in that pMOS transistors Mi (i=1 to 9) replace npn transistors Qi (i=1 to 9). The remaining arrangement is the same as that of the LPF shown in FIG. 33A, and the same reference numerals as in FIG. 33A denote the same parts.

Also in the filter circuit shown in FIG. 36, the same circuit characteristics as circuit characteristics given by equation

(26) in the LPF shown in FIG. 33A can be obtained, and Q can be set independently of the cutoff frequency fc.

According to the filter circuit shown in FIG. 36, characteristics such as fc, ωo, and the input dynamic range can be changed by changing not only the capacitance but also the dimensions of MOS transistors Mi (i=1 to 9).

Those portions of the filter circuit of the second aspect corresponding to the filter circuit of the first aspect can also be variously changed as shown in FIGS. 4 to 32.

As is apparent from equations (12) and (26), Q is determined by $(C_1/C_2)^{1/2}$ in the filter circuits according to the first and second aspects.

As one method of setting Q high, the ratio of two capacitances $C_1$ and $C_2$ may be set considerably high. When Q is set to, e.g., 10, the ratio of the capacitances $C_1$ and $C_2$ must be set to 100.

However, it is not preferable to greatly increase the pattern area of the capacitance $C_1$ so as to set a large capacitance $C_1$ in order to set a large ratio of the capacitances $C_1$ and $C_2$. If the capacitance $C_2$ is set considerably small, the filter circuit is undesirably influenced by the parasitic capacitance.

A filter circuit according the third aspect as an improvement will be described with reference to FIGS. 37A to 39.

<12th Embodiment>

Figure 37A:
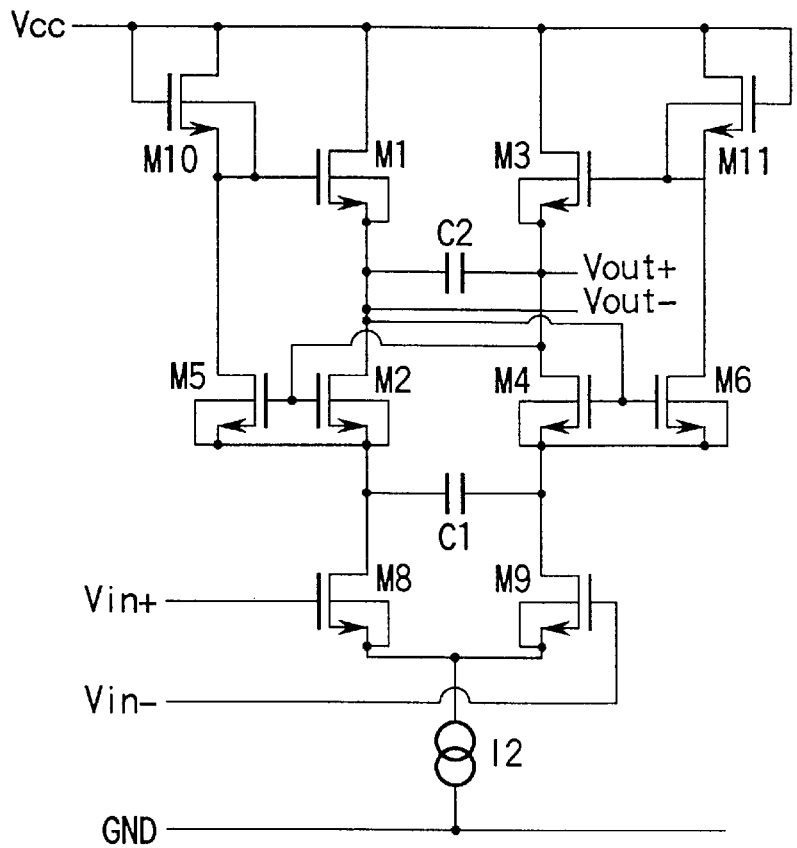
FIG. 37A is a circuit diagram showing an LPF according to the 12th embodiment of the present invention.

The filter circuit shown in FIG. 37A basically comprises eight pMOS transistors M1 to M6, M10, and M11 and two capacitors C1 and C2, and additionally comprises two pMOS transistors M8 and M9.

Referring to FIG. 37A, the sources of the first and third transistors M1 and M3 are connected to a Vcc node. The source of the second transistor M2 is connected to the drain of the first transistor M1. The source of the fourth transistor M4 is connected to the drain of the third transistor M3. The gates and sources of the second and fourth transistors M2 and M4 are cross-connected. The second capacitor C2 is connected between the sources of the second and fourth transistors M2 and M4, and the first capacitor C1 is connected between their drains.

The gate and drain of the first selectivity control transistor M5 are respectively connected to the gate and drain of the second transistor M2. The gate and drain of the second selectivity control transistor M6 are respectively connected to the gate and drain of the fourth transistor M4.

The source and drain of the third selectivity control transistor M10 are connected between the Vcc node and the source of the fifth transistor M5. The gate of the transistor M10 is connected to the Vcc node, and the drain is connected to the gate of the first transistor M1. The source and drain of the fourth selectivity control transistor M11 are connected between the Vcc node and the source of the sixth transistor M6. The gate of the transistor M11 is connected to the Vcc node, and the drain is connected to the gate of the third transistor M3.

The sources of the transistors M8 and M9 forming a differential pair are respectively connected to the drains of the second and fourth transistors M2 and M4. The drains of the transistors M8 and M9 are connected to each other, and a constant current source I2 is connected between their common drain connection node and the ground node GND. As the selectivity control transistors M10 and M11, diodes may be employed.

The gates of the transistors M8 and M9 respectively receive the differential input signal. voltages Vin$^+$ and Vin$^-$.

The sources of the fourth and second transistors M4 and M2 respectively output the differential output signal voltages Vout$^+$ and Vout$^-$.

Figure 37B:
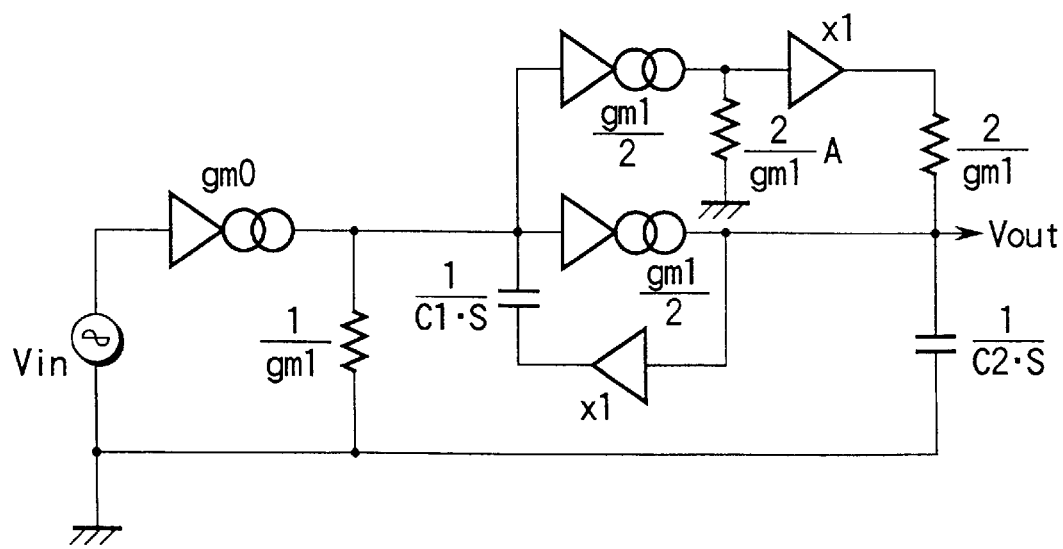
FIG. 37B is an equivalent circuit diagram of FIG. 37A.

FIG. 37B shows an equivalent circuit of the filter circuit in FIG. 37A. Referring to FIG. 37B, reference symbol $gm_0$ denote a differential transconductance of the transistors M8 and M9; $gm_1$, a differential transconductance of the transistors M2, M4, M5, and M6; $gm_2$, a differential transconductance of the transistors M1, M3, M10, and M11; Vin, an input signal voltage source; Vout, an output voltage; $C_1$, a capacitance of the first capacitor C1 and a subsequent element; $C_2$, a capacitance of the second capacitor C2 and a subsequent element; and A, a coefficient (to be described below).

To explain operation of the filter circuit in FIG. 37A, the transfer function of this filter circuit is calculated. From the equivalent circuit in FIG. 37B, equation (27) is derived:

$$\frac{V_{out}}{V_{in}} = (1+A) \cdot \frac{gm_0}{gm_1} \cdot \frac{\frac{gm_1^2}{2 \cdot C_1 \cdot C_2}}{S^2 + \frac{gm_1(2 \cdot C_2 - C_1 \cdot A)}{2 \cdot C_1 \cdot C_2}S + \frac{gm_1^2}{2 \cdot C_1 \cdot C_2}} \quad (27)$$

$$= K \frac{\omega_n^2}{S^2 + \frac{\omega_n}{Q}S + \omega_x}$$

From equation (27), the circuit characteristics of the filter circuit in FIG. 37A include the second-order transfer function, and this filter circuit is a second-order LPF.

Equation (27) is solved to obtain the relationship between the $\omega_n$, Q, and K of the filter circuit in FIG. 37A, thereby attaining equations (28) to (30):

$$\omega_x = \sqrt{\frac{gm_1^2}{2 \cdot C_1 \cdot C_2}} \quad (28)$$

$$Q = \frac{\sqrt{2 \cdot C_1 \cdot C_2}}{2 \cdot C_2 - C_1 \cdot A} \quad (29)$$

$$K = (1+A)\frac{gm_0}{gm_1} \quad (30)$$

$$A = \frac{gm_1}{2 \cdot gm_2}$$

From equations (28) to (30), Q can be set independently of fc in the filter circuit shown in FIG. 37A. Furthermore, Q can be controlled by controlling the ratio of $gm_1$ and $gm_2$. The ratio of $gm_1$ and $gm_2$ is controlled as follows in correspondence with desired Q. (1) The pattern size of the selectivity control transistor M10 (=pattern size of M11, e.g., a channel width W) or (2) the pattern size ratio of the selectivity control transistor M5 and the second transistor M2 (=the pattern size ratio of the selectivity control transistor M6 and the fourth transistor M4, e.g., the channel width W) is controlled.

Accordingly, Q can be arbitrarily set high without setting the ratio of $C_1$ and $C_2$ high by using a very small or large capacitance.

In equation (29), if the capacitance ratio $C_1:C_2$ of C1 and C2 is set to, e.g., 2:1, and A=1 is set, the value of Q is theoretically infinite. In practice, the value of Q is a finite maximum value due to the presence of a loss.

Figure 38:
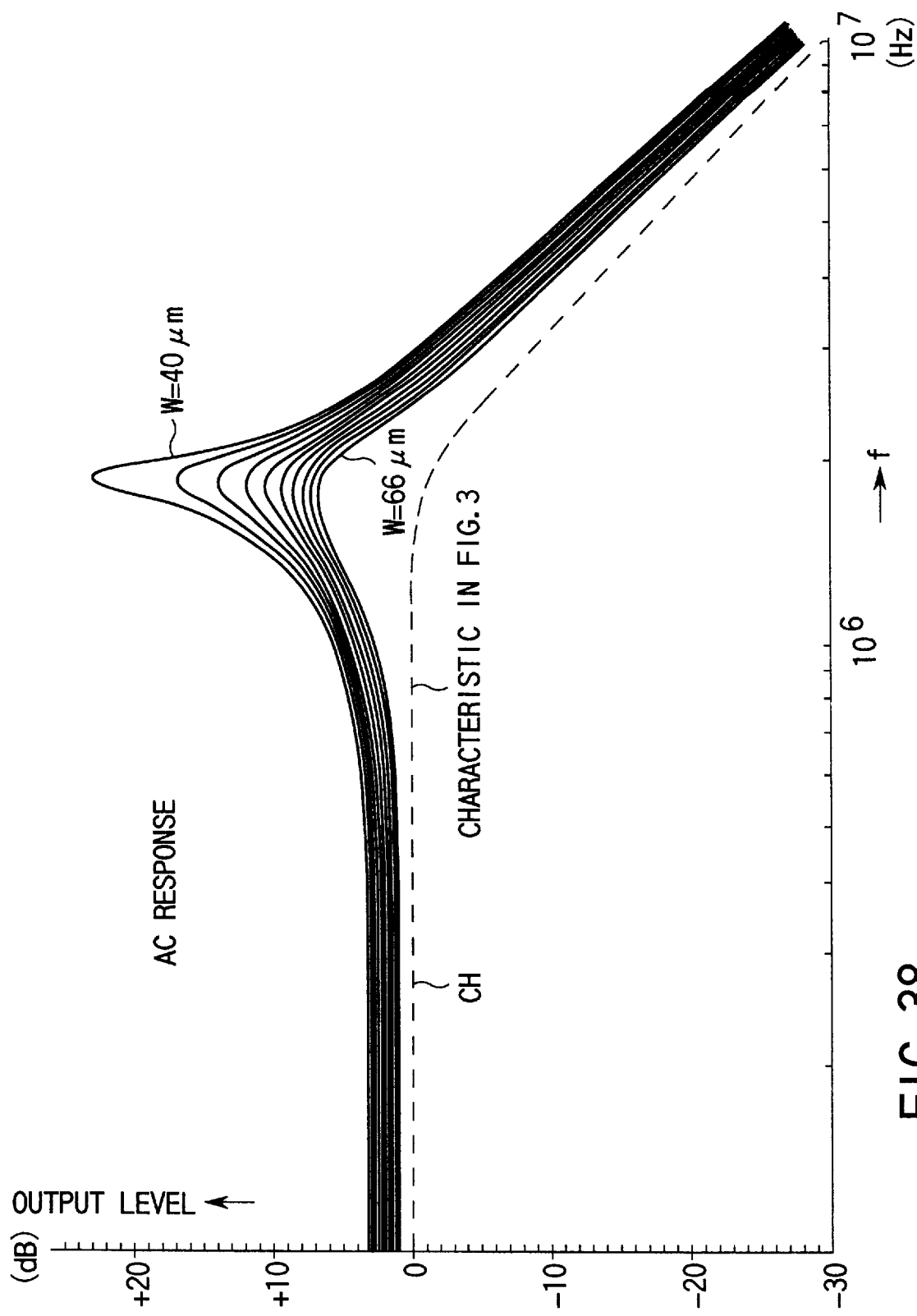
FIG. 38 is a graph showing an example of simulated frequency characteristics of the LPF in FIG. 37.

FIG. 38 shows by solid lines the simulation results of frequency characteristics by AC response using the channel widths W of the transistors M10 and M11 as parameters (about 40 μm, about 46 μm, about 53 μm, . . . , about 59 μm, and about 66 μm) in the filter circuit of FIG. 37A. That is, when the capacitance ratio $C_1:C_2$ of the capacitors C1 and C2 is set to, e.g., 2:1, the differential transconductance $gm_1$ of the transistors M2 and M4 is fixed, and the differential transconductance $gm_2$ of the transistors M1 and M3 is changed, Q greatly changes. Note that the dotted line shown in FIG. 38 indicates the simulation results of the frequency characteristics of the filter circuit of FIG. 1 shown in FIG. 3 for the sake of comparison.

According to the frequency characteristics shown in FIG. 38, Q can be set 10 times larger by setting $C_1:C_2=2:1$ and setting the channel width W to about 40 μm. Properly setting the frequency characteristics of the filter circuit shown in FIG. 37A enables signal waveform processing. If filter circuits like the one shown in FIG. 37A are cascade-connected on a plurality of stages, and the frequency characteristics of each stage are properly set, a multiple-order filter circuit having desired frequency characteristics can be realized.

<13th Embodiment>

Figure 39A:
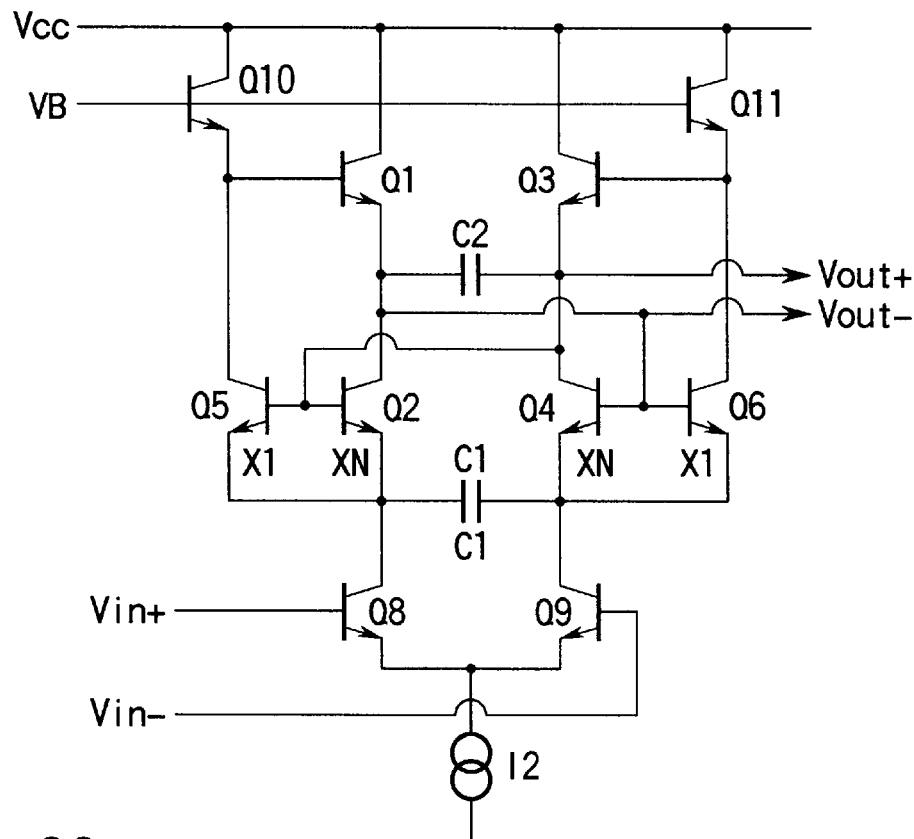
FIG. 39A is a circuit diagram showing an LPF according to the 13th embodiment of the present invention.

The filter circuit shown in FIG. 39A is a modification of the filter circuit according to the first aspect shown in FIG. 1. In the filter circuit of FIG. 39A, npn transistors Q5, Q6, Q10, and Q11 are added to the filter circuit shown in FIG. 1, and the first and second emitter follower circuits shown in FIG. 1 are eliminated. The remaining arrangement is the same as that in FIG. 1.

The base and emitter of the transistor Q5 are respectively connected to the base and emitter of a transistor Q2. The base and emitter of the transistor Q6 are respectively connected to the base and emitter of a transistor Q4. The collector of the transistor Q10 is connected to a Vcc node, the emitter of the transistor Q10 is connected to the collector of the transistor Q5 and the base of a transistor Q1, and the base of the transistor Q10 receives a bias voltage VB. The collector of the transistor Q11 is connected to the Vcc node, the emitter of the transistor Q11 is connected to the collector of the transistor Q6 and the base of the transistor Q3, and the base of the transistor Q11 receives the bias voltage VB. The bases of transistors Q8 and Q9 respectively receive the differential input signal voltages Vin$^+$ and Vin$^-$. The collectors of the transistors Q4 and Q2 respectively output the differential output signals Vout$^+$ and Vout$^-$.

Figure 39B:
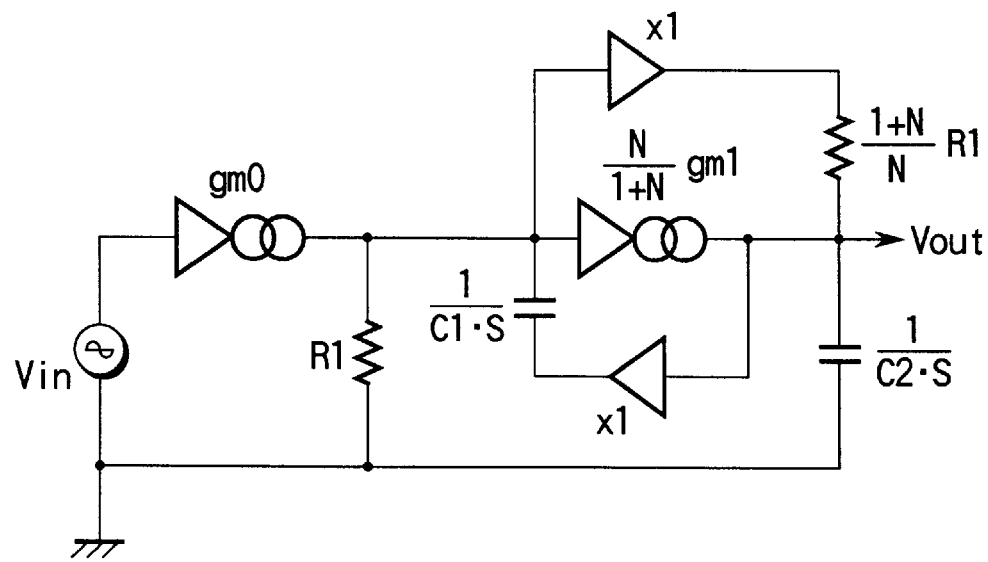
FIG. 39B is an equivalent circuit diagram of FIG. 39A.
Figure 40:
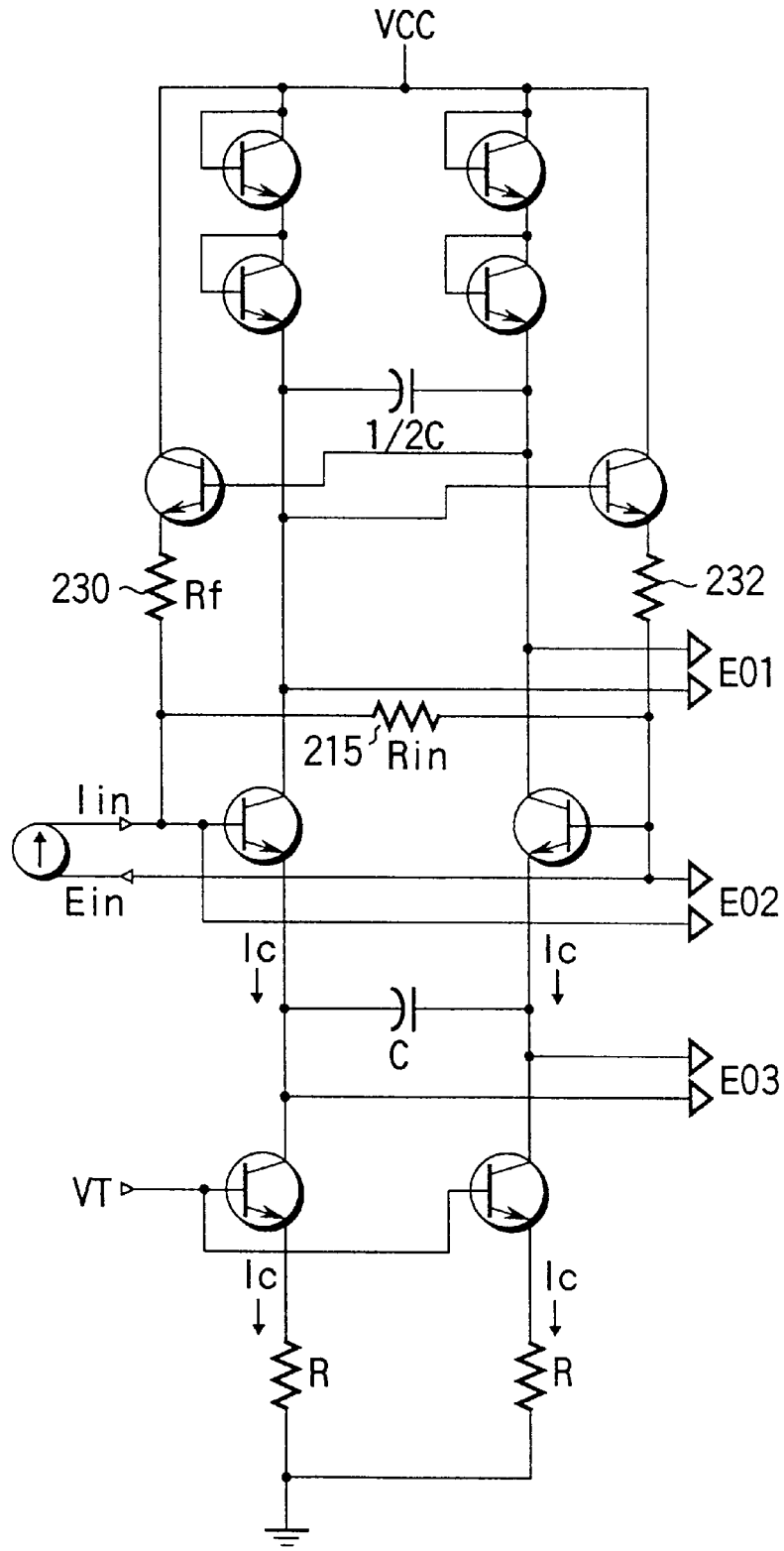
FIG. 40 is a circuit diagram showing an example of the arrangement of a conventional filter circuit.

FIG. 39B shows an equivalent circuit of the filter circuit in FIG. 39A.

Referring to FIG. 39B, reference symbol $gm_0$ denote a differential transconductance of the transistors Q8 and Q9; $gm_1$, a differential transconductance of the transistors Q2, Q4, Q5, and Q6; $gm_2$, a differential transconductance of the transistors Q1, Q3, Q10, and Q11; Vin, an input signal voltage source; Vout, an output voltage; $C_1$, a capacitance of the first capacitor C1 and a subsequent element; $C_2$, a capacitance of the second capacitor C2 and a subsequent element; and N, a pattern size ratio of the transistors Q2 and Q5 (=pattern size ratio, such as emitter area ratio of the transistors Q4 and Q6).

The transfer function of the filter circuit in FIG. 39A is obtained from the equivalent circuit in FIG. 39B to derive equation (31):

$$\frac{V_{out}}{V_{in}} =$$

$$\frac{2 \cdot R_1}{R_0} \cdot \frac{N}{(N+1) \cdot C_1 \cdot C_2 \cdot R_1^2 \cdot S^2 + \{(N+1) \cdot C_2 \cdot R_1 - C_1 \cdot R_1 \cdot N\} \cdot S + N}$$

wherein $$R_0 = \frac{1}{gm_0}, R_1 = \frac{1}{gm_1}, (N+1) \cdot C_2 \cdot R_1 > C \cdot R_1 \cdot N \qquad (31)$$

From equation (31), the circuit characteristics of the filter circuit in FIG. 39A include the second-order transfer function, and this filter circuit is a second-order LPF. In this circuit, Q can be set independently of fc, and can be controlled by controlling the ratio of $gm_1$ and $gm_2$. Q can be arbitrarily set high without setting the ratio of $C_1$ and $C_2$ high.

Those portions of the filter circuit of the third aspect corresponding to the filter circuit of the first aspect are shown in FIGS. 17 to 32 and can also be variously changed. For example, two current sources can be used instead of a pair of differential transistors M8 and M9 and the constant current source I2, two coupling capacitors each having one terminal connected to the drain of a corresponding one of the transistors M2 and M4 can be used as the first capacitor C1, or two coupling capacitors each having one terminal connected to the source of a corresponding one of the transistors M2 and M4 can be used as the second capacitor C2.

What is claimed is:

1. A filter circuit comprising:
   a first transistor having a first electrode, second electrode, and control electrode;
   a second transistor having a first electrode, second electrode, and control electrode, the first electrode of said second transistor being connected to the second electrode of said first transistor;
   a third transistor having a first electrode, second electrode, and control electrode, the second electrode of said third transistor being connected to the control electrode of said second transistor;
   a fourth transistor having a first electrode, second electrode, and control electrode, the first electrode of said fourth transistor being connected to the second electrode of said third transistor and the control electrode of said fourth transistor being connected to the first electrode of said second transistor;
   a first capacitor substantially connected between the second electrodes of said second and fourth transistors;
   a second capacitor substantially connected between the first electrodes of said second and fourth transistors;
   a first constant current source connected to the second electrode of said second transistor; and
   a second constant current source connected to the second electrode of said fourth transistor, and
   wherein the second electrodes of said second and fourth transistors are current input terminals, the first electrodes of said first and third transistors are current output terminals, and the control electrodes of said second and fourth transistors are voltage output terminals.

2. A filter circuit comprising:
   a first transistor having a first electrode, second electrode, and control electrode;
   a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor substantially connected between the first electrodes of said second and fourth transistors;

a first constant current source connected to the second electrode of said second transistor; and a second constant current source connected to the second electrode of said fourth transistor, and wherein the control electrodes of said first and third transistors are voltage input terminals, and the first electrodes of said first and third transistors are current output terminals.

3. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors; and a second capacitor substantially connected between the first electrodes of said second and fourth transistors, wherein the second electrodes of said second and fourth transistors are current input terminals, the control electrodes of said first and third transistors are voltage input terminals, and the first electrodes of said first and third transistors are current output terminals.

4. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor substantially connected between the first electrodes of said second and fourth transistors;

a fifth transistor having a first electrode, second electrode, and control electrode, the first electrode of said fifth transistor being connected to the second electrode of said second transistor;

a sixth transistor having a first electrode, second electrode, and control electrode, the first electrode of said sixth transistor being connected to the second electrode of said fourth transistor; and a resistor connected between the second electrodes of said fifth and sixth transistors, the control electrodes of said fifth and sixth transistors being voltage input terminals.

5. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor substantially connected between the first electrodes of said second and fourth transistors;

a fifth transistor having a first electrode, second electrode, and control electrode, the second electrode of said fifth transistor being connected to the control electrode of said first transistor;

a sixth transistor having a first electrode, second electrode, and control electrode, the second electrode of said sixth transistor being connected to the control electrode of said third transistor;

a constant voltage source connected to the control electrodes of said fifth and sixth transistors;

a seventh transistor having a first electrode, second electrode, and control electrode, the first electrode of said seventh transistor being connected to the second electrode of said fifth transistor, and the control electrode of said seventh transistor being a first voltage input terminal;

an eighth transistor having a first electrode, second electrode, and control electrode, the first electrode of said eighth transistor being connected to the second electrode of said sixth transistor, and the control electrode of said eighth transistor being a second voltage input terminal; and a resistor connected between the second electrodes of said seventh and eighth electrodes, and wherein the first electrodes of said first and third transistors are voltage output terminals.

6. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor substantially connected between the first electrodes of said second and fourth transistors;

a fifth transistor having a first electrode, second electrode, and control electrode, the second electrode of said fifth transistor being connected to the control electrode of said first transistor;

a sixth transistor having a first electrode, second electrode, and control electrode, the second electrode of said sixth transistor being connected to the control electrode of said third transistor;

a constant voltage source connected to the control electrodes of said fifth and sixth transistors;

a seventh transistor having a first electrode, second electrode, and control electrode, the first electrode of said seventh transistor being connected to the second electrode of said fifth electrode, and the control electrode of said seventh transistor being a first voltage input terminal;

an eighth transistor having a first electrode, second electrode, and control electrode, the first electrode of said eighth transistor being connected to the second electrode of said sixth transistor, and the control electrode of said eighth transistor being a second voltage input terminal;

a resistor connected between the second electrodes of said seventh and eighth electrodes;

a ninth transistor having a first electrode, second electrode, and control electrode, the control electrode of said ninth transistor being connected to the control electrode of said seventh transistor, and the first electrode of said ninth transistor being connected to one of the second electrodes of said second and fourth transistors;

a 10th transistor having a first electrode, second electrode, and control electrode, the control electrode of said 10th transistor being connected to the control electrode of said eighth transistor, and the first electrode of said 10th transistor being connected to the other of the second electrodes of said second and said fourth transistors; and a second resistor connected between the second electrodes of said ninth and 10th transistors.

7. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor substantially connected between the first electrodes of said second and fourth transistors;

a first resistor having a first terminal connected to the first electrode of said first transistor;

a second resistor having a first terminal connected to the first electrode of said third transistor; and first and second constant voltage sources respectively connected to the control electrodes of said first and third transistors, and wherein the first electrode of said first transistor is a voltage output terminal, and the first electrode of said third transistor is an inverted-voltage output terminal.

8. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor substantially connected between the first electrodes of said second and fourth transistors;

a first resistor having a first terminal connected to the first electrode of said first transistor;

a fifth transistor having a first electrode, second electrode, and control electrode, the second electrode of said fifth transistor being connected to a second terminal of said first resistor;

a second resistor having a first terminal connected to the first electrode of said third transistor; and a sixth transistor having a first electrode, second electrode, and control electrode, the second electrode of said sixth transistor being connected to a second terminal of said second resistor, and wherein the first electrode of said first transistor is a voltage output terminal, and the first electrode of said third transistor is an inverted-voltage output terminal.

9. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor substantially connected between the first electrodes of said second and fourth transistors;

a fifth transistor having a first electrode, second electrode, and control electrode, the first electrode of said fifth transistor being connected to the second electrode of said second transistor;

a sixth transistor having a first electrode, second electrode, and control electrode, the first electrode of said sixth transistor being connected to the second electrode of said fourth transistor;

a first resistor connected between the second electrodes of said fifth and sixth transistors;

a first constant current source connected to the second electrode of said fifth transistor; a second constant current source connected to the second electrode of said sixth transistor;

a second resistor having a first terminal connected to the first electrode of said first transistor;

a seventh transistor having a first electrode, second electrode, and control electrode, the second electrode of said seventh transistor being connected to a second terminal of said second resistor;

a third resistor connected to the first electrode of said third transistor, an eighth transistor having a first electrode, second electrode, and control electrode, the second electrode of said eighth transistor being connected to a second terminal of said third resistor;

a ninth transistor having a first electrode, second electrode, and control electrode, the control electrode of said ninth transistor being connected to the first electrode of said first transistor;

a 10th transistor having a first electrode, second electrode, and control electrode, the control electrode of said 10th transistor being connected to the first electrode of said third transistor;

a 11th transistor having a first electrode, second electrode, and control electrode, the first and control electrodes of said 11th transistor being connected to the second electrode of said ninth transistor;

a 12th transistor having a first electrode, second electrode, and control electrode, the first and control electrodes of said 12th transistor being connected to the second electrode of said 10th transistor;

a third constant current source connected to the second electrode of said 11th transistor; and a fourth constant current source connected to the second electrode of said 12th transistor, and wherein the control electrodes of said fifth and sixth transistors are voltage input terminals, and the second electrodes of said 11th and 12th transistors are voltage output terminals.

10. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor substantially connected between the first electrodes of said second and fourth transistors;

a fifth transistor having a first electrode, second electrode, and control electrode, the second electrode of said fifth transistor being coupled through a first capacitance to the second electrode of the second transistor;

a sixth transistor having a first electrode, second electrode, and control electrode, the second electrode of said sixth transistor being coupled through a second capacitance to the second electrode of the fourth transistor;

a seventh transistor having a first electrode, second electrode, and control electrode, the first electrode of said seventh transistor being connected to the second electrode of said fifth transistor;

an eighth transistor having a first electrode, second electrode, and control electrode, the first electrode of said eighth transistor being connected to the second electrode of said sixth transistor; a constant voltage source connected to the control electrodes of said fifth and sixth transistors; and a first resistor connected between the second electrodes of said seventh and eighth transistors, and wherein the control electrode of said seventh transistor is a first voltage input terminal, the control electrode of said eighth transistor is a second voltage input terminal, the first electrode of said first transistor is a first voltage output terminal, and the first electrode of said third transistor is a second voltage output terminal.

11. A filter circuit comprising:

a first diode having an anode and cathode;

a second diode having an anode and cathode;

a first transistor having a first electrode, second electrode, and control electrode, the first electrode of said first transistor being connected to the cathode of said first diode, and the control electrode of said first transistor being connected to the cathode of said second diode;

a second transistor having a first electrode, second electrode, and control electrode, the first electrode of said second transistor being connected to the cathode of said second diode, and the control electrode of said second transistor being connected to the first electrode of said first transistor; a first capacitor substantially connected between the second electrodes of said first and second transistors; and a second capacitor substantially connected between the first electrodes of said first and second transistors.

12. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor substantially connected between the first electrodes of said second and fourth transistors, wherein said first capacitor includes third and fourth capacitors, one terminal of said third capacitor being an input terminal, the other terminal of said third capacitor being connected to the second electrode of said second transistor, one terminal of said fourth capacitor being an input terminal, and the other terminal of said fourth capacitor being connected to the second electrode of said fourth transistor.

13. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor having a first terminal, and second terminal, the first terminal being an input terminal, the second terminal being connected to the first electrode of said second transistor; and a third capacitor having a first terminal and second terminal, the first terminal being an input terminal, the second terminal being connected to the first electrode of said fourth transistor.

14. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor substantially connected between the second electrodes of said second and fourth transistors;

a second capacitor substantially connected between the first electrodes of said second and fourth transistors;

a fifth transistor having a first electrode, second electrode, and control electrode, the first electrode of said fifth transistor being connected to the second electrode of said second transistor, and the control electrode of said fifth transistor being a first voltage input terminal;

a sixth transistor having a first electrode, second electrode, and control electrode, the first electrode of said sixth transistor being connected to the second electrode of said fourth transistor, and the control electrode of said sixth transistor being a second voltage input terminal;

a first constant current source connected to the second electrodes of said fifth and sixth transistors;

a seventh transistor having a first electrode, second electrode, and control electrode, the control electrode of said seventh transistor being connected to the first electrode of said fifth transistor;

an eighth transistor having a first electrode, second electrode, and control electrode, the control electrode of said eighth transistor being connected to the first electrode of said sixth transistor;

a second constant current source connected to the second electrodes of said seventh and eighth transistors;

a ninth transistor having a first electrode, second electrode, and control electrode, the first electrode of said ninth transistor being connected to the first electrode of said first and third transistors, and the control electrode of said ninth transistor being connected to the control electrodes of said first and third transistors;

first and second resistors, one terminal of each of said first and second resistors being connected to the second electrode of said ninth transistor;

a 10th transistor having a first electrode, second electrode, and control electrode, the first electrode of said 10th transistor being connected to the other terminal of said first resistor, and the control electrode of said 10th transistor being connected to the control electrode of said fifth transistor;

a 11th transistor having a first electrode, second electrode, and control electrode, the first electrode of said 11th transistor being connected to the other terminal of said second resistor, and the control electrode of said 11th transistor being connected to the control electrode of said sixth transistor; and a third constant current source connected to the second electrodes of said 10th and 11th transistors.

15. A filter circuit comprising:

a first transistor having a first electrode, second electrode, and control electrode, a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor connected between the second electrodes of said second and fourth transistors;

a second capacitor connected between the first electrodes of said second and fourth transistors;

a fifth transistor having a first electrode, second electrode, and control electrode, the first electrode of said fifth transistor being connected to the second electrode of said second transistor, and the control electrode of said fifth transistor being a first voltage input terminal;

a sixth transistor having a first electrode, second electrode, and control electrode, the first electrode of said sixth transistor being connected to the second electrode of said fourth transistor, and the control electrode of said sixth transistor being a second voltage input terminal:

a first constant current source connected to the second electrodes of said fifth and sixth transistors;

a seventh transistor having a first electrode, second electrode, and control electrode, the first and second electrodes of said seventh transistor respectively being connected to the first and second electrodes of said second transistor;

an eighth transistor having a first electrode, second electrode, and control electrode, the first and second electrodes of said eighth transistor respectively being connected to the first and second electrodes of said fourth transistor; and a biasing circuit connected to the control electrodes of said seventh and eighth transistors, the first electrodes of said second and fourth transistors being voltage output terminals.

16. A circuit according to claim 15, wherein said biasing circuit comprises:

a ninth transistor having a first electrode, second electrode, and control electrode, the first and control electrodes of said ninth transistor being connected to the first power supply; and a second constant current source connected between the second electrode of said ninth transistor and the second power supply, and the control electrodes of said seventh and eighth transistors are connected to the second electrode of said ninth transistor.

17. A circuit according to claim 15, wherein said biasing circuit comprises:

a ninth transistor having a first electrode, second electrode, and control electrode, the first electrode of said ninth transistor being connected to a first power supply, and the control electrode of said ninth transistor receiving the Q control signal;

a 10th transistor having a first electrode, second electrode, and control electrode, the first and control electrodes of said 10th transistor being connected to the first power supply;

a 11th transistor having a first electrode, second electrode, and control electrode, the first electrode of said 11th transistor being connected to the second electrode of said 10th transistor, and the control electrode of said 11th transistor receiving the Q control signal; and a second constant current source connected between the second electrodes of said ninth and 11th transistors and a second power supply.

18. A filter circuit comprising:

a first transistor having a first electrode, second electrode, and control electrode;

a second transistor having a first electrode, second electrode, and control electrode, the first electrode of said second transistor being connected to the second electrode of said first transistor;

a third transistor having a first electrode, second electrode, and control electrode, the second electrode of said third transistor being connected to the control electrode of said second transistor;

a fourth transistor having a first electrode, second electrode, and control electrode, the first electrode of said fourth transistor being connected to the second electrode of said third transistor, and the control electrode of said fourth transistor being connected to the first electrode of said second transistor;

a first capacitor connected between the second electrodes of said second and fourth transistors;

a second capacitor connected between the first electrodes of said second and fourth transistors;

a fifth transistor having a first electrode, second electrode, and control electrode, the first electrode of said fifth transistor being connected to the second electrode of said second transistor, and the control electrode of said fifth transistor being a first voltage input terminal;

a sixth transistor having a first electrode, second electrode, and control electrode, the first electrode of said sixth transistor being connected to the second electrode of said fourth transistor, and the control electrode of said sixth transistor being a second voltage input terminal;

a first constant current source connected to the second electrodes of said fifth and sixth transistors;

a seventh transistor having a first electrode, second electrode, and control electrode, the control and second electrodes of said seventh transistor respectively being connected to the control and second electrodes of said second transistor;

an eighth transistor having a first electrode, second electrode, and control electrode, the control and second electrodes of said eighth transistor respectively being connected to the control and second electrodes of said fourth transistor;

a ninth transistor having a first electrode, second electrode, and control electrode, the first electrode of said ninth transistor being connected to the first electrode of the first transistor, and the second electrode of said ninth transistor being connected to the first electrode of said seventh transistor and the control electrode of said first transistor; and a 10th transistor having a first electrode, second electrode, and control electrode, the first electrode of said 10th transistor being connected to the first electrode of said third transistor, and the second electrode of said 10th transistor being connected to the first electrode of said eighth transistor and the control electrode of said third transistor, the first electrodes of said second and fourth transistors being voltage output terminals.

19. A circuit according to claim 18, wherein said seventh transistor and said second transistor have a pattern size ratio corresponding to desired selectivity Q, and said eighth transistor and said fourth transistor have a pattern size ratio corresponding to desired selectivity Q.

20. A circuit according to claim 18, wherein said ninth transistor and said 10th transistor have a pattern size ratio corresponding to desired selectivity Q.

* * * * *